United States Patent
Hwang et al.

(10) Patent No.: US 12,324,144 B2
(45) Date of Patent: Jun. 3, 2025

(54) INTEGRATED CIRCUIT (IC) DEVICE

(71) Applicant: SAMSUNG ELECTRONICS CO., LTD., Suwon-si (KR)

(72) Inventors: Hongkyu Hwang, Hwaseong-si (KR); Nayoung Kim, Seoul (KR); Seongho Kim, Seoul (KR); Hoonmin Kim, Hwaseong-si (KR); Hyelim Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 429 days.

(21) Appl. No.: 17/814,831

(22) Filed: Jul. 25, 2022

(65) Prior Publication Data

US 2023/0171949 A1 Jun. 1, 2023

(30) Foreign Application Priority Data

Dec. 1, 2021 (KR) .......................... 10-2021-0170239

(51) Int. Cl.
*H10B 12/00* (2023.01)

(52) U.S. Cl.
CPC ......... *H10B 12/315* (2023.02); *H10B 12/033* (2023.02)

(58) Field of Classification Search
CPC .... H10B 12/315; H10B 12/033; H10B 12/48; H10B 12/50; H10B 12/30; H01L 28/60; H01L 28/90; H01L 28/91; H01L 23/642
See application file for complete search history.

(56) References Cited

U.S. PATENT DOCUMENTS

| | | | |
|---|---|---|---|
| 9,330,960 B2 | 5/2016 | Cho et al. | |
| 9,379,042 B2 | 6/2016 | Park et al. | |
| 10,468,103 B2 | 11/2019 | Kim et al. | |
| 10,659,569 B1 | 2/2020 | Jang et al. | |
| 11,075,204 B2 | 7/2021 | Kim et al. | |
| 2016/0225845 A1 | 8/2016 | Cho et al. | |
| 2019/0043941 A1 | 2/2019 | Sasaki | |
| 2020/0203370 A1 | 6/2020 | Son et al. | |
| 2020/0312552 A1 | 10/2020 | Kim | |
| 2021/0134809 A1 | 5/2021 | Son et al. | |
| 2021/0181602 A1 | 6/2021 | Kim et al. | |
| 2021/0210492 A1* | 7/2021 | Han | H10B 12/50 |

* cited by examiner

*Primary Examiner* — Shih Tsun A Chou
*Assistant Examiner* — Jonathan Keith Little
(74) *Attorney, Agent, or Firm* — MORGAN, LEWIS & BOCKIUS LLP

(57) ABSTRACT

An upper electrode of an integrated circuit device includes a metal-containing conductive pattern disposed on a dielectric layer and that fills spaces between a plurality of lower electrodes and covers top surfaces of the plurality of lower electrodes, and a non-metal conductive pattern that includes a bottom surface in contact with a top surface of the metal-containing conductive pattern, and a top surface. The non-metal conductive pattern includes a lower non-metal conductive portion that includes a first top surface at a first height from the bottom surface, and an upper non-metal conductive portion that includes a second top surface at a second height from the bottom surface that is higher than the first height and that protrudes from the first top surface of the lower non-metal conductive portion away from the substrate. A difference between the second height and the first height is greater than the first height.

9 Claims, 45 Drawing Sheets

ID: 12,324,144 B2

INTEGRATED CIRCUIT (IC) DEVICE

CROSS-REFERENCE TO RELATED APPLICATION

This application claims priority under 35 U.S.C. § 119 from Korean Patent Application No. 10-2021-0170239, filed on Dec. 1, 2021 in the Korean Intellectual Property Office, the contents of which are herein incorporated by reference in their entirety.

TECHNICAL FIELD

Embodiments of the inventive concept are directed to integrated circuit (IC) devices, and more particularly, to an integrated circuit (IC) device that includes a capacitor.

DISCUSSION OF THE RELATED ART

With the development of electronic technology, downscaling of semiconductor devices is being rapidly conducted. Therefore, improving the reliability of a capacitor in an IC device is being studied.

SUMMARY

Embodiments of the inventive concept provides an integrated circuit device that has a device region with a reduced area due to downscaling, in which a structure is provided that minimizes resistance in a wiring structure connected to an upper electrode of a capacitor and suppresses aviation defects, thereby increasing reliability.

According to an embodiment of the inventive concept, there is provided an integrated circuit device that includes a plurality of lower electrodes disposed on a substrate, a dielectric layer that covers respective surfaces of the plurality of lower electrodes, and an upper electrode disposed on the dielectric layer and that Covers the plurality of lower electrodes. The upper electrode includes a metal-containing conductive pattern disposed on the dielectric layer and that fills spaces between the plurality of lower electrodes and covers respective top surfaces of the plurality of lower electrodes, and a non-metal conductive pattern that includes a bottom surface in contact with a top surface of the metal-containing conductive pattern, and a top surface that includes a plurality of recessed portions and a plurality of protruding portions. The non-metal conductive pattern includes a lower non-metal conductive portion that includes a first top surface at a first height from the bottom surface of the non-metal conductive pattern and that faces the plurality of lower electrodes with the metal-containing conductive pattern therebetween, and an upper non-metal conductive portion that includes a second top surface at a second height from the bottom surface of the non-metal conductive pattern that is higher than the first height and that protrudes from the first top surface of the lower non-metal conductive portion in a direction away from the substrate. A difference between the second height and the first height is greater than the first height.

According to another embodiment of the inventive concept, there is provided an integrated circuit device that includes a plurality of lower electrodes disposed on a substrate, a dielectric layer that covers respective surfaces of the plurality of lower electrodes, an upper electrode disposed on the dielectric layer and that includes and that includes a multi-layered structure that covers the plurality of lower electrodes, and a conductive damascene pattern buried in the upper electrode. The upper electrode includes a non-metal conductive pattern that includes a top surface that includes a plurality of recessed portions and a plurality of protruding portions, the non-metal conductive pattern includes a lower non-metal conductive portion that includes a bottom surface that faces the substrate and a first top surface at a first height from the bottom surface, and an upper non-metal conductive portion that includes a second top surface at a second height from the bottom surface that is higher than the first, height and that protrudes from the first top surface of the lower non-metal conductive portion in a direction away from the substrate, and a difference between the second height and the first height is greater than the first height. The conductive damascene pattern includes a bottom surface in contact with the first top surface of the lower non-metal conductive portion, and a topmost surface that is coplanar with the second top surface of the upper non-metal conductive portion.

According to another embodiment of the inventive concept, there is provided an integrated circuit device that includes a plurality of lower electrodes disposed on a substrate, a dielectric layer that covers respective surfaces of the plurality of lower electrodes, an upper electrode disposed on the dielectric layer and that covers the plurality of lower electrodes. The upper electrode includes a conductive metal nitride layer disposed on the dielectric layer and that fills a space between the plurality of lower electrodes and covers respective top surfaces of the plurality of lower electrodes, and a doped SiGe pattern that includes a bottom surface in contact with a top surface of the conductive metal nitride layer, and a top surface that includes a plurality of recessed portions and a plurality of protruding portions. The doped SiGe pattern includes a lower SiGe conductive portion that includes a first top surface at a first height from the bottom surface of the doped SiGe pattern and that faces the plurality of lower electrodes with the conductive metal nitride layer therebetween, and an upper SiGe conductive portion that includes a second top surface at a second height from the bottom surface of the doped SiGe pattern that is higher than the first height and that protrudes from the first top surface of the lower SiGe conductive portion in a direction away from the substrate. A difference between the second height and the first height is greater than the first height.

DETAILED DESCRIPTION

Figure 1:
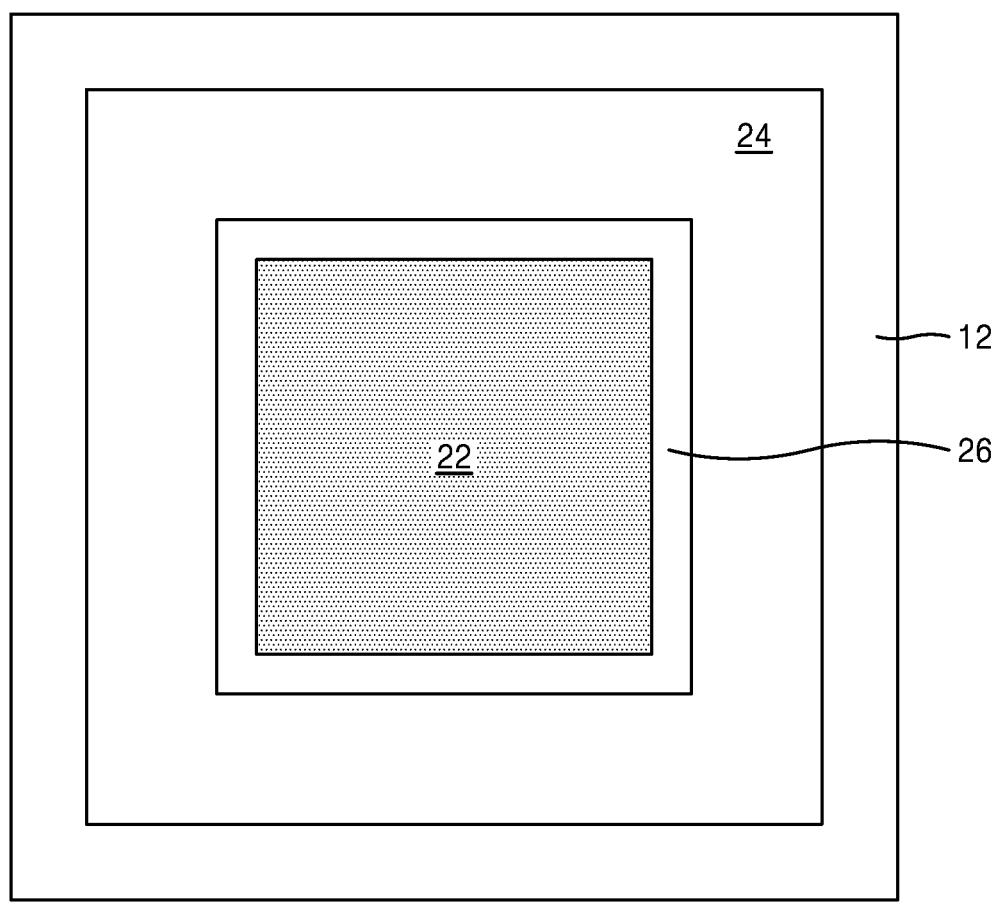
FIG. 1 is a schematic plan view of an integrated circuit device according to some embodiments of the inventive concept.

Embodiments will now be described more fully with reference to the accompanying drawings. In the accompanying drawings, like reference numerals may refer to like elements, and repeated descriptions of the like elements may be omitted.

FIG. 1 is a schematic plan view of an integrated circuit device 10 according to embodiments of the inventive concept.

Referring to FIG. 1, in an embodiment, the integrated circuit device 10 includes a substrate 12 that includes a memory cell area 22, a peripheral circuit area 24 that surrounds the memory cell area 22, and an interface area 26 between the memory cell area 22 and the peripheral circuit area 24.

The substrate 12 includes a semiconductor element such as Si or Ge, or at least one compound semiconductor selected from SiGe, SiC, GaAs, InAs, or InP. The substrate 12 includes a conductive region, such as an impurity-doped well or an impurity-doped structure.

In some embodiments, the memory cell area 22 includes a memory cell area of a dynamic random access memory (DRAM). The memory cell area 22 includes a plurality of unit memory cells that include a transistor and a capacitor. The peripheral circuit area 24 is where peripheral circuits that drive the memory cells in the memory cell area 22 are disposed. A plurality of conductive lines that enable an electric connection between the memory cell area 22 and the peripheral circuit area 24, and insulating structures that insulate the memory cell area 22 from the peripheral circuit area 24, are disposed in the interface area 26.

Figure 2:
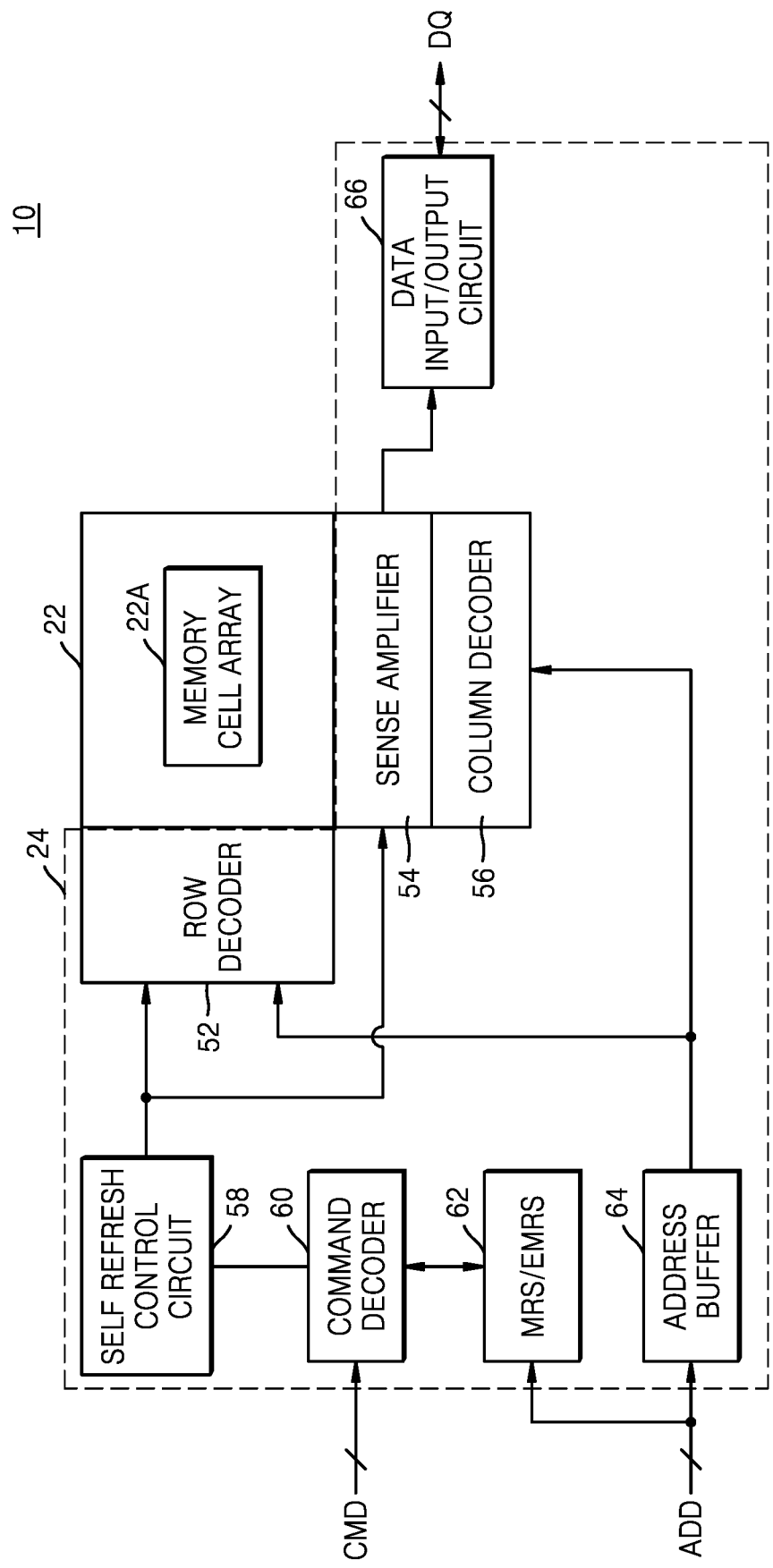
FIG. 2 is a block diagram of an integrated circuit device that includes a dynamic random access memory (DRAM) device.

FIG. 2 is a block diagram of an integrated circuit device 10 that includes a DRAM device.

In an embodiment, the memory cell area 22 includes a memory cell array 22A. The memory cell array 22A includes a plurality of memory cells that store data that are arranged in a row direction and a column direction, a plurality of word lines arranged in the row direction, and a plurality of bit lines and complementary bit lines arranged in the column direction. Each of the plurality of memory cells includes a cell capacitor and an access transistor. A gate of the access transistor is connected to a corresponding word line, one of a source and a drain thereof is connected to a corresponding bit line or complementary bit line, and the other is connected to the cell capacitor.

The peripheral circuit area 24 includes a row decoder (a decoder circuit) 52, a sense amplifier (an amplifier circuit) 54, a column decoder (a decoder circuit) 56, a self-refresh control circuit (a control circuit) 58, a command decoder (a decoder circuit) 60, a mode register set/extended mode register set (MRS/EMRS) (a register circuit) circuit 62, an address buffer (a buffer circuit) 64, and a data input/output (I/O) (an I/O circuit) circuit 66.

The sense amplifier 54 senses and amplifies data of the memory cells of the memory cell array 22A and stores the data in the memory cells. The sense amplifier 54 can be implemented by a cross-coupled amplifier that is connected between the bit line and the complementary bit line in the memory cell array 22A.

Data DQ that is received from the data input/output circuit 66 is written to the memos y cell array 22A based on an address signal ADD, and data DQ read from the memory cell array 26 based on the address signal ADD is output via the data input/output circuit 66. To designate a memory cell to or from which data is to be written or read, the address signal ADD is input to the address buffer 64. The address buffer 64 can temporarily store an address signal ADD received from an external source.

The row decoder 52 decodes a row address from the address signal ADD received from the address buffer 64 to designate a word line connected to a memory cell to or from which data is to be input or output. In other words, the row decoder 52 enables the word line by decoding the row address received from the address buffer 64 in a data write or read mode. The row decoder 52 enables the word line by decoding a row address generated by an address counter in a self-refresh mode.

The column decoder 56 decodes a column address from the address signal ADD received from the address buffer 64 to designate a bit line connected to the memory cell to or from which data is to be input or output. The memory cell array 22A outputs data from the memory cell designated by the row and column addresses, or writes data to the memory cell.

The command decoder 60 receives command signals CMD from an external source and decodes the received command signals CMD and internally generates decoded command signals, such as a self-refresh enter command or a self-refresh exit command.

The MRS/EMRS circuit 62 sets an internal mode resistor in response to the address signal ADD and an MRS/EMRS command that designates an operation mode of the integrated circuit device 10.

In addition, the integrated circuit device 10 further includes, for example, a clock circuit that generates a clock signal and a power circuit that receives a power voltage from an external source and generates or distributes an internal voltage.

The self-refresh control circuit 58 controls a self-refresh operation of the integrated circuit device 10, in response to a command received from the command decoder 60. The command decoder 60 includes an address counter, a timer, and a core voltage venerator. The address counter generates a row address that designates a row address on which a self-refresh is to be performed, in response to a self-refresh enter command received from the command decoder 60, and provides the row address to the row decoder 52. The address counter can stop a counting operation in response to the self-refresh exit command received from the command decoder 60.

Figure 3:
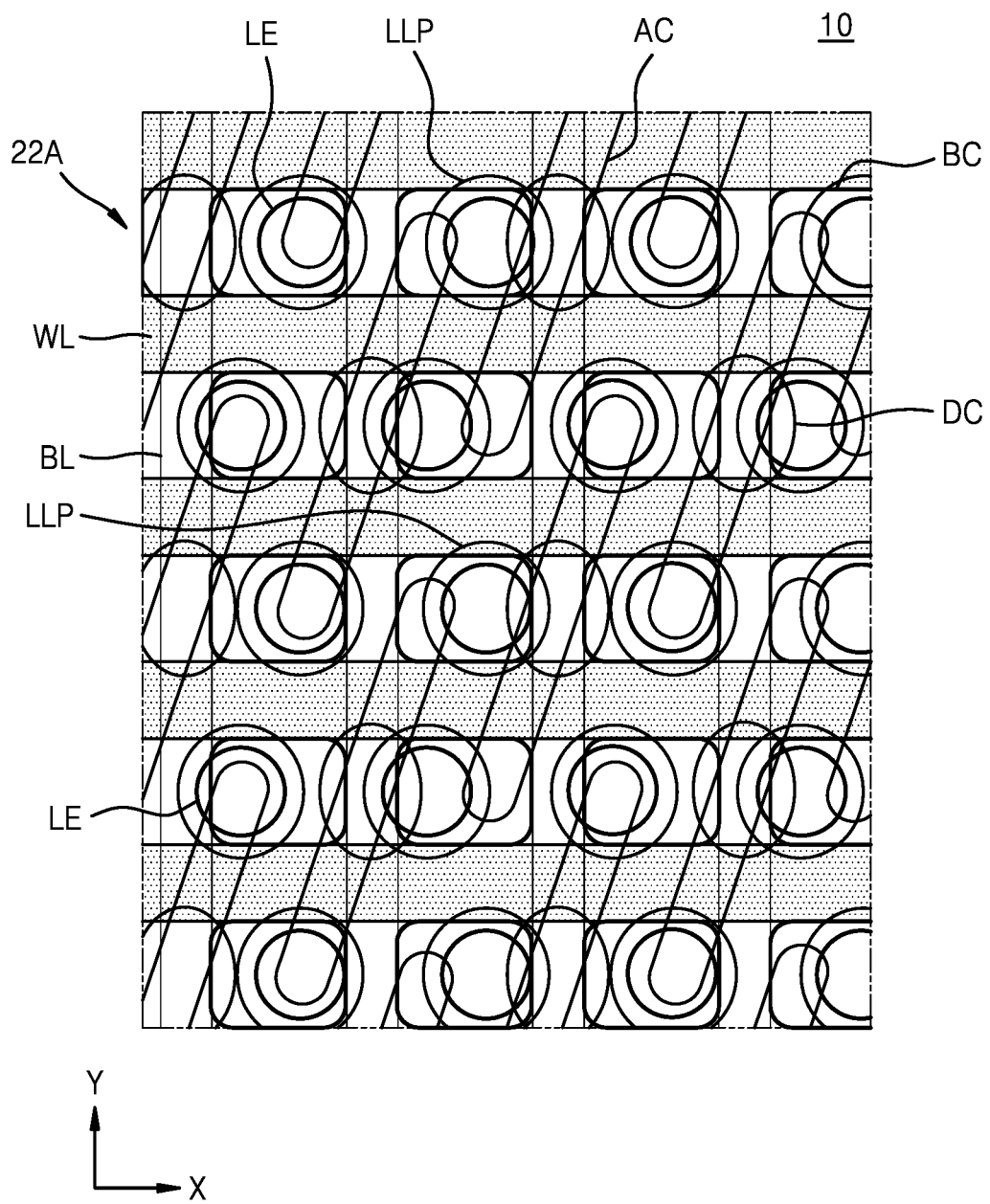
FIG. 3 is a schematic plan layout of a memory cell array of FIG. 2.

FIG. 3 is a schematic plan layout of the memory cell array 22A of FIG. 2.

Referring to FIG. 3, in an embodiment, the integrated circuit device 10 includes a plurality of active regions AC that extend in an oblique direction with respect to an X direction and a Y direction on a plane. A plurality of word lines WL extend parallel to each other in the X direction across the plurality of active regions AC. On the plurality of word lines WL, a plurality of bit lines BL extend in parallel to each other in the Y direction that intersects the X direction. The plurality of bit lines BL are connected to the active regions AC via direct contacts DC.

A plurality of buried contacts BC are formed between adjacent bit lines BL. A plurality of lower electrode landing pads LLP are formed on the plurality of buried contacts BC. Each of the plurality of lower electrode landing pads LLP at least partially overlaps a buried contact BC. A plurality of lower electrodes LE that are spaced apart from one another are formed on the plurality of lower electrode landing pads LLP. The plurality of lower electrodes LE are connected to the plurality of active regions AC via the plurality of buried contacts BC and the plurality of lower electrode landing pads LLP.

Figure 4:
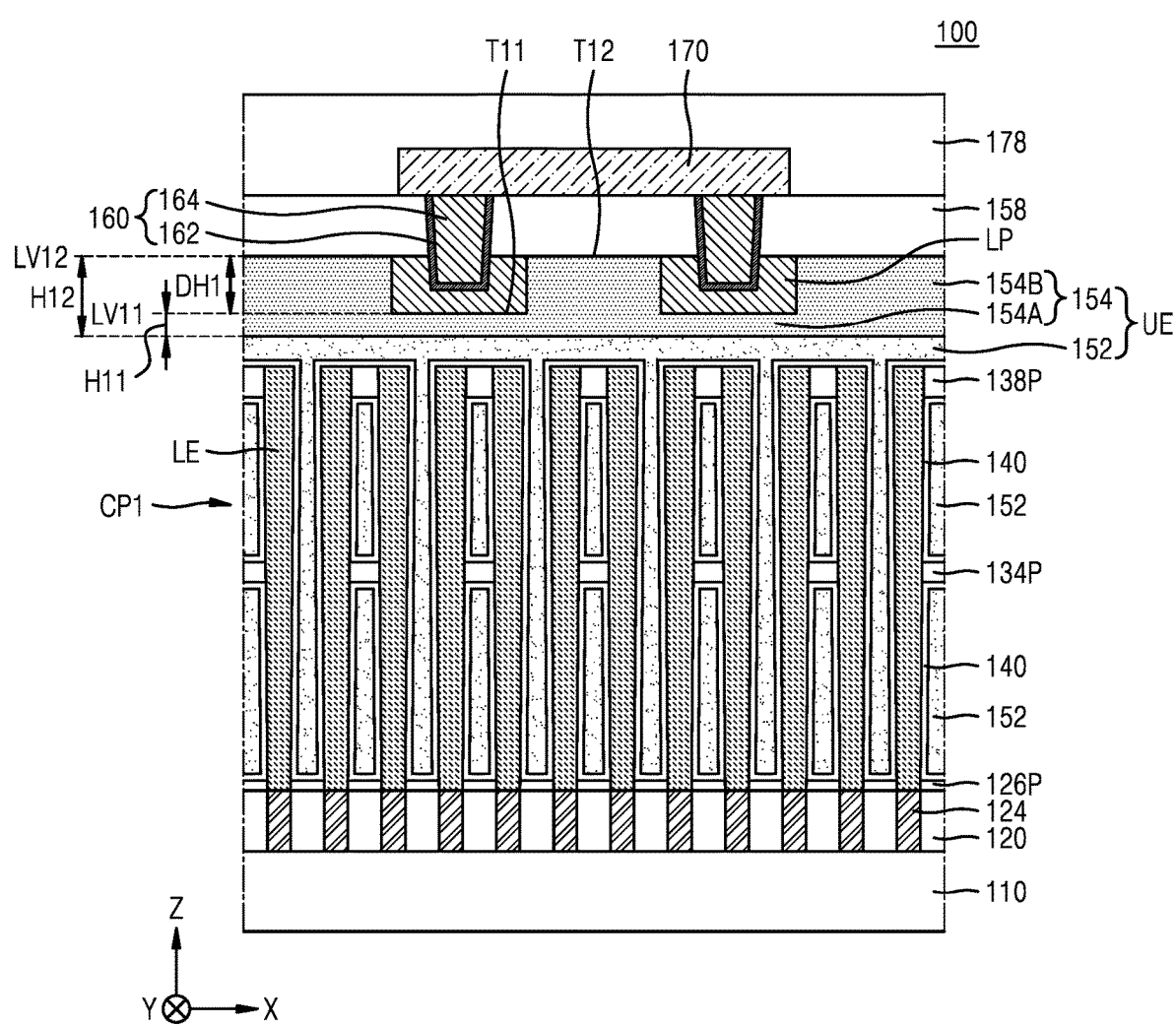
FIG. 4 is a cross-sectional view of an integrated circuit device according to embodiments of the inventive concept.

FIG. 4 is a cross-sectional view of an integrated circuit device 100 according to embodiments of the inventive concept. The components of the integrated circuit device 100 illustrated in FIG. 4 are a portion of the memory cell array 22A of the integrated circuit device 10 of FIGS. 1 through 3. In FIG. 4, some components of the integrated circuit device 100 are omitted or simplified. However, the embodiment of the integrated circuit device 100 is not necessarily limited to that shown in FIG. 4 and may include characteristics of embodiments as described below.

Referring to FIG. 4, in an embodiment, the integrated circuit device 100 includes a substrate 110 and a lower structure 120 formed on the substrate 110. The substrate 110 is a portion of the substrate 12 of FIG. 1. The substrate 110 includes the plurality of active regions AG of FIG. 3. A plurality of conductive regions 124 penetrate through the lower structure 120 and are connected to the plurality of active regions AC in the substrate 110.

The substrate 110 includes a semiconductor element such as Si or Ge, or a compound semiconductor such as SiC, GaAs, InAs, or InP. The substrate 110 may include a semiconductor substrate, at least one insulation layer formed on the semiconductor substrate, or structures that include at least one conductive region. The conductive region may be, for example, an impurity-doped well or an impurity-doped structure. An isolation region that defines the plurality of active regions AC is formed in the substrate 110. The isolation region includes at least one of an oxide layer, a nitride layer, or a combination thereof.

According to embodiments, the lower structure 120 includes an insulation layer, which is a silicon oxide layer, a silicon nitride layer, or a combination thereof. According to embodiments, the lower structure 120 includes various conductive regions, such as a wiring layer, a contact plug, and a transistor, and an insulating layer that insulates the conductive regions from each other. The plurality of conductive regions 124 include at least one of polysilicon, a metal, a conductive metal nitride, a metal silicide, or a combination thereof. The lower structure 120 includes the plurality of bit lines BL of FIG. 3. Each of the plurality of conductive regions 124 includes the buried contact BC and the lower electrode landing pad LLP of FIG. 3.

An insulation pattern 126P is disposed on the lower structure 120 and the plurality of conductive regions 124. The insulation pattern 126P may be at least one of a silicon nitride (SiN) layer, a silicon carbonitride (SiCN) layer, a silicon boron nitride (SiBN) layer, or a combination thereof. Terms "SiN", "SiCN", and "SiBN" used herein refer to materials composed of elements respectively included in these terms, and are not chemical formulas indicating stoichiometric relationships.

A plurality of capacitors CP1 are arranged on the plurality of conductive regions 124. The plurality of capacitors CP1 include a plurality of lower electrodes LE, a dielectric layer 140, and an upper electrode UE. Each of the plurality of lower electrodes LE has a pillar shape that penetrates through the insulation pattern 126P from a top surface of a conductive region 124 and extends away from the substrate 110 in a vertical direction (Z direction). The dielectric layer 140 and the upper electrode UE are sequentially formed on the plurality of lower electrodes LE. Although each of the plurality of lower electrodes LE has a pillar shape in FIG. 4, embodiments of the inventive concept are not necessarily limited thereto. For example, in some embodiments, each of the plurality of lower electrodes LE has a cross-section of a cup shape or a cylinder shape with a closed bottom portion. The upper electrode UE face the plurality of lower electrodes LE with the dielectric layer 140 between the upper electrode UE and the plurality of lower electrodes LE.

The plurality of lower electrodes LE include at least one of a metal layer, a conductive metal oxide layer, a conductive metal nitride layer, a conductive metal oxynitride layer, or a combination thereof. According to embodiments, each of the plurality of lower electrodes LE includes at least one of Ti, Ti oxide, Ti nitride, Ti oxynitride, Co, Co oxide, Co nitride, Co oxynitride, Nb, Nb oxide, Nb nitride, Nb oxynitride, Sn, Sn oxide, Sn nitride, Sn oxynitride, or a combination thereof. For example, each of the plurality of lower electrodes LE includes, but is not necessarily limited to, TiN, CoN, NbN, $SnO_2$, or a combination thereof.

The dielectric layer 140 is a high-k dielectric layer. The term "high-k dielectric layer" means that the layer has a higher dielectric constant than a silicon oxide layer. According to embodiments, the dielectric layer 140 is formed of a metal oxide that includes at least one metal selected from hafnium (Hf), zirconium (Zr), aluminum (Al), niobium (Nb), cerium (Ce), lanthanum (La), tantalum (Ta), or titanium (Ti). According to embodiments, the dielectric layer 140 has a single layer structure that includes one type of high-k dielectric layer. According to embodiments, the dielectric layer 140 has a multi-layered structure that includes a plurality of different high-k dielectric layers. The high-k dielectric layer is formed of, but is not necessarily limited to, $HfO_2$, $ZrO_2$, $Al_2O_3$, $La_2O_3$, $Ta_2O_3$, $Nb_2O_5$, $CeO_2$, $TiO_2$, $GeO_2$, or a combination thereof.

The plurality of lower electrodes LE are supported by a lower support pattern 134P and an upper support pattern 138P. The upper support pattern 138P extend in a horizontal direction parallel to the substrate 110 while surrounding upper ends of the plurality of lower electrodes LE. The lower support pattern 134P extend in the horizontal direction parallel to the substrate 110, between the insulation pattern 126P and the upper support pattern 138P and surround middle portions of the plurality of lower electrodes LE. The lower support pattern 134P and the upper support pattern 138P contact the plurality of lower electrodes LE, respectively. Each of the lower support pattern 134P and the upper support pattern 138P is one of a silicon nitride (SiN) layer, a silicon carbonitride (SiCN) layer, a silicon boron nitride (SiBN) layer, or a combination thereof.

The upper electrode UE is a multi-layered structure that covers the plurality of lower electrodes LE and is located over the dielectric layer 140. The multi-layered structure of the upper electrode UE includes a metal-containing conductive pattern 152 and a non-metal conductive pattern 154 that are sequentially stacked on the dielectric layer 140.

The metal-containing conductive pattern 152 fills a space on the dielectric layer 140 between adjacent lower electrodes LE, and covers top surfaces of the plurality of lower electrodes LE. According to embodiments, the metal-containing conductive pattern 152 is one of a metal layer, a conductive metal oxide layer, a conductive metal nitride layer, a conductive metal oxynitride layer, or a combination thereof. According to embodiments, the metal-containing conductive pattern 152 include Ti, Ti oxide, Ti nitride, Ti oxynitride, Co, Co oxide, Co nitride, Co oxynitride, Nb, Nb oxide, Nb nitride, Nb oxynitride, Sn, Sn oxide, Sn nitride, Sn oxynitride, or a combination thereof. For example, each of the plurality of lower electrodes LE includes, but is not necessarily limited to, TiN, CoN, NbN, $SnO_2$, or a combination thereof.

The non-metal conductive pattern 154 includes a bottom surface in contact with a top surface of the metal-containing conductive pattern 152, and a top surface that includes a plurality of recessed portions and protruding portions that alternate in a square wave pattern. Top surfaces of the plurality of recessed portions in the non-metal conductive pattern 154 include a first top surface T11 at a first vertical level LV11 from the substrate 110, and top surfaces of the plurality of protruding portions include a second top surface T12 at a second vertical level LV12 that is farther from the substrate 110 than the first vertical level LV11. The first top surface T11 has a first height H11 in a vertical direction (Z direction) from a bottom surface of the non-metal conductive pattern 154, and the second top surface T12 has a second height H12 in the vertical direction (Z direction) from the bottom surface of the non-metal conductive pattern 154 that is greater than the first height H11. According to embodiments, the first height H11 may be from about 200 Å to about 400 Å, and the second height H12 may be from about 700 to about 1400 Å. For example, the first height H11 is about 300 Å, and the second height. H12 is about 1200 Å. However, the specific ranges of the first height H11 and the second height H12 are not necessarily limited thereto, and can be variously selected as necessary.

According to embodiments, the non-metal conductive pattern 154 is a doped SiGe layer. For example, the non-metal conductive pattern 154 is a boron-doped SiGe layer.

The non-metal conductive pattern 154 includes a lower non-metal conductive portion 154A that faces the plurality of lower electrodes LE with the metal-containing conductive pattern 152 therebetween, and an upper non-metal conductive portion 154B that protrudes from the lower non-metal conductive portion 154A in a direction away from the substrate 110. A topmost surface of the lower non-metal conductive portion 154A corresponds to the first top surface T11, and a topmost surface of the upper non-metal conductive portion 154B corresponds to the second top surface T12. The lower non-metal conductive portion 154A and the upper non-metal conductive portion 154B are integrally connected to each other.

In the vertical direction (Z direction), a total thickness of the non-metal conductive pattern 154 corresponds to the second height H12, a thickness of the lower non-metal conductive portion 154A of the non-metal conductive pattern 154 corresponds to the first height H11, and a thickness of the upper non-metal conductive portion 154B of the non-metal conductive pattern 154 corresponds to a difference DH1 between the second height H12 and the first height H11. In the vertical direction (Z direction), a thickness of the upper non-metal conductive portion 154B is greater than that of the lower non-metal conductive portion 154A. In other words, the difference DH1 between the second height H12 and the first height H11 is greater than the first height H11.

A plurality of conductive landing pads LP are arranged in the recessed portions of the non-metal conductive pattern 154. Each of the plurality of conductive landing pads LP has a bottom surface in contact with the first top surface T11, which is the topmost surface of the lower non-metal conductive portion 154A, and a topmost surface that is coplanar with the second top surface T12, which is the topmost surface of the upper non-metal conductive portion 154B. Each of the plurality of conductive landing pads LP is a damascene pattern formed using a damascene process. In the present specification, a conductive landing pad LP may be referred to as a damascene pattern.

Each of the plurality of conductive landing pads LP is one of a metal layer, a conductive metal nitride layer, or a combination thereof. According to embodiments, each of the plurality of conductive landing pads LP is formed of, but is not necessarily limited to, one of W, Cu, Al, Co, Mo, Ru, Ti, Ta, TiN, TaN, or a combination thereof. For example, each of the plurality of conductive landing pads LP includes a W layer. The W layer of each of the plurality of conductive landing pads LP is in contact with the non-metal conductive pattern 154.

The non-metal conductive pattern 154 and the plurality of conductive landing pads LP are covered with a capping insulation layer 158. The second top surface T12 of the non-metal conductive pattern 154 and the respective topmost surfaces of the plurality of conductive landing pads LP are in contact with a bottom surface of the capping insulation layer 158.

According to embodiments, the capping insulation layer 158 is a silicon oxide layer. For example, the capping insulation layer 158 is formed of a silicon oxide-based material such as plasma enhanced oxide (PEOX), tetraethyl orthosilicate (TEOS), boro TEOS (BTEOS), phospho TEOS (PTEOS), horn phospho TEOS (BPTEOS), born silicate glass (BSG), phospho silicate glass (PSG), or horn phospho silicate glass (BPSG).

A plurality of conductive contact plugs 160 are disposed in the plurality of conductive landing pads LP. Each of the plurality of conductive contact plugs 160 penetrates through the capping insulation layer 158 in the vertical direction (Z direction) and into the conductive landing pad LP. A lower portion of each of the plurality of conductive contact plugs 160 contacts a portion of a corresponding conductive landing pad LP. A vertical level of a lowest surface of each of the plurality of conductive contact plugs 160 is higher than the first vertical level LV11 and lower than the second vertical level LV12. The plurality of conductive contact plugs 160 are spaced apart from the non-metal conductive pattern 154 by respective portions of the conductive landing pads LP therebetween.

Each of the plurality of conductive contact plugs 160 includes a conductive barrier layer 162 and a conductive plug 164 that are sequentially stacked on the corresponding conductive landing pad LP. According to embodiments, the conductive barrier layer 162 is formed of at least one of Ti, Ta, W, TiN, TaN, WN, WCN, TiSiN, TaSiN, WsiN, or a combination thereof. According to embodiments, the conductive plug 164 is formed of one of W, Cu, Al, Co, Mo, or Ru.

Figure 5A:
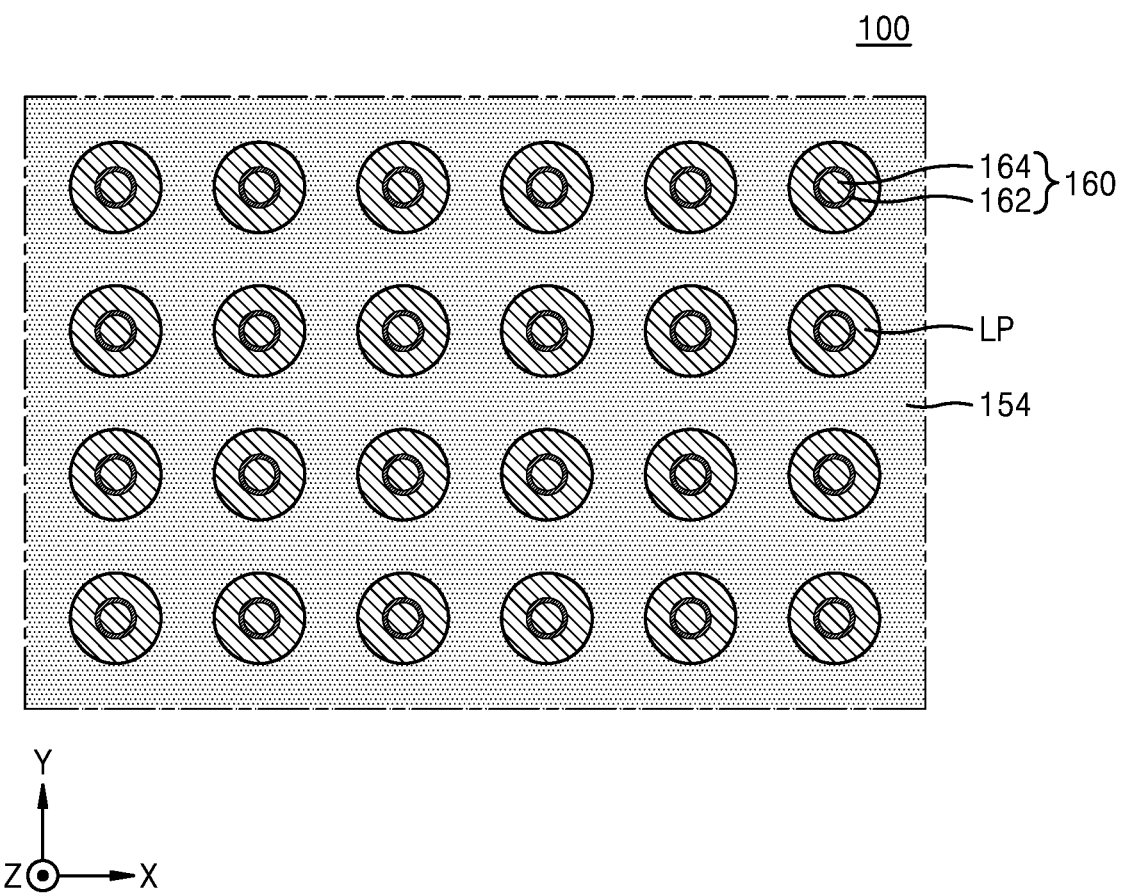
FIGS. 5A through 5C are plan views of an integrated circuit device illustrated in FIG. 4, respectively.

FIG. 5A is a plan view of the non-metal conductive pattern 154, the plurality of conductive landing pads LP, and the plurality of conductive contact plugs 160 in the integrated circuit device 100 of FIG. 4, according to some embodiments.

Referring to FIG. 5A, the plurality of conductive landing pads LP according to some embodiments each has a planar shape of an approximately circular island. The plurality of conductive landing pads LP and the plurality of conductive contact plugs 160 are arranged in a 1:1 correspondence, and one conductive contact plug 160 is disposed on one conductive landing pad LP.

Figure 5B:
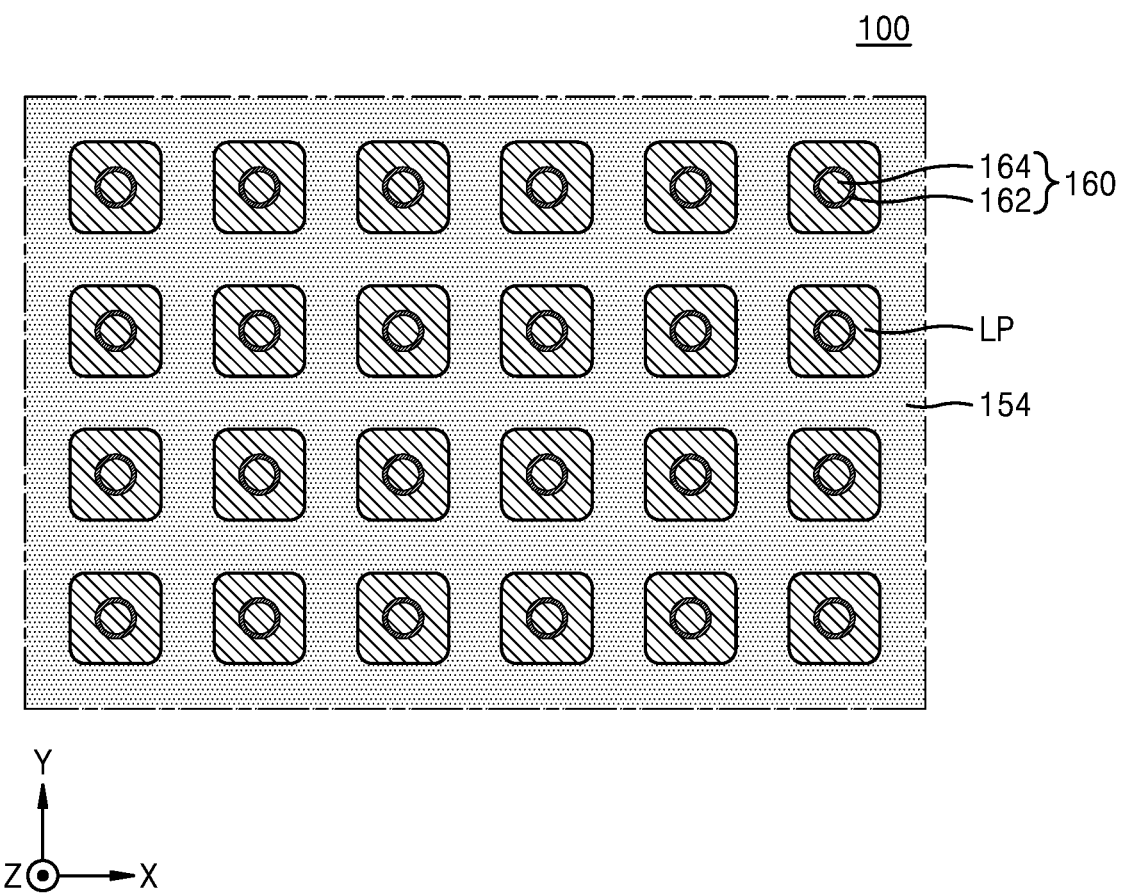

FIG. 5B is a plan view of the non-metal conductive pattern 154, the plurality of conductive landing pads LP, and the plurality of conductive contact plugs 160 in the integrated circuit device 100 of FIG. 4, according to some embodiments.

Referring to FIG. 5B, the plurality of conductive landing pads LP according to some embodiments each has a planar shape of an approximately rectangular island. The plurality of conductive landing pads LP and the plurality of conductive contact plugs 160 may be arranged in a 1:1 correspondence, and one conductive contact plug 160 is disposed on one conductive landing pad LP.

Figure 5C:
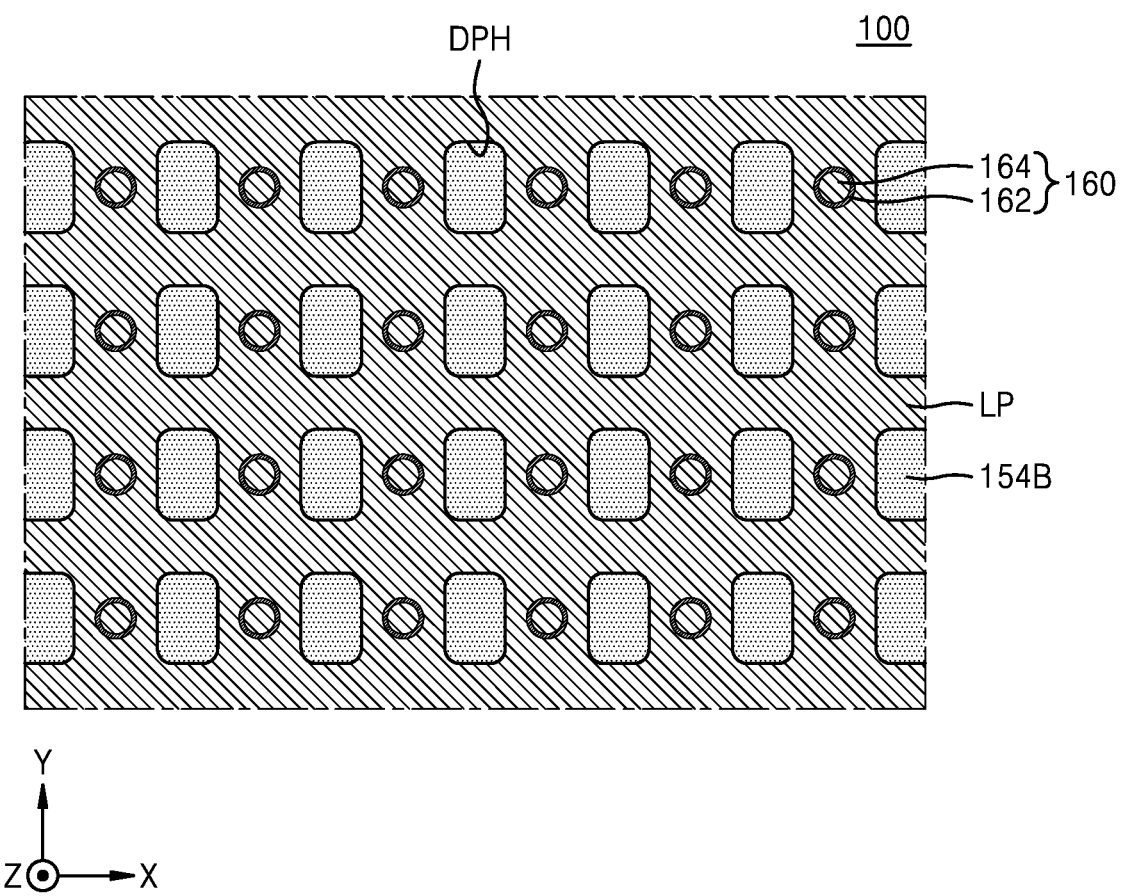

FIG. 5C is a plan view of the non-metal conductive pattern 154, the plurality of conductive landing pads LP, and the plurality of conductive contact plugs 160 in the integrated circuit device 100 of FIG. 4, according to some embodiments.

Referring to FIG. 5C, the plurality of conductive landing pads LP according to some embodiments have a mesh-type planar shape in which they are integrally connected to each other to form a plurality of openings DPH. The upper non-metal conductive portion 154B of the non-metal conductive pattern 154 is arranged in each of the plurality of openings DPH. Each of the plurality of conductive contact plugs 160 is connected to a partial region on the integrally-connected conductive landing pad LP.

Referring back to FIG. 4, an upper wiring layer 170 is disposed on the plurality of conductive contact plugs 160 and the capping insulation layer 158, and an interlayer insulation layer 178 that covers the upper wiring layer 170 and the capping insulation layer 158 is disposed on the upper wiring layer 170. A bottom surface of the upper wiring layer 170 is in contact with a top surface of at least one of the plurality of conductive contact plugs 160. In an embodiment, the upper wiring layer 170 connects adjacent conductive contact plugs 160.

According to embodiments, the upper wiring layer 170 is formed of at least one of W, Cu, Al, Co, Mo, Ru, Ti, Ta, TiN, TaN, or a combination thereof. For example, the upper wiring layer 170 includes a Cu layer. According to embodiments, the interlayer insulation layer 178 is a low-k dielectric layer that has a low dielectric constant K of about from 2.2 to about 3.0. For example, the interlayer insulation layer 178 is one of an SiOC layer or an SiCOH layer.

The integrated circuit device 100 of FIG. 4 includes the non-metal conductive pattern 154 that has a top surface that includes the plurality of recessed portions and protruding portions, and includes the relatively thin lower non-metal conductive portion 154A due to the plurality of recessed portions, which reduces the total volume of the non-metal conductive pattern 154. Therefore, the generation of aviation defects when the non-metal conductive pattern 154 is formed as a boron-doped SiGe layer is reduced. The conductive landing pad LP is disposed on the lower non-metal conductive portion 154A of the non-metal conductive pattern 154, and the topmost surface of the conductive landing pad LP is coplanar with the second top surface T12, which is the topmost surface of the upper non-metal conductive portion 154B. For example, the conductive landing pad LP penetrates a portion of the non-metal conductive pattern 154. Therefore, a resistance that may be caused by a reduction in the total volume of the non-metal conductive pattern 154 is reduced by using the conductive landing pad LP. Moreover, because the conductive contact plug 160 is electrically connected to the upper electrode UE of the capacitor CP1 and is disposed on the conductive landing pad LP, the conductive landing pad LP serves as an etch stop layer in a process of forming a contact hole for forming the conductive contact plug 160, and thus a structure that reduces the total thickness of the non-metal conductive pattern 154 is provided that suppresses generation of aviation defects.

As a comparative example, referring to FIG. 4, when a comparative conductive landing pad that completely covers the top surface of the non-metal conductive pattern 154 is formed instead of forming the plurality of conductive landing pads LP that cover only a partial region on the non-metal conductive pattern 154, adhesion between the comparative conductive landing pad and the non-metal conductive pattern 154 may weaken during a subsequent process due to a relatively large stress in the comparative conductive landing pad, and thus the comparative conductive landing pad and the non-metal conductive pattern 154 may separate from each other. In particular, when the non-metal conductive pattern 154 is formed of doped SiGe and the comparative conductive landing pad is formed of W, the aforementioned adhesion weakening caused by the stress of W may become severe.

Because the integrated circuit device 100 according to embodiments of the inventive concept includes the plurality of conductive landing pads LP that cover some regions on the non-metal conductive pattern 154, in contrast with the comparative conductive landing pad, even when the non-metal conductive pattern 154 is formed of doped SiGe and the plurality of conductive landing pads LP are formed of W, the plurality of conductive landing pads LP do not separate from the non-metal conductive pattern 154 due to stress in the plurality of conductive landing pads LP.

FIGS. 6A through 6F are plan views of integrated circuit devices according to embodiments of the inventive concept, respectively. Exemplary structures of integrated circuit devices 100A, 100B, 100C, 100D, 100E, and 100F modified from the integrated circuit device 100 of FIG. 4 will be described with reference to FIGS. 6A through 6F. Components of the integrated circuit devices 100A, 100B, 100C, 100D, 100E and 100F may constitute a portion of the memory cell array 22A of the integrated circuit device 10 of FIGS. 1 through 3. The same reference characters and numerals in FIGS. 6A through 6F as those in FIG. 4 may denote the same elements, and thus their redundant description may be omitted herein.

Figure 6A:
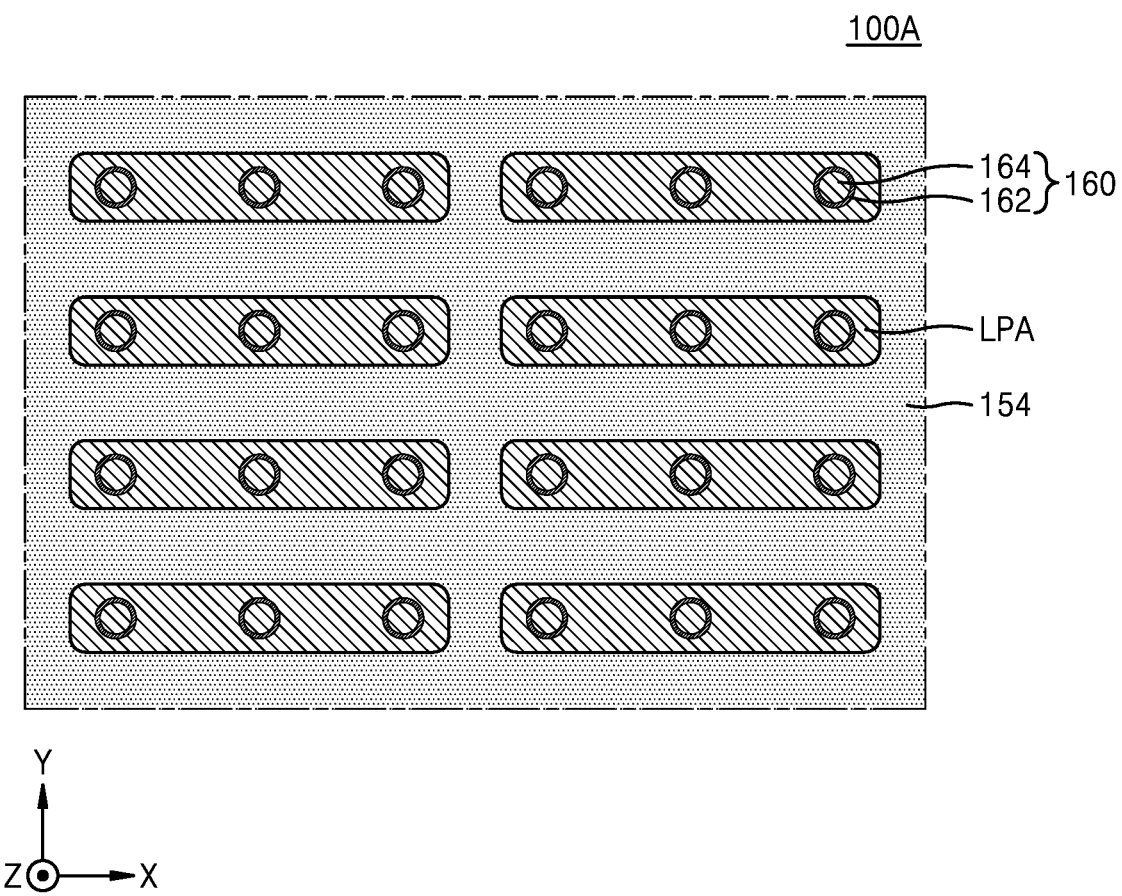
FIGS. 6A through 6F are plan views of integrated circuit devices according to embodiments of the inventive concept, respectively.

Referring to FIG. 6A, in an embodiment, the integrated circuit device 100A has a structure similar to that of the integrated circuit device 100 described above with reference to FIG. 4. However, the integrated circuit device 100A includes a plurality of conductive landing pads LPA instead of the plurality of conductive landing pads LP. The plurality of conductive landing pads LPA are buried in the non-metal conductive pattern 154. Respective topmost surfaces of the plurality of conductive landing pads LPA are coplanar with the second top surface T12 (see 4), which is the topmost surface of the non-metal conductive pattern 154.

Each of the plurality of conductive landing pads LPA has a planar bar shape that extends in a first horizontal direction (X direction). Each of the plurality of conductive landing pads LPA has a length in the first horizontal direction (X direction) and a width in a second horizontal direction (Y direction) perpendicular to the first horizontal direction (X direction), and the length is greater than the width. The plurality of conductive landing pads LPA includes a first group of conductive landing pads LPA arranged at equal intervals in the second horizontal direction (Y direction). The plurality of conductive landing pads LPA includes a second group of conductive landing pads LPA adjacent to the first group in the first horizontal direction (X direction), and the second group of conductive landing pads LPA are also arranged at equal intervals in the second horizontal direction (Y direction).

Each of the plurality of conductive landing pads EPA has a plurality of conductive contact plugs 160 arranged thereon, and the plurality of conductive contact plugs 160 an each conductive landing pad LPA are electrically connected to the conductive landing pad LPA.

Figure 6B:
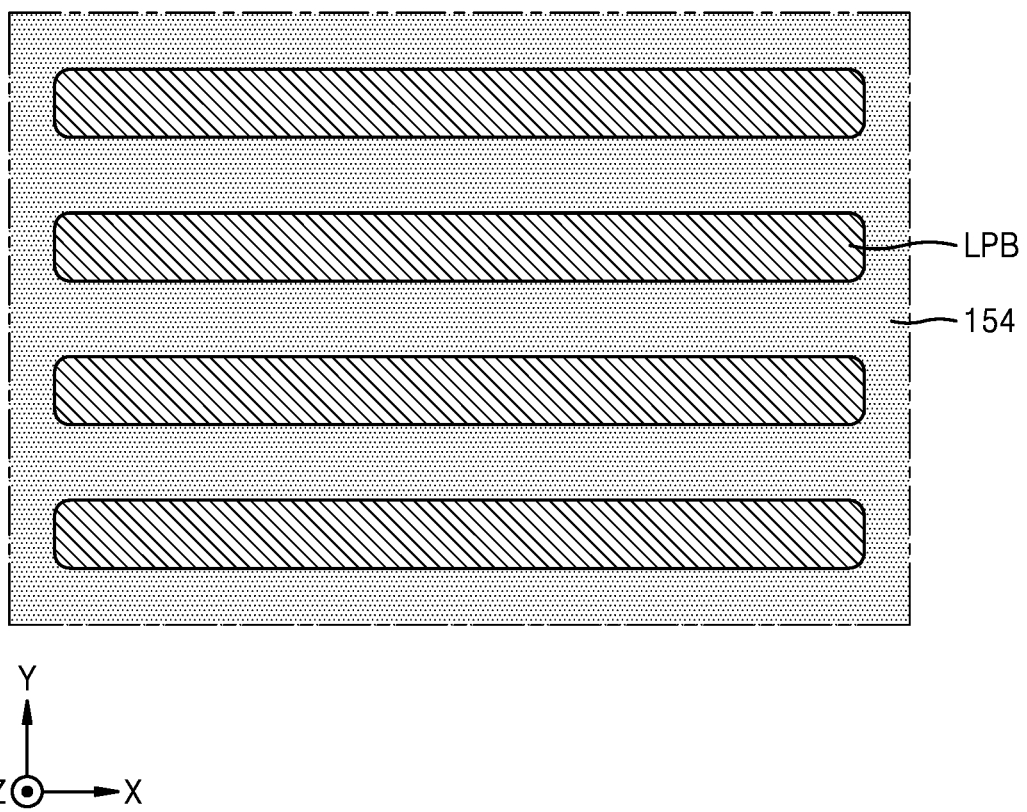

Referring to FIG. 6B, in an embodiment, the integrated circuit device 100B has a structure similar to that of the integrated circuit device 100 described above with reference to FIG. 4. However, the integrated circuit device 100B includes a plurality of conductive landing pads LPB instead of the plurality of conductive landing pads LP. The plurality of conductive landing pads LPB are buried in the non-metal conductive pattern 154. Respective topmost surfaces of the plurality of conductive landing pads LPB are coplanar with the second top surface T12 (see FIG. 4), which is the topmost surface of the non-metal conductive pattern 154.

Each of the plurality of conductive landing pads LPB has a planar bar shape that extends in the first horizontal direction (X direction). Each of the plurality of conductive landing pads LPB has a length in the first horizontal direction (X direction) and a width in the second horizontal direction (Y direction) perpendicular to the first horizontal direction (X direction), and the length is greater than the width. The plurality of conductive landing pads LPB include a first group of conductive landing pads LPB arranged at equal intervals in the second horizontal direction (Y direction).

in addition, each of the plurality of conductive landing pads LPA has the plurality of conductive contact plugs 160 (see FIG. 4) arranged thereon, similar to FIG. 6A, and the plurality of conductive contact plugs 160 arranged on each conductive landing pad LPB are electrically connected to the conductive landing pad LPB.

Figure 6C:
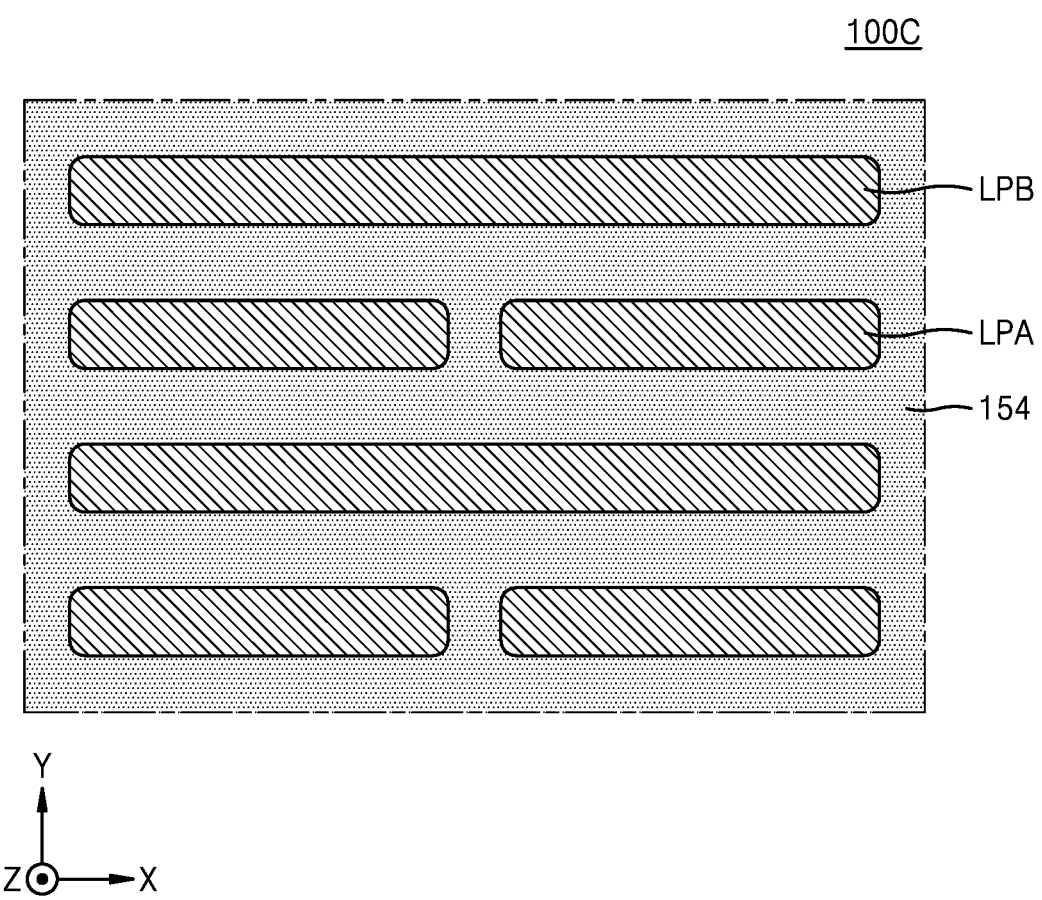

Referring to FIG. 6C, in an embodiment, the integrated circuit device 100C has a structure similar to that of the integrated circuit device 100 described above with reference to FIG. 4. However, the integrated circuit device 100C includes a plurality of conductive landing pads EPA and a plurality of conductive landing pads LPB instead of the plurality of conductive landing pads LP.

The conductive landing pads LPA and the conductive landing pads LPB are alternately arranged with each other on the non-metal conductive pattern 154 in the second horizontal direction (Y direction). More detailed structures of the plurality of conductive landing pads LPA and the plurality of conductive landing pads LPB are the same as those described with reference to FIGS. 6A and 6B.

Figure 6D:
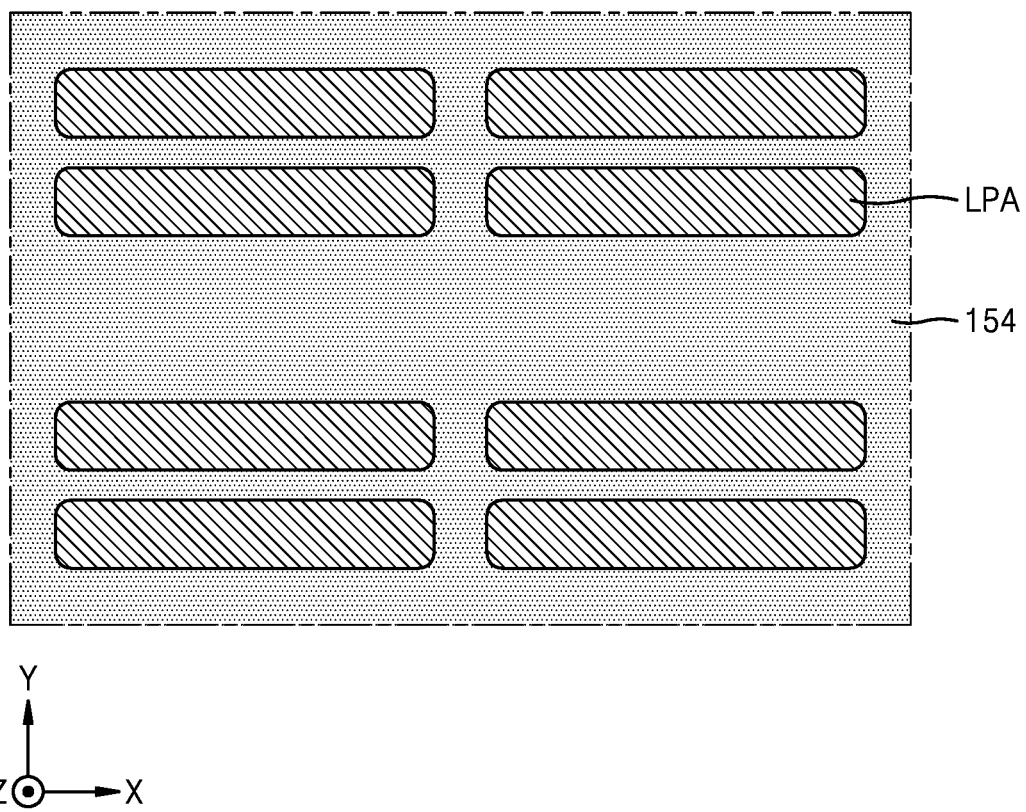

Referring to FIG. 6D, in an embodiment, the integrated circuit device 100D has a structure similar to that of the integrated circuit device 100 described above with reference to FIG. 4. However, the integrated circuit device 100D includes a plurality of conductive landing pads LPA instead of the plurality of conductive landing pads LP. The conductive landing pads LPA are arranged at irregular intervals on the non-metal conductive pattern 154 in the second horizontal direction (Y direction). More particularly, groups of a plurality of conductive landing pads LPA are arranged at equal intervals in the second horizontal direction (Y direction), where the interval between groups of conductive landing pads LPA is greater than the interval between adjacent conductive landing pads LPA within the group of conductive landing pads LPA. Although FIG. 6D shows each group as including two conductive landing pads LPA, embodiments are not necessarily limited to that number per group. More detailed structures of the plurality of conductive landing pads LPA are the same as those described with reference to FIG. 6A.

Figure 6E:
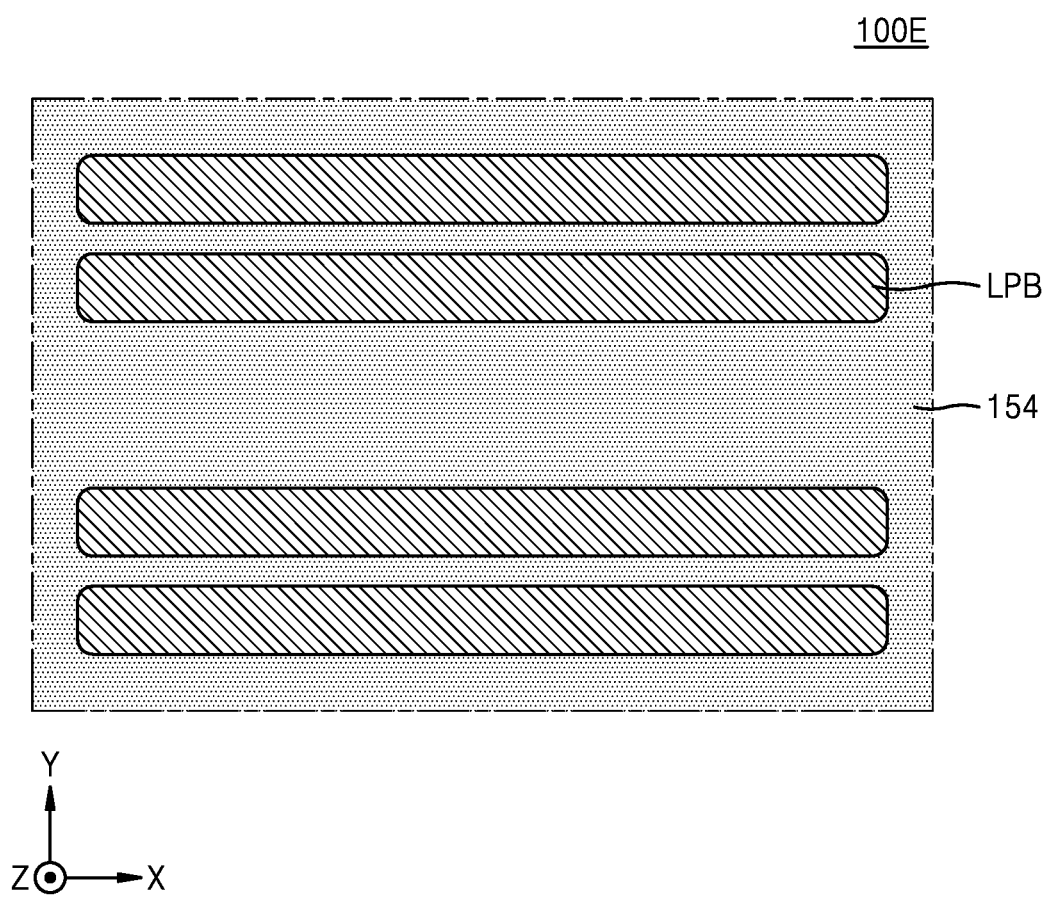

Referring to FIG. 6E, in an embodiment, the integrated circuit device 100E has a structure similar to that of the integrated circuit device 100 described above with reference to FIG. 4. However, the integrated circuit device 100E includes a plurality of conductive landing pads LPB instead of the plurality of conductive landing pads LP. The conductive landing pads LPB may be arranged at irregular intervals on the non-metal conductive pattern 154 in the second horizontal direction (Y direction). More detailed structures of the plurality of conductive landing pads LPB are the same as those described with reference to FIGS. 6B and 6D.

Figure 6F:
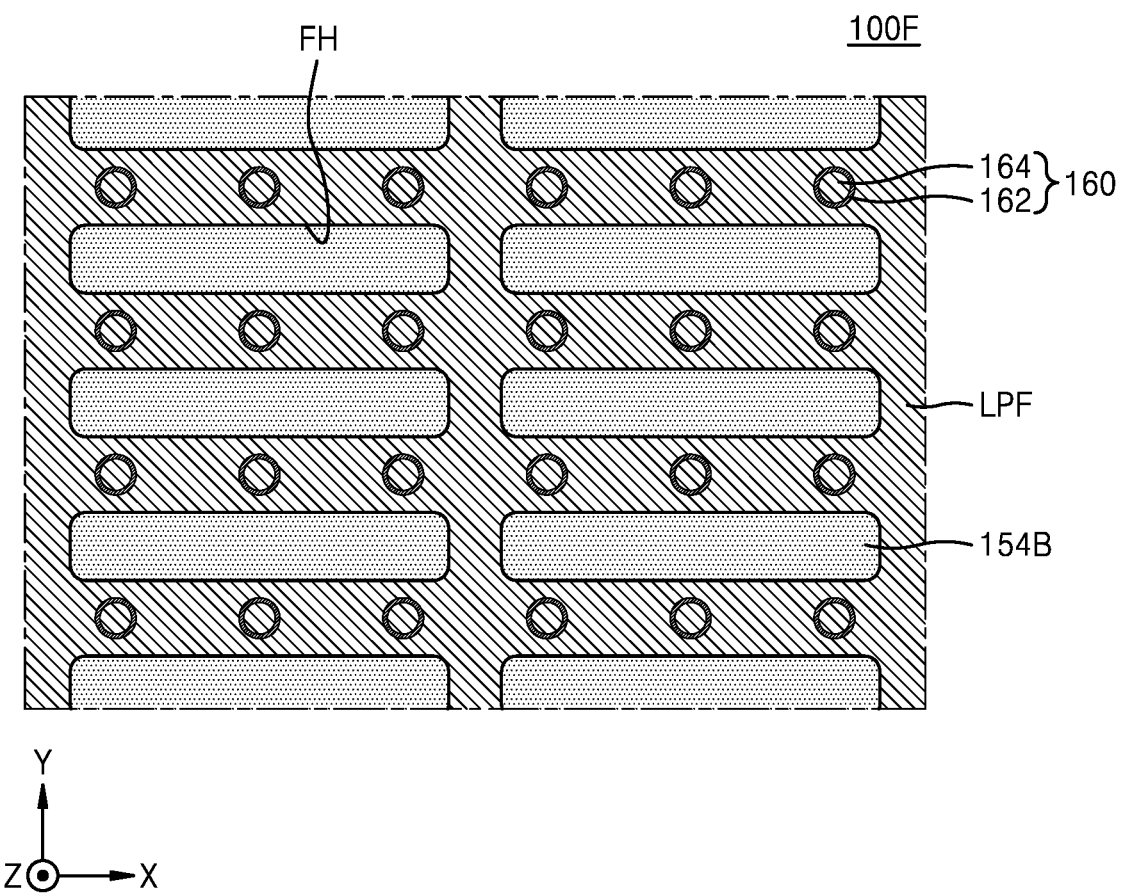

Referring to FIG. 6F, in an embodiment, the integrated circuit device 100E has a structure similar to that of the integrated circuit device 100 described above with reference to FIG. 4. However, the integrated circuit device 100F includes a conductive landing pad LPF instead of the plurality of conductive landing pads LP. The conductive landing pad LPF has a mesh-type planar shape that is integrally connected and that forms a plurality of openings FH. The upper non-metal conductive portion 154B of the non-metal conductive pattern 154 are arranged in each of the plurality of openings FH.

The conductive landing pad LPF are buried in the upper non-metal conductive portion 154B of the non-metal conductive pattern 154. A topmost surface of the conductive landing pad LPF is coplanar with the second top surface T12 (see FIG. 4), which is the topmost surface of the upper non-metal conductive portion 154B of the non-metal conductive pattern 154.

Each of the plurality of openings FH formed in the conductive landing pad LPF has a planar bar shape that extends in the first horizontal direction (X direction). Each of the plurality of openings FH has a length in the first horizontal direction (X direction) and a width in the second horizontal direction (Y direction) perpendicular to the first horizontal direction (X direction), and the length is greater than the width. The plurality of conductive contact plugs 160 are arranged on the conductive landing pad LPF. The plurality of conductive contact plugs 160 are electrically connected to the conductive landing pad LPF.

Figure 7A:
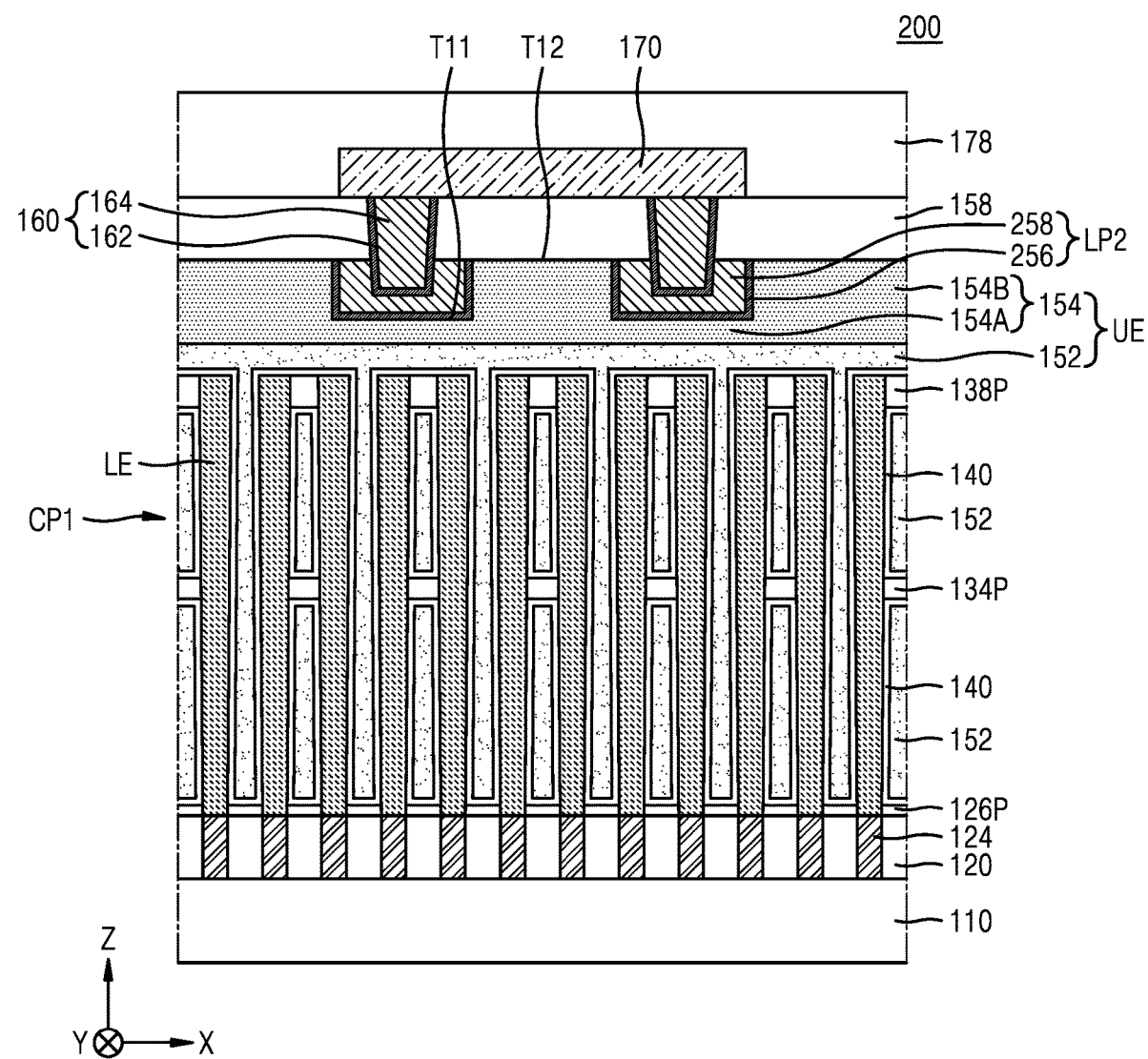
FIG. 7A is a cross-sectional view of an integrated circuit device according to embodiments of the inventive concept.

FIG. 7A is a cross-sectional view of an integrated circuit device 200 according to embodiments of the inventive concept. The components of the integrated circuit device 200 illustrated in FIG. 7A are a portion of the memory cell array 22A of the integrated circuit device 10 of FIGS. 1 through 3.

Referring to FIG. 7A, in an embodiment, the integrated circuit device 200 has a structure similar to that of the integrated circuit device 100 described above with reference to FIG. 4. However, the integrated circuit device 200 includes a plurality of conductive landing pads LP2 instead of the plurality of conductive landing pads LP.

Each of the plurality of conductive landing pads LP2 includes a conductive barrier layer 256 and a conductive metal pattern 258 sequentially stacked on the non-metal conductive pattern 154. The conductive metal pattern 258 are spaced apart from the non-metal conductive pattern 154 with the conductive barrier layer 256 therebetween. According to embodiments, the conductive barrier layer 256 are formed of at least one of Ti, Ta, W, TiN, TaN, WN, WCN, TiSiN, TaSiN, WsiN, or a combination thereof. According to embodiments, the conductive metal pattern 258 are formed of one of W, Cu, A Co, Mo, or Ru.

Figure 7B:
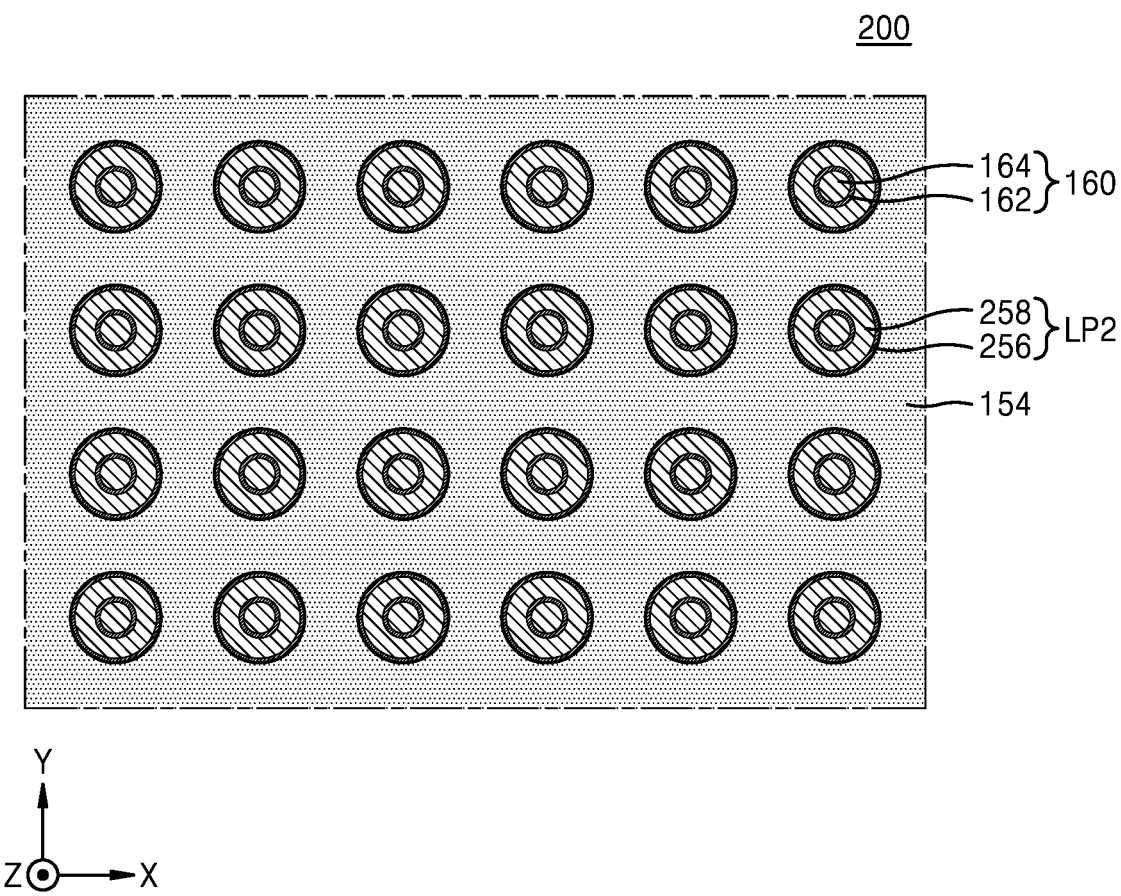
FIG. 7B is a plan view of components of an integrated circuit device illustrated in FIG. 7A.

FIG. 7B is a plan view of the non-metal conductive pattern 154, the plurality of conductive landing pads LP2, and the plurality of conductive contact plugs 160 in the integrated circuit device 200 of FIG. 7A, according to some embodiments.

Referring to FIG. 7B, in an embodiment, each of the plurality of conductive landing pads LP2 has a planar shape of an approximately circular island. The plurality of conductive landing pads LP2 and the plurality of conductive contact plugs 160 are arranged in a 1:1 correspondence, and one conductive contact plug 160 is arranged on one conductive landing pad LP2. However, embodiments of the inventive concept are not necessarily limited to the example of FIG. 7B. For example, in embodiments, the integrated circuit device 200 of FIG. 7A uses the conductive landing pads of FIGS. 5B, 5C, of 6A through 6E or conductive landing pads that have been modified and changed therefrom, instead of the conductive landing pads LP2.

The integrated circuit device 200 of FIG. 7A includes the non-metal conductive pattern 154 that includes a top surface having a plurality of recessed portions and protruding portions, and the conductive landing pads LP2 are disposed on the lower non-metal conductive portion 154A of the non-metal conductive pattern 154. Respective topmost surfaces of the conductive landing pads LP2 are coplanar with the topmost surface of the upper non-metal conductive portion 154B. For example, the conductive landing pads LP2 are buried in the non-metal conductive pattern 154. Therefore, resistance that may be caused by a reduced total volume of the non-metal conductive pattern 154 is addressed by using the conductive landing pads LP2.

The conductive contact plugs 160 that are electrically connected to the upper electrodes UE of the capacitors CP1 are disposed on the conductive landing pads LP2. The conductive landing pads LP2 serve as an etch stop layer in a process of forming contact holes for forming the conductive contact plugs 160. Therefore, the integrated circuit device 200 has a structure with a decreased total thickness of the non-metal conductive pattern 154 that suppresses aviation defects, and accordingly, aviation defects in the integrated circuit device 200 are minimized. In addition, even when the total thickness of the non-metal conductive pattern 154 in the integrated circuit device 200 is reduced, an increase in resistance in the upper electrodes UE and wiring structures connected thereto is prevented by including the conductive landing pads LP2.

Figure 8A:
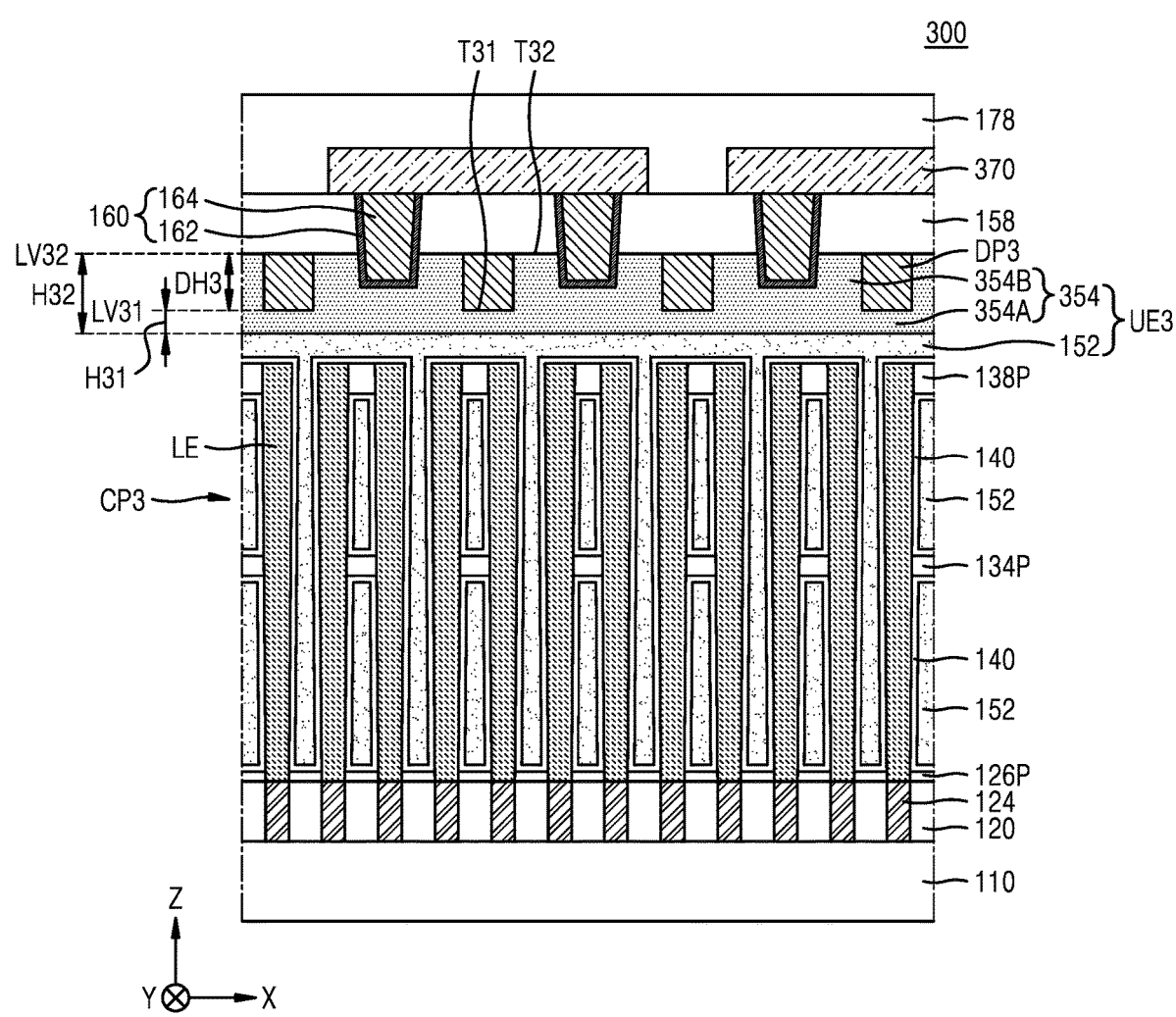
FIG. 8A is a cross-sectional view of an integrated circuit device according to embodiments of the inventive concept.

FIG. 8A is a cross-sectional view of an integrated circuit device 300 according to embodiments of the inventive concept. The components of the integrated circuit device 300 illustrated in FIG. 8A are a portion of the memory cell array 22A of the integrated circuit device 10 of FIGS. 1 through 3. The same reference numerals in FIG. 8A as those in FIG. 4 may denote the same elements, and thus redundant descriptions thereof may be omitted.

Referring to FIG. 8A, in an embodiment, the integrated circuit device 300 has a structure similar to that of the integrated circuit device 100 described above with reference to FIG. 4. However, the integrated circuit device 300 includes a plurality of capacitors CP3 instead of the plurality of capacitors CP1, and includes a conductive damascene pattern DP3 instead of the plurality of conductive landing pads LP.

The plurality of capacitors CP3 include a plurality of lower electrodes LE, a dielectric layer 140, and an upper electrode UE3 arranged on a Plurality of conductive regions 124. The upper electrode UE3 has a structure similar to that of the upper electrode UE described above with reference to FIG. 4. However, the upper electrode UE3 is a multi-layered structure that covers the plurality of lower electrodes LE on the dielectric layer 140, and the multi-layered structure includes a metal-containing conductive pattern 152 and a non-metal conductive pattern 354 that are sequentially stacked on the dielectric layer 140.

The non-metal conductive pattern 354 includes a bottom surface in contact with a top surface of the metal-containing conductive pattern 152, and a top surface that includes a plurality of recessed portions and a plurality of protruding portions that alternate in a square wave pattern. Top surfaces of the plurality of recessed portions in the non-metal conductive pattern 354 include a first top surface T31 at a first vertical level LV31 on the substrate 110, and top surfaces of the plurality of protruding portions include a second top surface T32 at a second vertical level LV32 that is farther from the substrate 110 than the first vertical level LV31. The first top surface T31 has a first height H31 in the vertical direction (Z direction) from a bottom surface of the non-metal conductive pattern 354, and the second top surface 132 has a second height H32 in the vertical direction (Z direction) from the bottom surface of the non-metal conductive pattern 354 that is greater than the first height H31.

According to embodiments, the non-metal conductive pattern 354 is a doped SiGe layer. For example, the non-metal conductive pattern 354 is a boron-doped SiGe layer.

The non-metal conductive pattern 354 includes a lower non-metal conductive portion 354A that faces the plurality of lower electrodes LE with the metal-containing conductive pattern 152 therebetween, and an upper non-metal conductive portion 354B that protrudes from the lower non-metal conductive portion 354A in a direction away from the substrate 110. A topmost surface of the lower non-metal conductive portion 354A corresponds to the first top surface T31, and a topmost surface of the upper non-metal conductive portion 354B corresponds to the second top surface T32. The lower non-metal conductive portion 354A and the upper non-metal conductive portion 354B are integrally connected to each other.

In the vertical direction (Z direction), a total thickness of the non-metal conductive pattern 354 corresponds to the second height H32, a thickness of the lower non-metal conductive portion 354A of the non-metal conductive pattern 354 corresponds to a first height H31, and a thickness of the upper non-metal conductive portion 354B of the non-metal conductive pattern 354 corresponds to a difference DH3 between the second height H32 and the first height H31. In the vertical direction (Z direction), a thickness of the upper non-metal conductive portion 354B is greater than that of the lower non-metal conductive portion 354A. For example, the difference DH3 between the second height H32 and the first height H31 is greater than the first height H31.

The conductive damascene pattern DP3 has a bottom surface in contact with the first top surface T31, which is the topmost surface of the lower non-metal conductive portion 354A, and a topmost surface that is coplanar with the second top surface T32, which is the topmost surface of the upper non-metal conductive portion 354B. A material of the conductive damascene pattern DP3 is substantially the same as a material of the conductive landing pads LP described above with reference to FIG. 4.

The plurality of conductive contact plugs 160 are arranged in the non-metal conductive pattern 354. Each of the plurality of conductive contact plugs 160 has a bottom surface that penetrates through the capping insulation layer 158 in the vertical direction (Z direction) and extends into the upper non-metal conductive portion 354B of the non-metal conductive pattern 354. A lower portion of each of the plurality of conductive contact plugs 160 is buried in and in contact with the non-metal conductive pattern 354. A vertical level of a lowest surface of each of the plurality of conductive contact plugs 160 is higher than the first vertical level LV31 and lower than the second vertical level LV32. The plurality of conductive contact plugs 160 are spaced apart from the conductive damascene pattern DP3 with a portion of the upper non-metal conductive portion 354B therebetween.

Figure 8B:
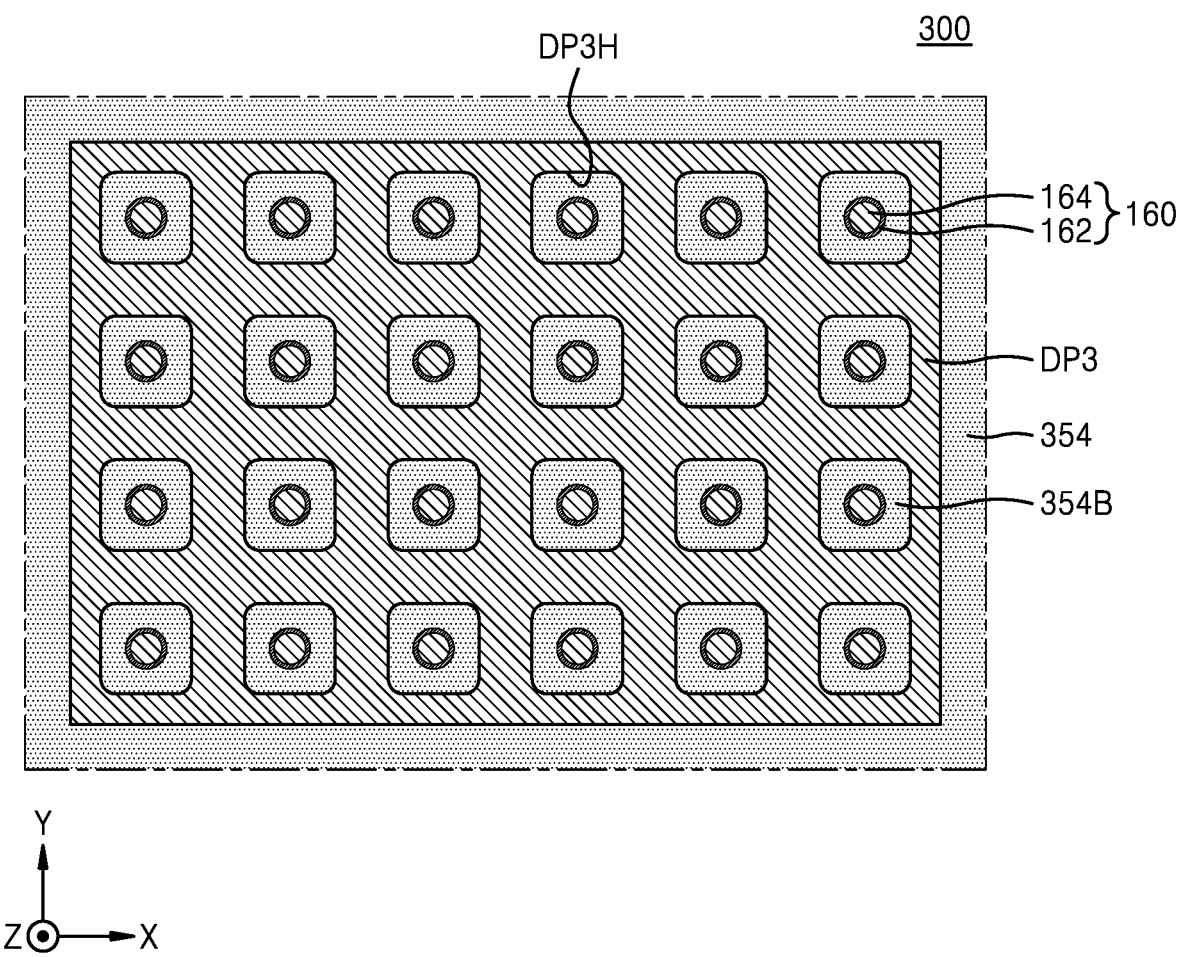
FIG. 8B is a plan view of an integrated circuit device illustrated in FIG. 8A.

FIG. 8B is a plan view of the non-metal conductive pattern 354, the conductive damascene pattern DP3, and the plurality of conductive contact plugs 160 in the integrated circuit device 300 of FIG. 8A, according to some embodiments.

Referring to FIG. 8B, in an embodiment, the conductive damascene pattern DP3 has a planar mesh shape that defines a plurality of openings DP3H. The upper non-metal conductive portion 354B are arranged in each of the plurality of openings DP3H in the conductive damascene pattern DP3. The plurality of openings DP3H in the conductive damascene pattern DP3 and the plurality of conductive contact plugs 1160 are arranged in a 1:1 correspondence, and one conductive contact plug 160 is disposed on one upper non-metal conductive portion 354B disposed in one of the plurality of openings DP3H. However, embodiments of the inventive concept are not necessarily limited to an example of FIG. 8B. For example, in embodiments, the planar shape of the conductive damascene pattern DP3 can be variously modified and changed within the scope of the technical spirit of the inventive concept.

Referring back to FIG. 8A, in an embodiment, an upper wiring layer 370 is disposed on the plurality of conductive contact plugs 160 and the capping insulation layer 158, and an interlayer insulation layer 178 that covers the upper wiring layer 370 and the capping insulation layer 158 is disposed on the upper wiring layer 370. A material of the upper wiring layer 370 is the same as a material of the upper electrode 170 described above with reference to FIG. 4.

Figure 8C:
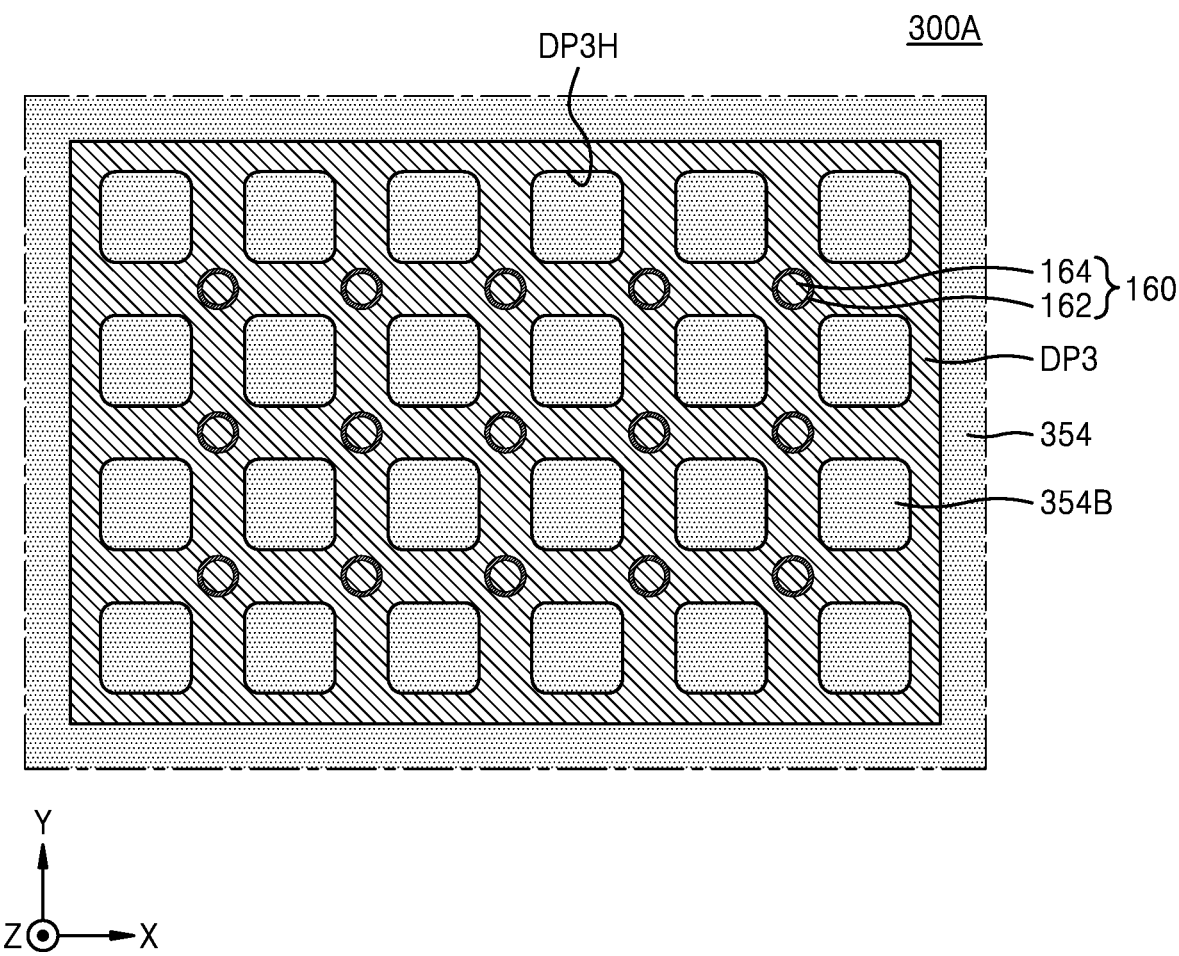
FIG. 8C is a plan view of an integrated circuit device according to embodiments of the inventive concept.

FIG. 8C is a plan view of an integrated circuit device 300A according to embodiments of the inventive concept. The components of the integrated circuit device 300A illustrated in FIG. 8C form a portion of the memory cell array 22A of the integrated circuit device 10 of FIGS. 1 through 3.

Referring to FIG. 8C, the integrated circuit device 300A has a structure similar to that of the integrated circuit device 300 described above with reference to FIGS. 8A and 8B. However, in the integrated circuit device 300A, the conductive contact plugs 160 are arranged on the conductive damascene pattern DP3. In the integrated circuit device 300A, the conductive contact plugs 160 are spaced apart from the non-metal conductive pattern 354 with a partial region of the conductive damascene pattern DP3 therebetween.

The integrated circuit devices 300 and 300A of FIGS. 8A through 8C include the non-metal conductive pattern 354 that have a top surface that includes a plurality of recessed portions and a plurality of protruding portions, the conductive damascene pattern DP3 is disposed on the lower non-metal conductive portion 354A of the non-metal conductive pattern 354, and the topmost surface of the conductive damascene pattern DP3 is coplanar with the second top surface T32, which is the topmost surface of the upper non-metal conductive portion 354B. For example, the conductive damascene pattern DP3 is buried in the non-metal conductive pattern 354. Therefore, in the integrated circuit devices 300 and 300A, aviation defects are minimized, similar to the effects described above of the integrated circuit device 100 of FIG. 4.

Figure 9A:
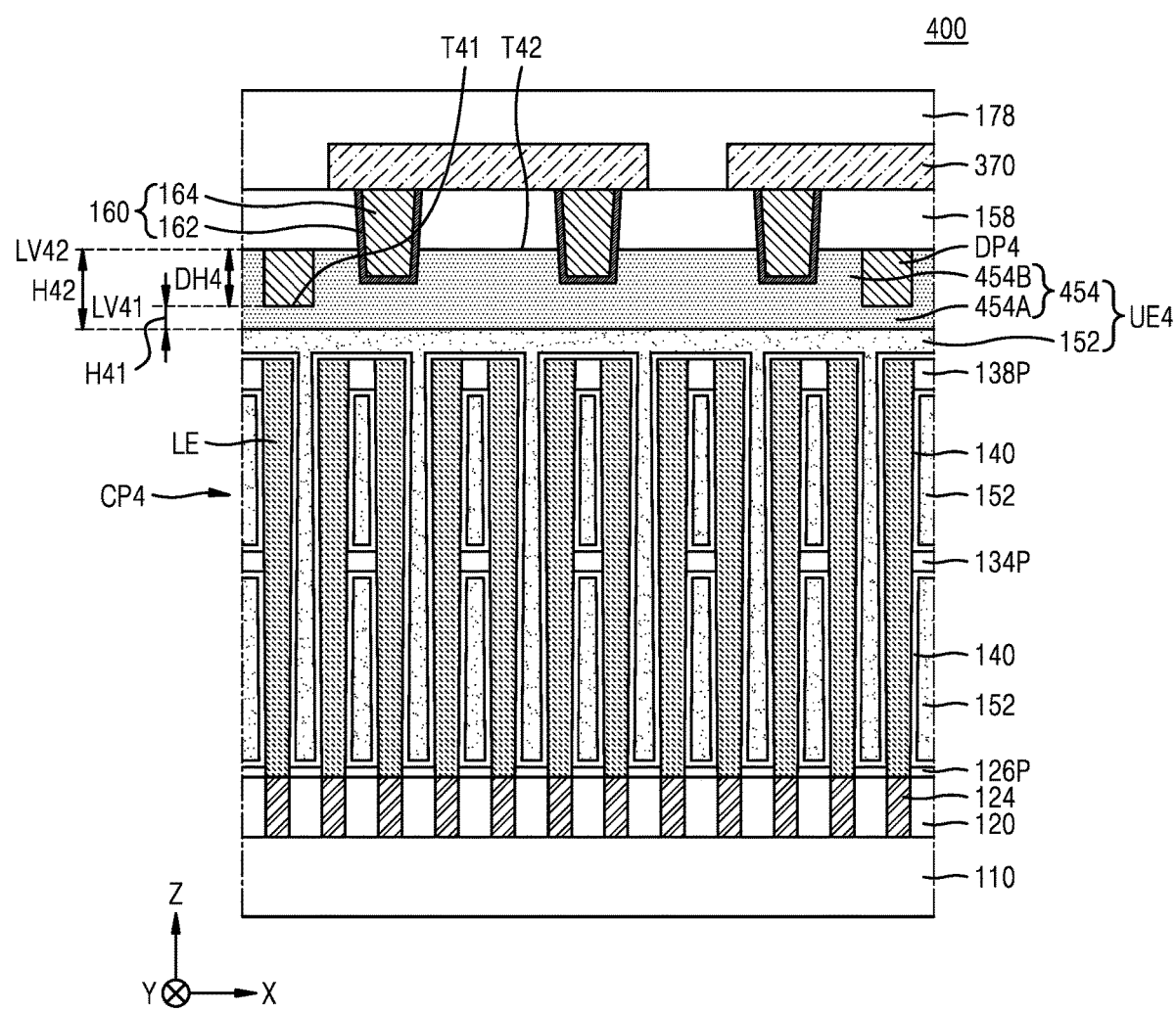
FIG. 9A is a cross-sectional view of an integrated circuit device according to embodiments of the inventive concept.

FIG. 9A is a cross-sectional view of an integrated circuit device 400 according to other embodiments of the inventive concept. The components of the integrated circuit device 400 illustrated in FIG. 9A form a portion of the memory cell array 22A of the integrated circuit device 10 of FIGS. 1 through 3. The same reference characters and numerals in FIG. 9A as those in FIGS. 4 and 8A may denote the same elements, and thus their redundant descriptions may be omitted herein.

Referring to FIG. 9A, in an embodiment, the integrated circuit device 400 has a structure similar to that of the integrated circuit device 300 described above with reference to FIG. 8A. However, the integrated circuit device 400 includes a plurality of capacitors CP4 instead of the plurality of capacitors CP3, and includes a conductive damascene pattern DP4 instead of the conductive damascene pattern DP3.

The plurality of capacitors CP4 include a plurality of lower electrodes LE, a dielectric layer 140, and an upper electrode UE4 arranged on a plurality of conductive regions 124. The upper electrode UE4 has a structure similar to that of the upper electrode UE3 described above with reference to FIG. 8A. However, the upper electrode UE4 includes a non-metal conductive pattern 454 instead of the non-metal conductive pattern 354.

The non-metal conductive pattern 454 includes a bottom surface in contact with a top surface of the metal-containing conductive pattern 152, and a top surface that includes a plurality of recessed portions and a plurality of protruding portions that alternate in a square wave pattern. Top surfaces of the plurality of recessed portions in the non-metal conductive pattern 454 include a first top surface T41 at a first vertical level LV41 on the substrate 110, and top surfaces of the plurality of protruding portions include a second top surface 142 at a second vertical level LV42 that is farther from the substrate 110 than the first vertical level LV41. The first top surface T41 has a first height H41 in the vertical direction (Z direction) from a bottom surface of the non-metal conductive pattern 454, and the second top surface T42 has a second height H42 in the vertical direction (Z direction) from the bottom surface of the non-metal conductive pattern 454 that is greater than the first height H41.

According to embodiments, the non-metal conductive pattern 454 is a doped SiGe layer. For example, the non-metal conductive pattern 454 is a boron-doped SiGe layer.

The non-metal conductive pattern 454 includes a lower non-metal conductive portion 454A that faces the plurality of lower electrodes LE with the metal-containing conductive pattern 152 therebetween, and an upper non-metal conductive portion 454B that protrudes from the lower non-metal conductive portion 454A in a direction away from the substrate 110. A topmost surface of the lower non-metal conductive portion 454A corresponds to the first top surface T41, and a topmost surface of the upper non-metal conductive portion 454B corresponds to the second top surface T42. The lower non-metal conductive portion 454A and the upper non-metal conductive portion 454B are integrally connected to each other.

In the vertical direction (Z direction), a total thickness of the non-metal conductive pattern 454 corresponds to the second height H42 a thickness of the lower non-metal conductive portion 454A of the non-metal conductive pattern 454 corresponds to the first height H41, and a thickness of the upper non-metal conductive portion 454B of the non-metal conductive pattern 454 corresponds to a difference DH4 between the second height H42 and the first height H41. In the vertical direction (Z direction), a thickness of the upper non-metal conductive portion 454B is greater than that of the lower non-metal conductive portion 454A. For example, the difference DH4 between the second height H42 and the first height H41 is greater than the first height H41.

The conductive damascene pattern DP4 have a bottom surface in contact with the first top surface T41, which is the topmost surface of the lower non-metal conductive portion 454A, and a topmost surface that is coplanar with the second top surface T42, which is the topmost surface of the upper non-metal conductive portion 454B. A material of the conductive damascene pattern DP4 is substantially the same as a material of the conductive landing pads LP described above with reference to FIG. 4.

The plurality of conductive contact plugs 160 are arranged on the non-metal conductive pattern 454. Each of the plurality of conductive contact plugs 160 penetrates through the capping insulation layer 158 in the vertical direction (Z direction) and extends into the upper non-metal conductive portion 454B of the non-metal conductive pattern 454. A lower portion of each of the plurality of conductive contact plugs 160 is in contact with a portion of the non-metal conductive pattern 454. A vertical level of a lowest surface of each of the plurality of conductive contact plugs 160 is higher than the first vertical level. LV41 and lower than the second vertical level LV42. The plurality of conductive contact plugs 160 are spaced apart from the conductive damascene pattern DP4 with a portion of the upper non-metal conductive portion 454B therebetween.

Figure 9B:
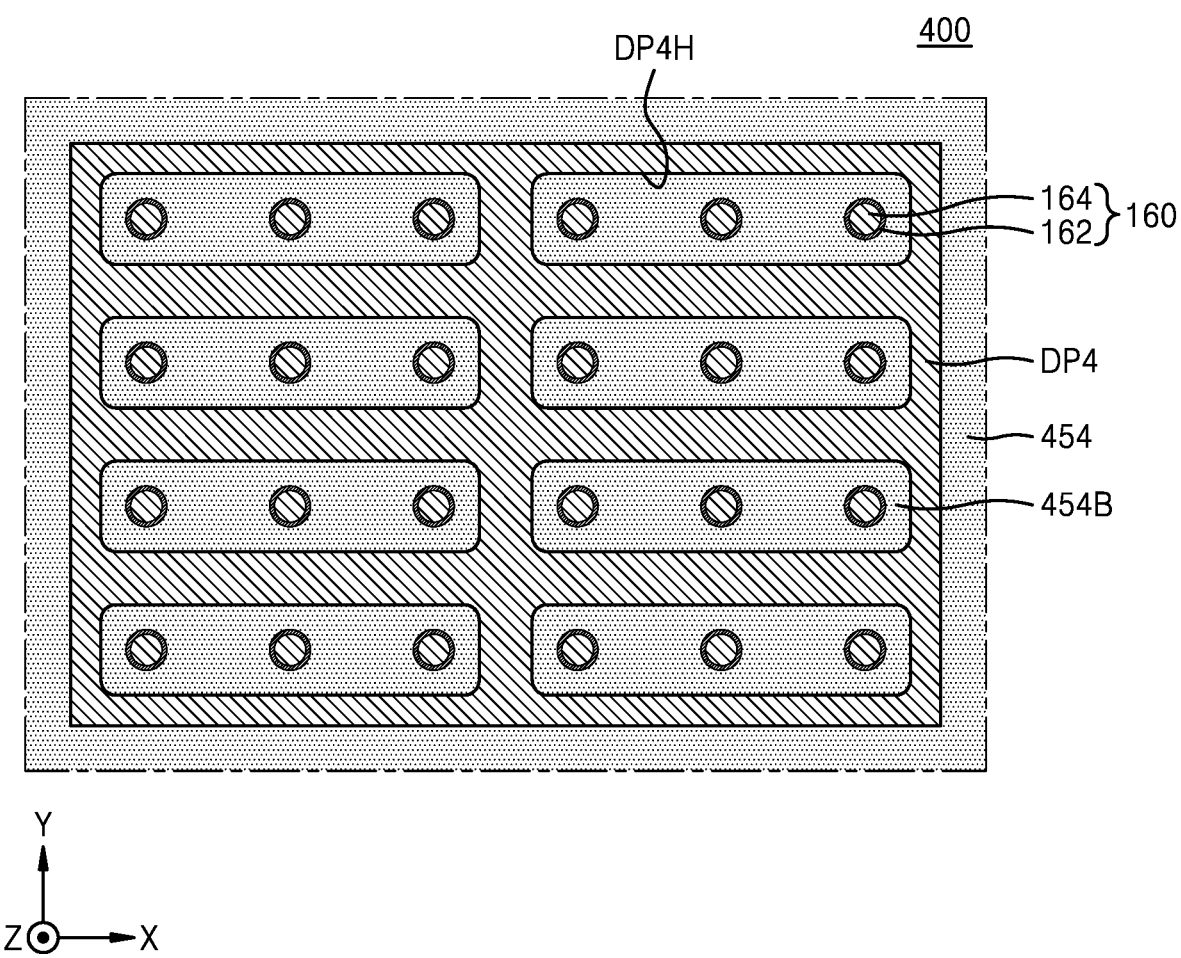
FIG. 9B is a plan view of an integrated circuit device illustrated in FIG. 9A.

FIG. 9B is a plan view of the non-metal conductive pattern 454, the conductive damascene pattern DP4, and the plurality of conductive contact plugs 160 in the integrated circuit device 400 of FIG. 9A, according to some embodiments.

Referring to FIG. 9B, in an embodiment, the conductive damascene pattern DP4 has a planar mesh shape that defines a plurality of openings DP4H. The upper non-metal conductive portion 454B is arranged in each of the plurality of openings DP4H in the conductive damascene pattern DP4.

Each of the plurality of openings DP4H in the conductive damascene pattern DP4 has a length in the first horizontal direction (X direction) and a width in the second horizontal direction (Y direction), and the length is greater than the width. However, the planar shape of each of the plurality of openings DP4H is not necessarily limited to that illustrated in FIG. 9B, and in embodiments, the planar shape of each of the plurality of openings DP4H is variously selected as needed.

Some of the plurality of conductive contact plugs 160 are arranged within one of the plurality of openings DP4H in the conductive damascene pattern DP4. Each of the plurality of conductive contact plugs 160 arranged in one opening DP4H has a bottom surface in contact with one upper non-metal conductive portion 454B in the one opening DP4H. FIGS. 9A and 9B illustrate an embodiment in which three conductive contact plugs 160 are disposed in one opening DP4H but embodiments of the inventive concept are not necessarily limited to those shown in FIGS. 9A and 9B. In embodiments, the number of conductive contact plugs 160 in one opening DP4H is variously selected as needed.

Figure 9C:
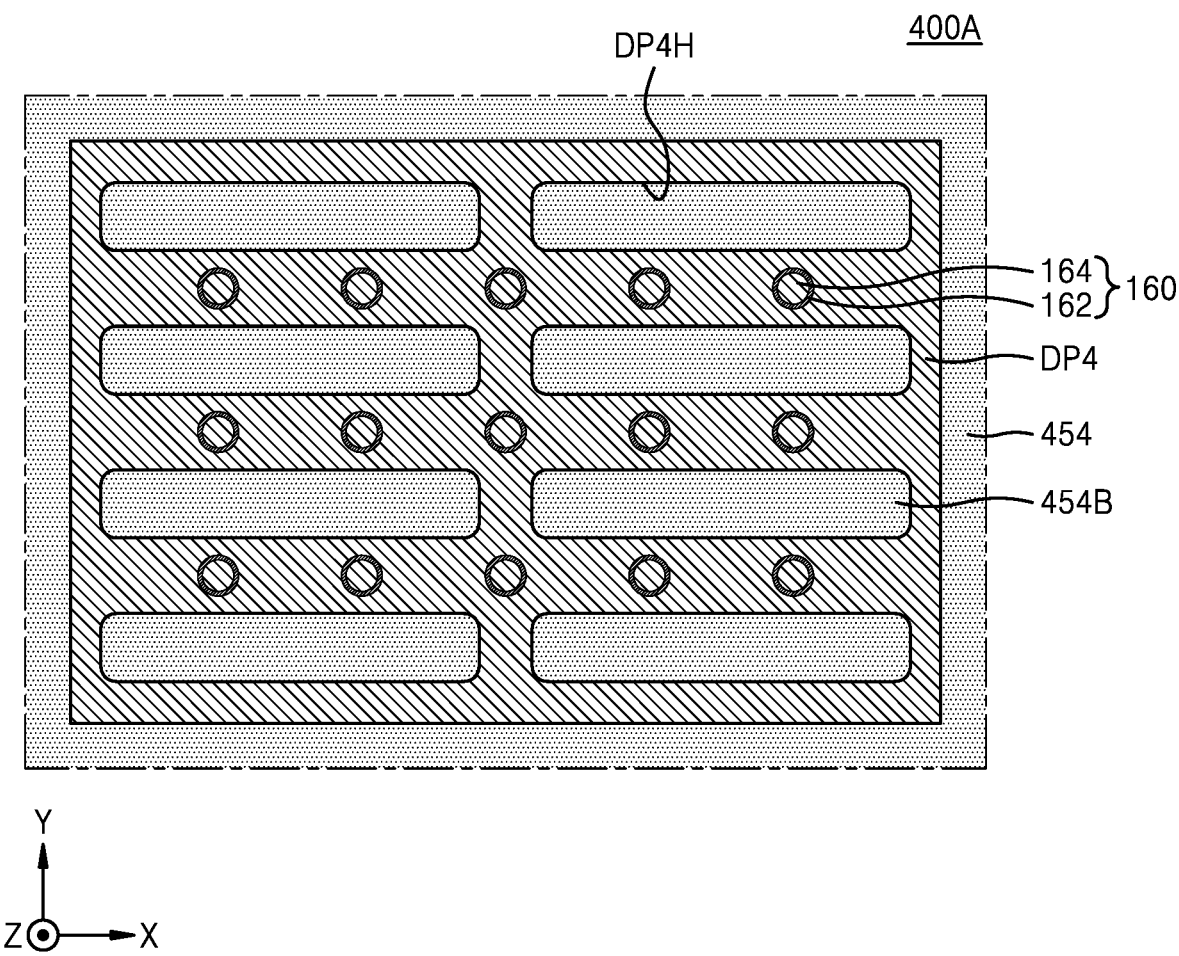
FIG. 9C is a plan view of an integrated circuit device according to embodiments of the inventive concept.

FIG. 9C is a plan view of an integrated circuit device 400A according to embodiments of the inventive concept. The components of the integrated circuit device 400A illustrated in FIG. 9C form a portion of the memory cell array 22A of the integrated circuit device 10 of FIGS. 1 through 3.

Referring to FIG. 9C, in an embodiment, the integrated circuit device 400A has a structure similar to that of the integrated circuit device 400 described above with reference to FIGS. 9A and 9B. However, in the integrated circuit device 400A, the conductive contact plugs 160 are arranged in the conductive damascene pattern DP4. In the integrated circuit device 400A, the conductive contact plugs 160 are spaced apart from the non-metal conductive pattern 454 with a partial region of the conductive damascene pattern DP4 therebetween.

The integrated circuit devices 400 and 400A of FIGS. 9A through 9C include the non-metal conductive pattern 454 that have a top surface that includes a plurality of recessed portions and a plurality of protruding portions, the conductive damascene pattern DP4 are disposed on the lower non-metal conductive portion 454A of the non-metal conductive pattern 454, and the topmost surface of the conductive damascene pattern DP4 is coplanar with the second top surface T42, which is the topmost surface of the upper non-metal conductive portion 454B. For example, the conductive damascene pattern DP4 is buried in the non-metal conductive pattern 454. Therefore, in the integrated circuit devices 400 and 400A, aviation defects are minimized, similar to the above-described effects of the integrated circuit device 100 of FIG. 4.

Figure 10:
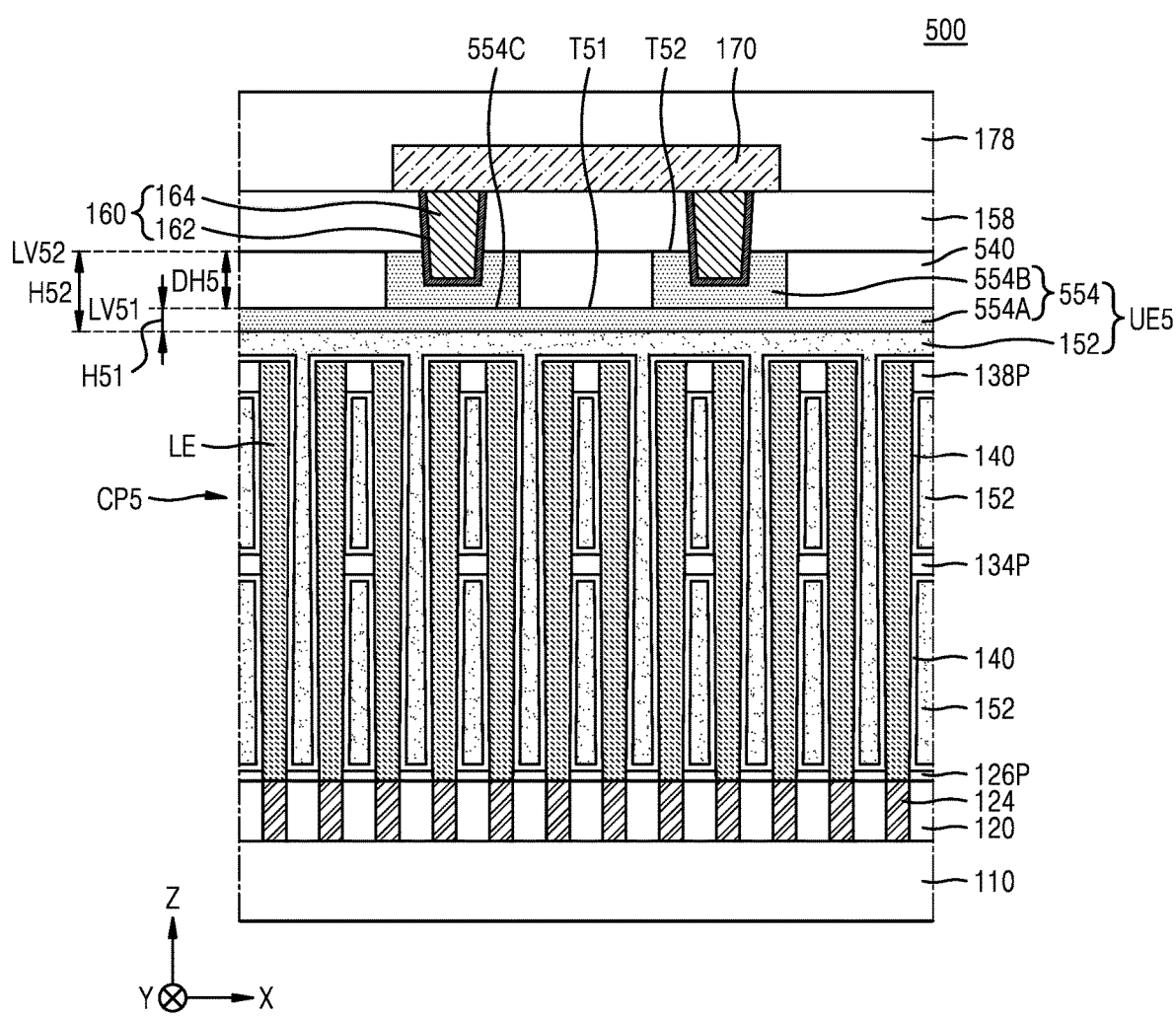
FIG. 10 is a cross-sectional view of an integrated circuit device according to embodiments of the inventive concept.

FIG. 10 is a cross-sectional view of an integrated circuit device 500 according to embodiments of the inventive concept. The same reference numerals in FIG. 10 as those in FIG. 4 may denote the same elements, and thus redundant descriptions thereof may be omitted.

Referring to FIG. 10, in an embodiment, the integrated circuit device 500 has a structure similar to that of the integrated circuit device 100 described above with reference to FIG. 4. However, the integrated circuit device 500 includes a plurality of capacitors CP5 instead of the plurality of capacitors CP1, and does not include the plurality of conductive landing pads LP.

The plurality of capacitors CP5 include a plurality of lower electrodes LE, a dielectric layer 140, and an upper electrode UE5 arranged on a plurality of conductive regions 124. The upper electrode UE5 is a multi-layered structure that covers the plurality of lower electrodes LE on the dielectric layer 140, and the multi-layered structure includes a metal-containing conductive pattern 152 and a non-metal conductive pattern 554 sequentially stacked on the dielectric layer 140.

The non-metal conductive pattern 554 includes a bottom surface in contact with a top surface of the metal-containing conductive pattern 152, and a top surface that includes a plurality of recessed portions and a plurality of protruding portions that alternate in a square wave pattern. Top surfaces of the plurality of recessed portions in the non-metal conductive pattern 554 include a first top surface T51 at a first vertical level LV51 on the substrate 110, and top surfaces of the plurality of protruding portions include a second top surface T52 at a second vertical level LV52 that is farther from the substrate 110 than the first vertical level LV51. The first top surface T51 has a first height H51 in the vertical direction (Z direction) from a bottom surface of the non-metal conductive pattern 554, and the second top surface T52 has a second height H52 in the vertical direction (Z direction) from the bottom surface of the non-metal conductive pattern 554 that is greater than the first height H51.

According to embodiments, the non-metal conductive pattern 554 is a doped SiGe layer. For example, the non-metal conductive pattern 554 is a boron-doped SiGe layer.

The non-metal conductive pattern 554 includes a lower non-metal conductive portion 554A that faces the plurality of lower electrodes LE with the metal-containing conductive pattern 152 therebetween, and an upper non-metal conductive portion 554B that protrudes from the lower non-metal conductive portion 554A in a direction away from the substrate 110. A topmost surface of the lower non-metal conductive portion 554A corresponds to the first top surface T51, and a topmost surface of the upper non-metal conductive portion 554B corresponds to the second top surface T52. The lower non-metal conductive portion 554A and the upper non-metal conductive portion 554B are formed in separate processes. Accordingly, a contact interface 554C is present between the first top surface T51 of the lower non-metal conductive portion 554A and the bottom surface of the upper non-metal conductive portion 554B.

In the vertical direction (Z direction), a total thickness of the non-metal conductive pattern 554 corresponds to the second height H52, a thickness of the lower non-metal conductive portion 554A of the non-metal conductive pattern 554 corresponds to the first height H51, and a thickness of the upper non-metal conductive portion 554B of the non-metal conductive pattern 554 corresponds to a difference DH5 between the second height H52 and the first height 1151. In the vertical direction (Z direction), a thickness of the upper non-metal conductive portion 554B is greater than that of the lower non-metal conductive portion 554A. For example, the difference DH5 between the second height H52 and the first height H51 is greater than the first height H51.

According to embodiments, the upper non-metal conductive portion 554B has one of a substantially circular or substantially polygonal island planar shape, a bar planar shape, or a mesh-type planar shape that forms a plurality of openings.

An insulation pattern 540 is disposed on the lower non-metal conductive portion 554A of the non-metal conductive pattern 554. The insulation pattern 540 has a bottom surface in contact with the first top surface T51, which is the topmost surface of the lower non-metal conductive portion 554A, and a topmost surface that is coplanar with the second top surface T52, which is the topmost surface of the upper non-metal conductive portion 554B. The insulation pattern 540 is an insulative damascene pattern formed using a damascene process. In the present specification, the insulation pattern 540 may be referred to as an insulative damascene pattern. According to embodiments, the insulation pattern 540 is a silicon oxide layer. For example, the insulation pattern 540 is formed of a silicon oxide-based material such as plasma enhanced oxide (PEOX), tetraethyl orthosilicate (TEOS), born TEOS (BTEOS), phospho FEOS (PTEOS), boro phospho TEOS (BPTEOS), born silicate glass (BSG), phospho silicate glass (PSG), or bow phospho silicate glass (BPSG).

The non-metal conductive pattern 554 and the insulation pattern 540 are covered with the capping insulation layer 158. The second top surface T52 of the non-metal conductive pattern 554 and a topmost surface of the insulation pattern 540 are in contact with the bottom surface of the capping insulation layer 158.

The plurality of conductive contact plugs 160 are arranged on the non-metal conductive pattern 554. Each of the plurality of conductive contact plugs 160 penetrates through the capping insulation layer 158 in the vertical direction (Z direction) and extends into the upper non-metal conductive portion 554B of the non-metal conductive pattern 554. A lower portion of each of the plurality of conductive contact plugs 160 is in contact with the upper non-metal conductive portion 554B. A vertical level of a lowest surface of each of the plurality of conductive contact plugs 160 is higher than the first vertical level LV51 and lower than the second vertical level LV52. The plurality of conductive contact plugs 160 are spaced apart from the insulation pattern 540 and the lower non-metal conductive portion 554A with a portion of the upper non-metal conductive portion 554B therebetween.

The integrated circuit device 500 of FIG. 10 includes the non-metal conductive pattern 554 that has a top surface that includes a plurality of recessed portions and a plurality of protruding portions, and includes the relatively thin lower non-metal conductive portion 554A due to the plurality of recessed portions, which reduces the total volume of the non-metal conductive pattern 554. Thus, the generation of aviation defects is minimized when the non-metal conductive pattern 554 is formed as a boron-doped SiGe layer.

A method of manufacturing an integrated circuit device according to embodiments of the inventive concept will now be described.

FIGS. 11A through 11L are cross-sectional views that illustrate a method of manufacturing an integrated circuit device according to embodiments of the inventive concept. A method of manufacturing; the integrated circuit device 100 of FIG. 4 will now be described with reference to FIGS. 11A through 11L. The same reference characters and numerals in FIGS. 11A through 11L as those in FIG. 4 may denote the same elements, and thus their redundant descriptions may be omitted herein.

Figure 11A:
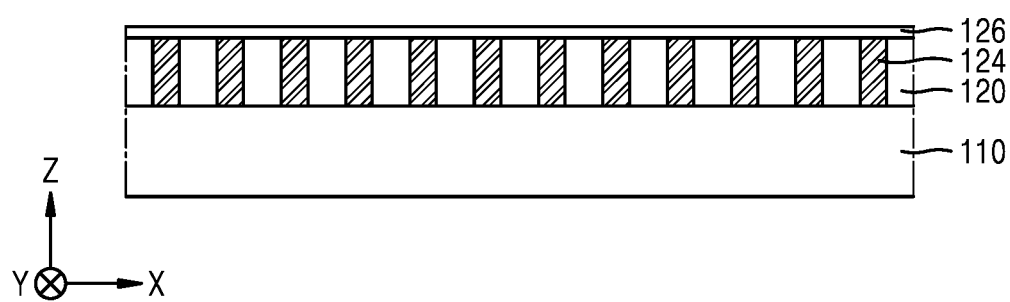
FIGS. 11A through 11L are cross-sectional views that illustrate a method of manufacturing an integrated circuit device, according to embodiments of the inventive concept.

Referring to FIG. 11A, in an embodiment, the lower structure 120, and the conductive regions 124 that penetrate through the lower structure 120 and connect to the active area AC, are formed on the substrate 110. Thereafter, an insulation layer 126 is formed that covers the lower structure 120 and the conductive region 124.

The insulation layer 126 is used as an etch stop layer in a subsequent process. The insulation layer 126 is formed of an insulating material that has an etch selectivity with respect to the lower structure 120. According to embodiments, the insulation layer 126 is one of a silicon nitride (SiN) layer, a silicon carbonitride (SiCN) layer, a silicon boron nitride (SiBN) layer, or a combination thereof.

Figure 11B:
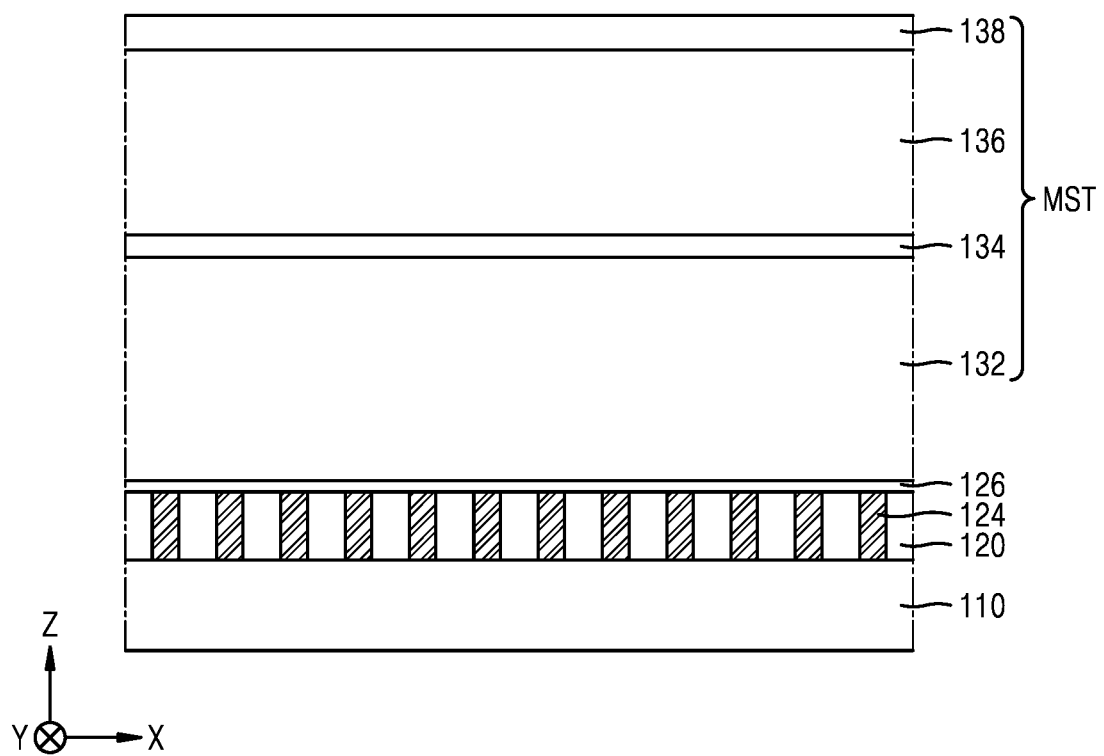

Referring to FIG. 11B, in an embodiment, a mold structure MST is formed on the insulation layer 126.

The mold structure MST includes a plurality of mold layers and a plurality of support layers. For example, the mold structure MST includes a first mold layer 132, a lower support layer 134, a second mold layer 136, and an upper support layer 138 that are sequentially stacked on the insulation layer 126. The stacking order of the mold structure MST is not necessarily limited to that illustrated in FIG. 11B, and various modifications and changes are possible within the scope of embed intents of the inventive concept.

Each of the first mold layer 132 and the second mold layer 136 is formed of a material that has a relatively high etch rate with respect to an etchant that contains ammonium fluoride ($NH_4F$), hydrofluoric acid (HF), and water, and is thus removable by a lift-off process due to the etchant. According to embodiments, each of the first and second mold layers 132 and 136 is one of an oxide layer, a nitride layer, or a combination thereof.

Each of the lower support layer 134 and the upper support layer 138 is one of a silicon nitride (SiN) layer, a silicon carbonitride (SiCN) layer, a silicon boron nitride (SiBN) layer, or a combination thereof. According to embodiments, the lower support layer 134 and the upper support layer 138 are formed of the same materials as each other. According to other embodiments, the lower support layer 134 and the upper support layer 138 are formed of materials that differ from each other.

Figure 11C:
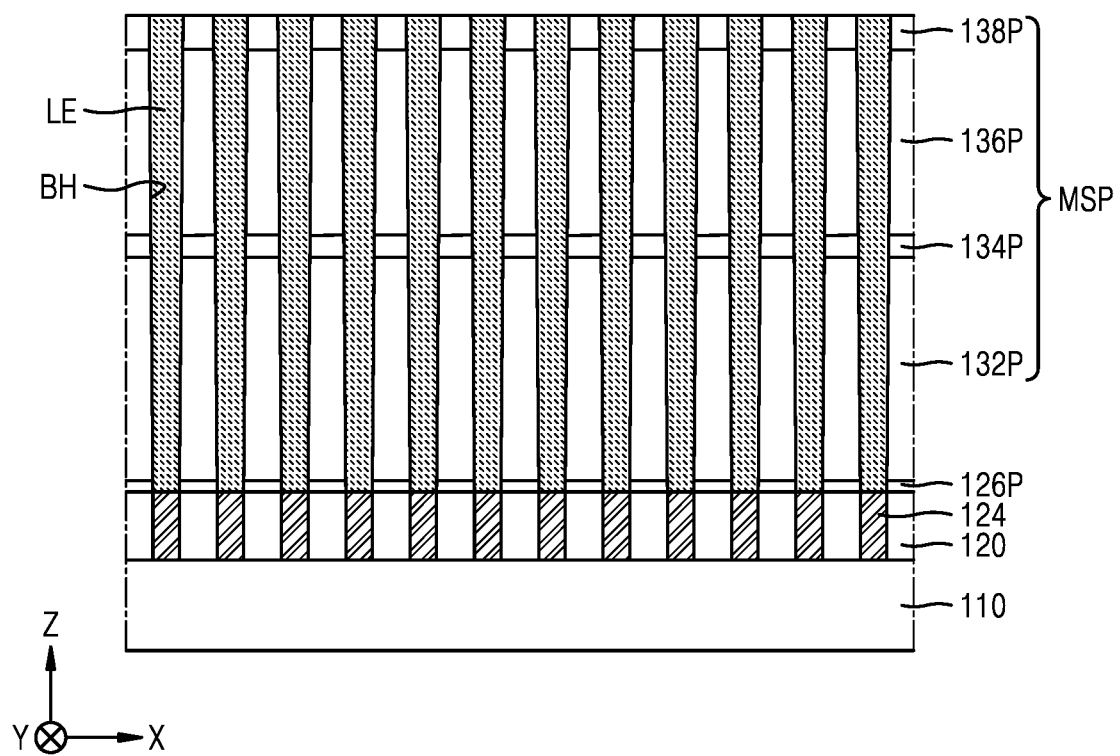

Referring to FIG. 11C, in an embodiment, after a mask pattern is formed on the mold structure MST of FIG. 11B, the mold structure MST is anisotropically etched using the mask pattern as an etch mask and using the insulation layer 126 as an etch stop layer to thereby form a mold structure pattern MSP that includes a plurality of holes BH.

The mold structure pattern MSP includes a first mold pattern 132P, the lower support pattern 334P, a second mold pattern 136P, and the upper support pattern 138P. A portion of the insulation layer 126 exposed through the plurality of holes BH is etched due to over-etching while forming the plurality of holes BH, and thus the insulation pattern 126P is formed from the insulation layer 126, and the conductive region 124 is exposed through the plurality of holes BH.

The plurality of lower electrodes LE are formed that fill the plurality of holes BH. According to embodiments, the plurality of lower electrodes LE are formed by forming a conductive layer that covers the top surface of the upper support pattern 138P while filling the plurality of holes BH. An ALD process is used to form the conductive layer. The top surface of the upper support pattern 138P is exposed by removing a portion of the conductive layer by using an etchback process or chemical mechanical polishing (CMP) process.

Figure 11D:
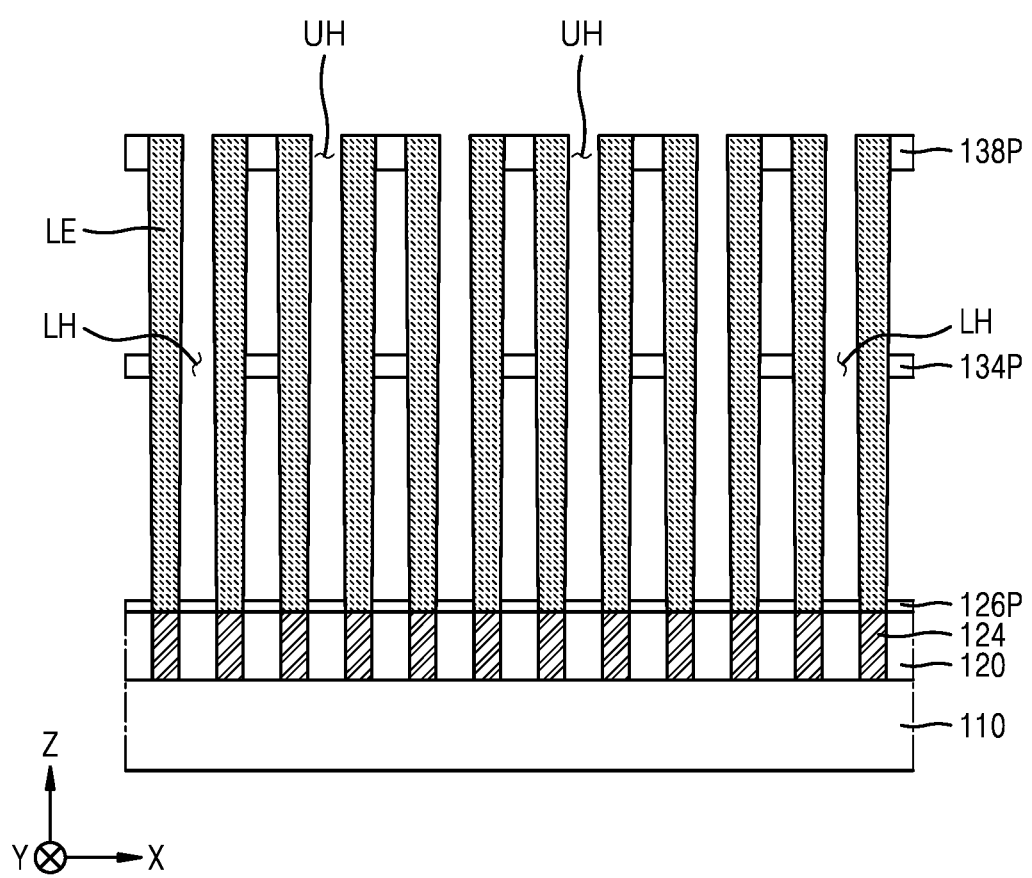

Referring to FIG. 11D, in an embodiment, a plurality of upper holes UH are formed by removing a portion of the upper support pattern 138P of FIG. 11C, and the second mold pattern 136P is wet removed through the plurality of upper holes UH. A plurality of lower holes LH are formed by removing a portion of the lower support pattern 134P exposed through the plurality of upper holes UH, and the top surface of the insulation pattern 126P is exposed by wet-removing the first mold pattern 132P through the plurality of lower holes LH. After the first mold pattern 132P and the second mold pattern 136P are removed, respective sidewalls of the plurality of lower electrodes LE may be exposed.

According to embodiments, the second mold pattern 136P and the first mold pattern 132P are wet removed by using, for example, an etchant that includes ammonium fluoride ($NH_4F$), hydrofluoric acid (HF), and water.

Figure 11E:
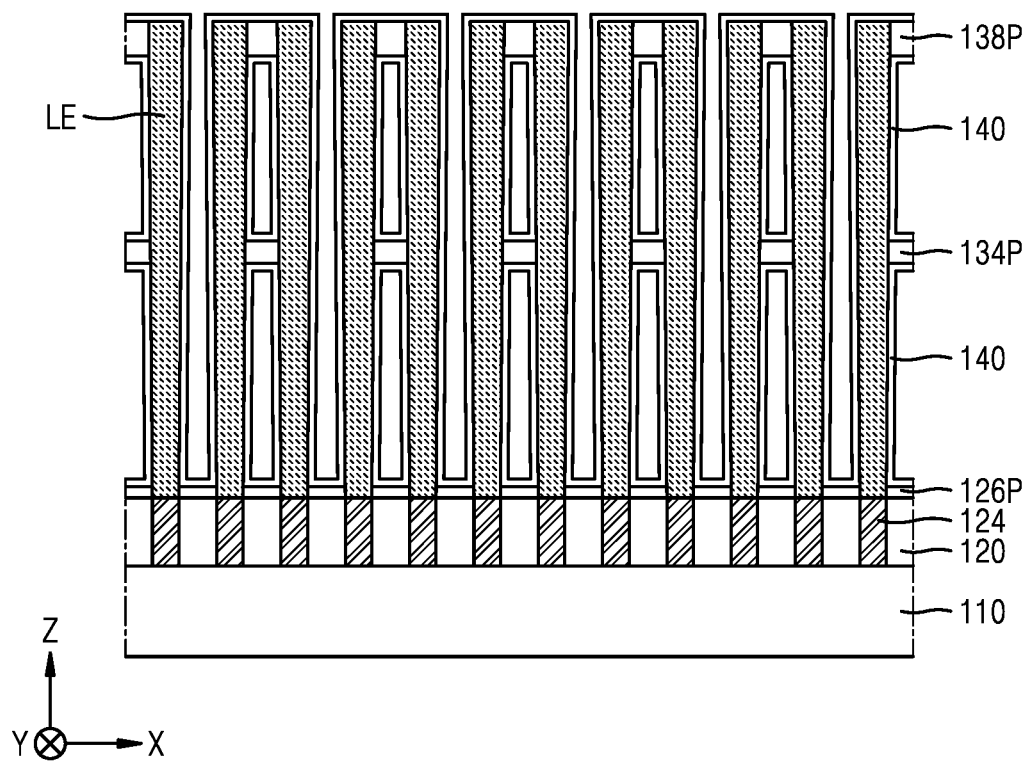

Referring, to FIG. 11E, in an embodiment, the dielectric layer 140 is formed that covers exposed surfaces of a resultant structure of FIG. 11D. An ALD process is used to form the dielectric layer 140.

Figure 11F:
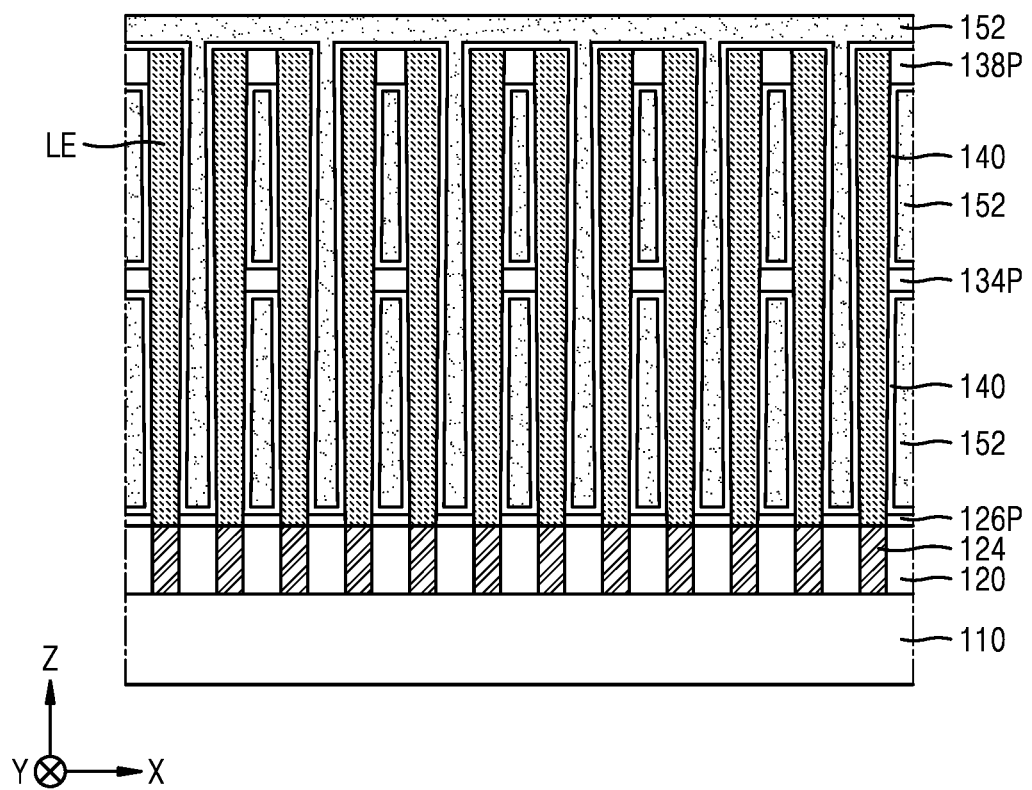

Referring to FIG. 11F, in an embodiment, the metal-containing conductive pattern 152 is formed that covers the dielectric layer 140 of FIG. 11E. The metal-containing conductive pattern 152 fills a space between the plurality of lower electrodes LE on the dielectric layer 140, and covers respective top surfaces of the plurality of lower electrodes LE. According to embodiments, the metal-containing conductive pattern 152 is formed by one of a CVD process, a metal organic CVD (MOCVD) process, a physical vapor deposition (PVL)) process, or an ALD process.

Figure 11G:
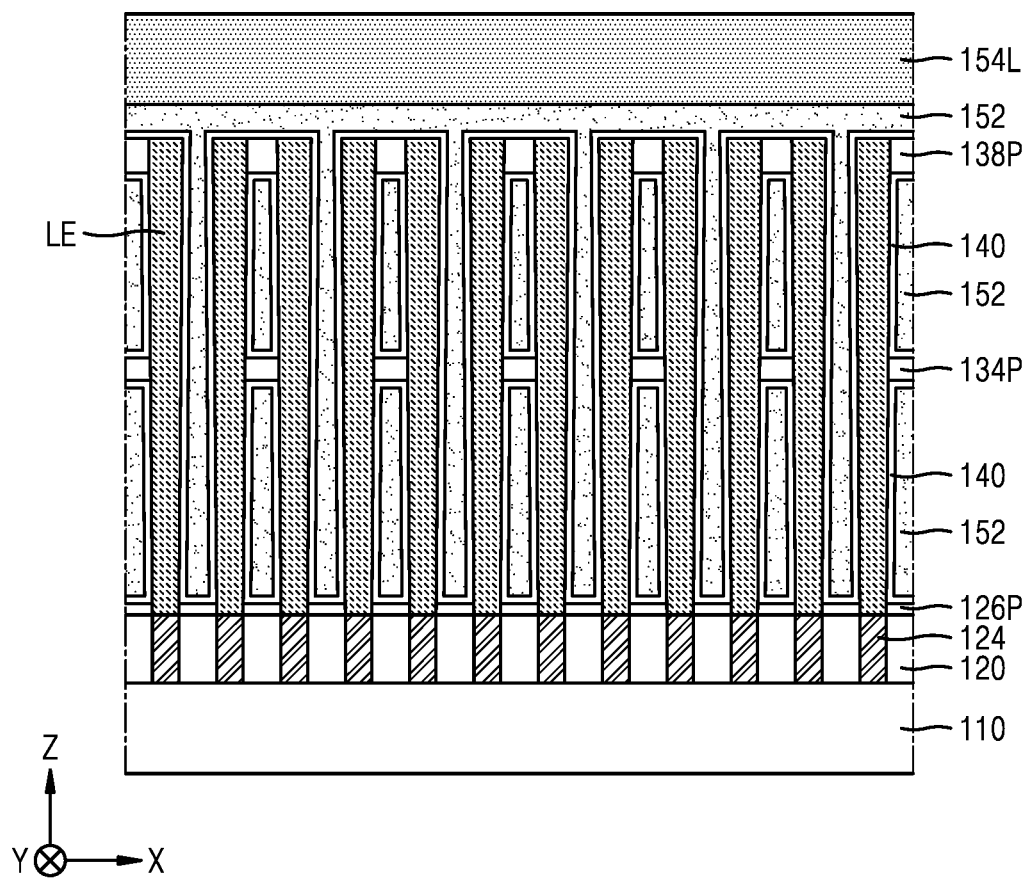

Referring to FIG. 11G, in an embodiment, a non-metal conductive layer 154L is formed on the metal-containing conductive pattern 152, and a top surface of the non-metal conductive layer 154L is planarized using a CMP process.

According to embodiments, the non-metal conductive layer 154L is a doped SiGe layer. For example, in an embodiment, the non-metal conductive layer 154L is a boron-doped Site layer. While the top surface of the non-metal conductive layer 154L is being planarized by a CMP process, byproducts and/or particles remain on the non-metal conductive layer 154L after the non-metal conductive layer 154L is formed, and defects in the top surface of the non-metal conductive layer 154L after the non-metal conductive layer 154L is formed. Accordingly, particles and/or defects are removed from the non-metal conductive layer 154L, thereby increasing conductivity.

Figure 11H:
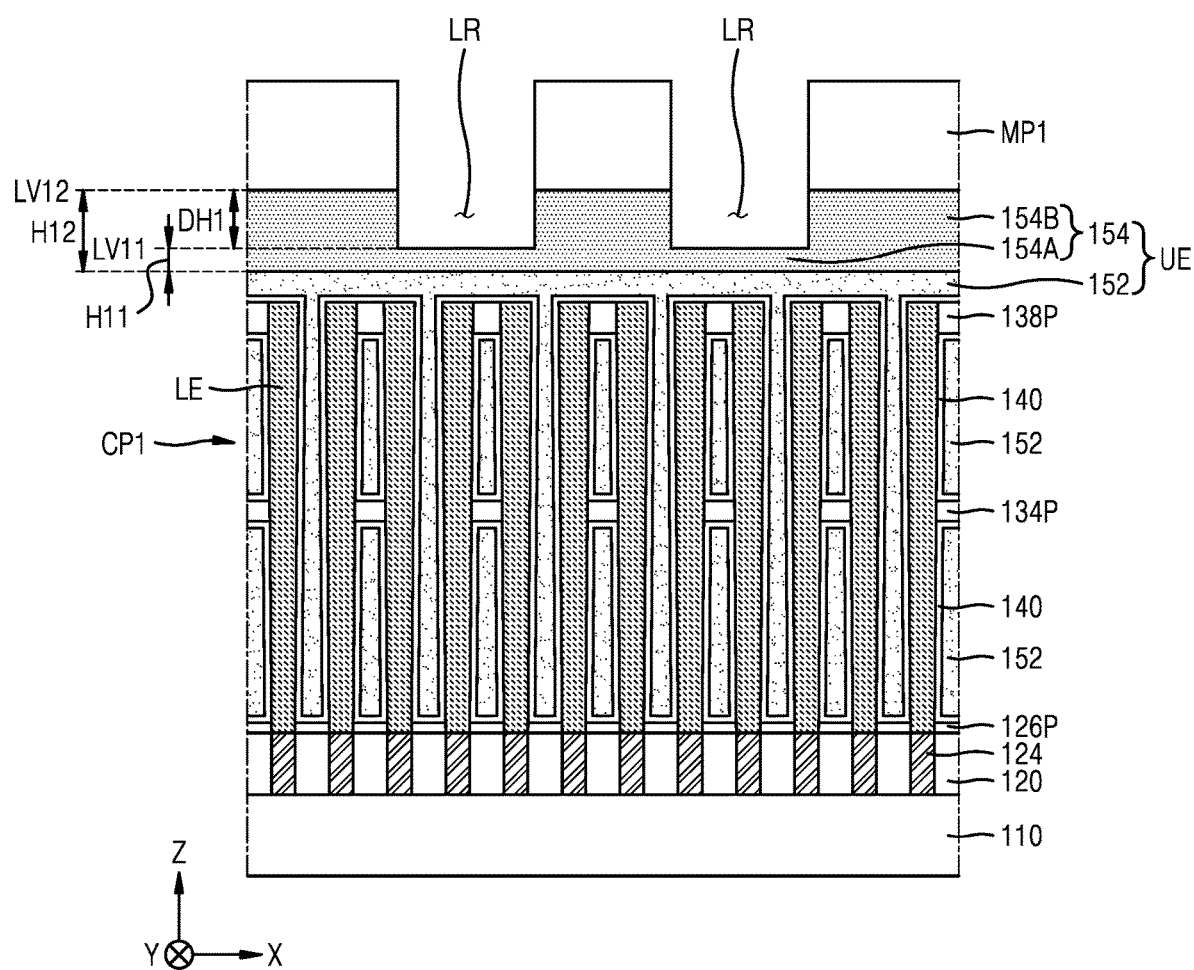

Referring to FIG. 11H, in an embodiment, a mask pattern MP1 is formed on a resultant structure of FIG. 11G, and the non-metal conductive layer 154L is anisotropically etched using the mask pattern MP1 as an etch mask to form the non-metal conductive pattern 154 that has a top surface that includes the plurality of recessed portions and the plurality of protruding portions. The non-metal conductive pattern 154 include the lower non-metal conductive portion 154A and the upper non-metal conductive portion 154B. According to embodiments, the mask pattern MP1 may be, but is not limited to, a photoresist pattern.

After the non-metal conductive pattern 154 is formed, a plurality of landing regions LR whose horizontal widths are defined by the upper non-metal conductive portion 154B are formed on the lower non-metal conductive portion 154A. A height of the plurality of landing regions LR in the vertical direction (Z direction) on the lower non-metal conductive portion 154A corresponds to the difference DH1 between the second height H12 and the first height H11. The height of the plurality of landing regions LR in the vertical direction (Z direction) is greater than the thickness of the lower non-metal conductive portion 154A.

Figure 11I:
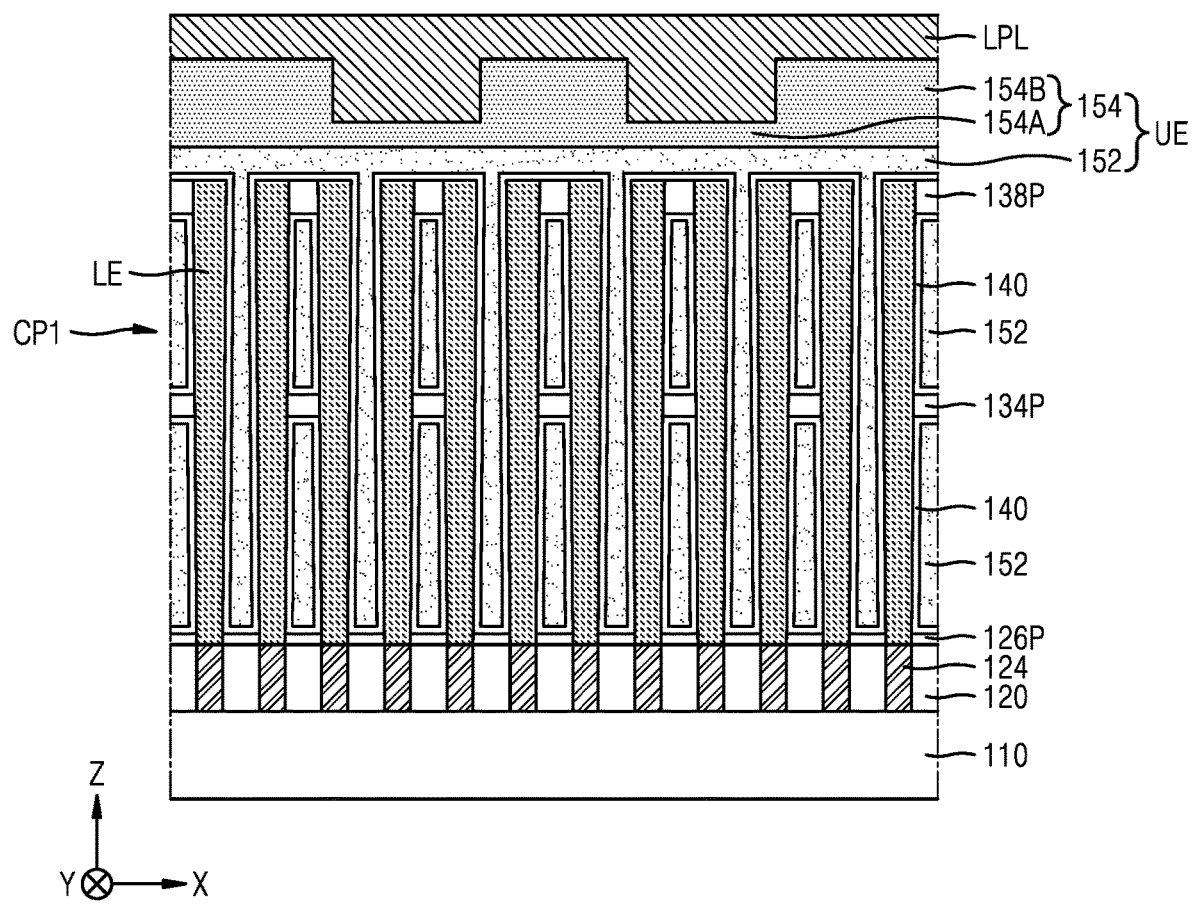

Referring to FIG. 11I, in an embodiment, after the mask pattern MP1 is removed from a resultant structure of FIG. 11H, a conductive landing layer LPL is formed that fills the plurality of landing regions LR and covers the top surface of the upper non-metal conductive portion 154B. The conductive landing layer LPL is formed of but is not limited to, at least one of W, Cu, Al, Co, Mo, Ru, Ti, Ta, TiN, TaN, or a combination thereof.

Figure 11J:
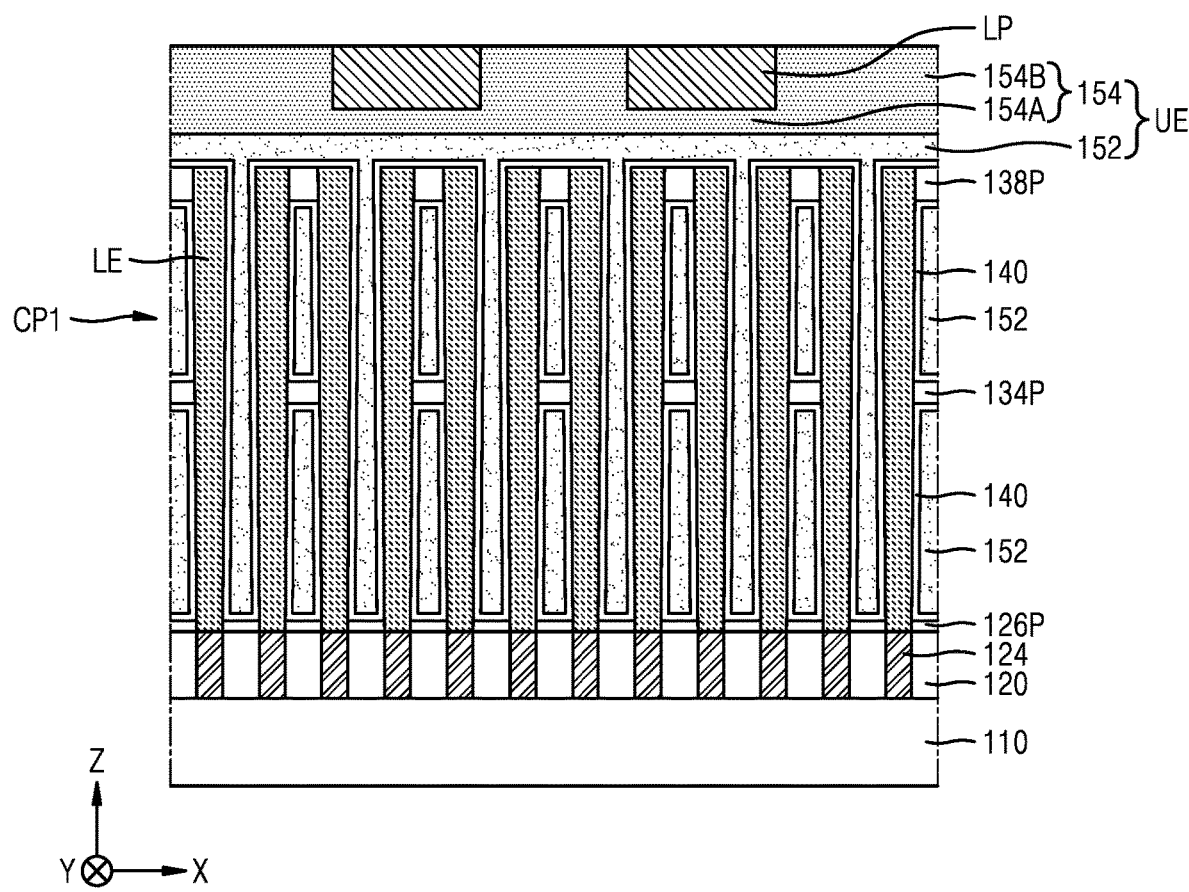

Referring to FIG. 11J, in an embodiment, the top surface of the upper non-metal conductive portion 154B is exposed by planarizing the conductive landing layer LPL in a resultant structure of FIG. 11I, and the plurality of conductive landing pads LP that fill the plurality of landing regions LR are formed from the conductive landing layer LPL.

Figure 11K:
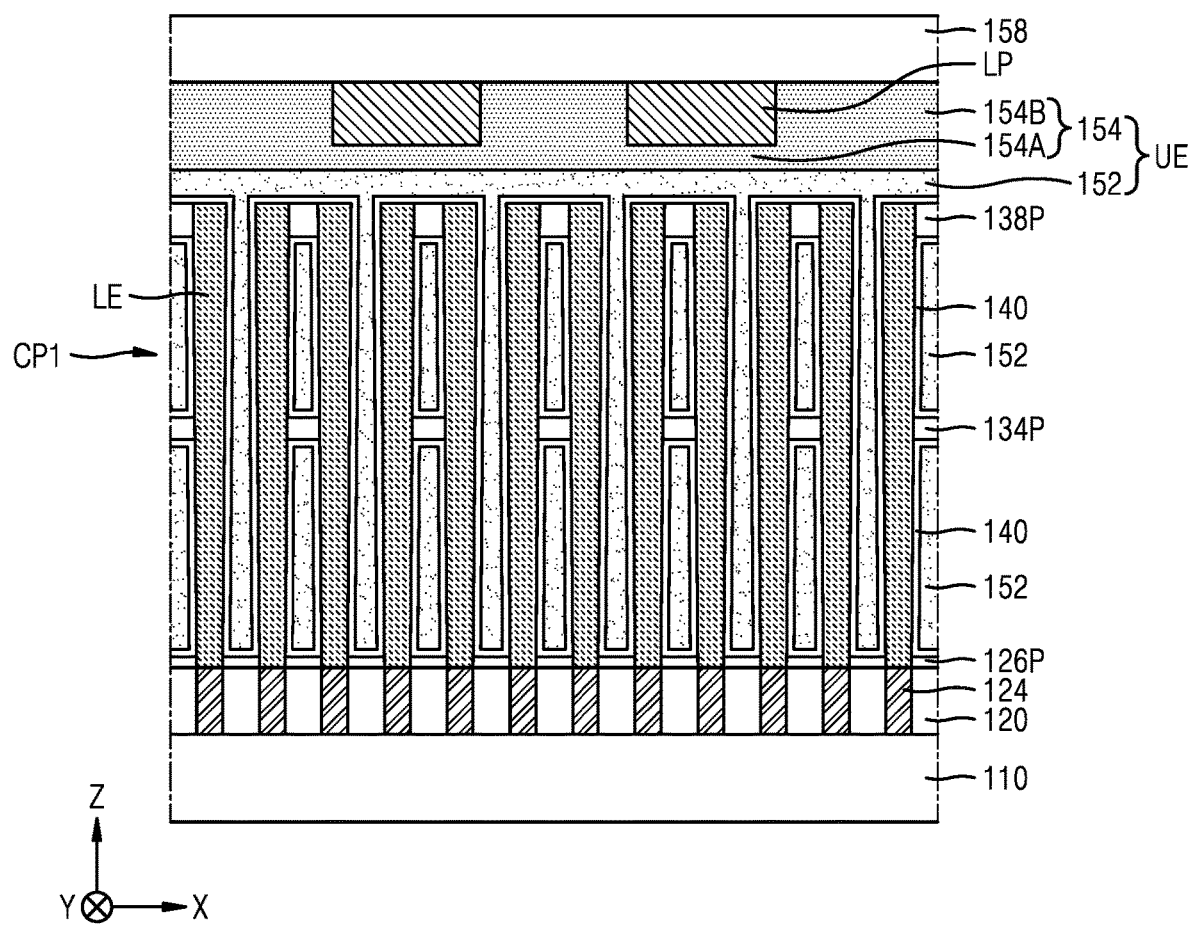

Referring to FIG. 11K, in an embodiment, the capping insulation layer 158 is formed that covers the respective top surfaces of the plurality of conductive landing pads LP and the top surface of the upper non-metal conductive portion 154B in a resultant structure of FIG. 11J.

Figure 11L:
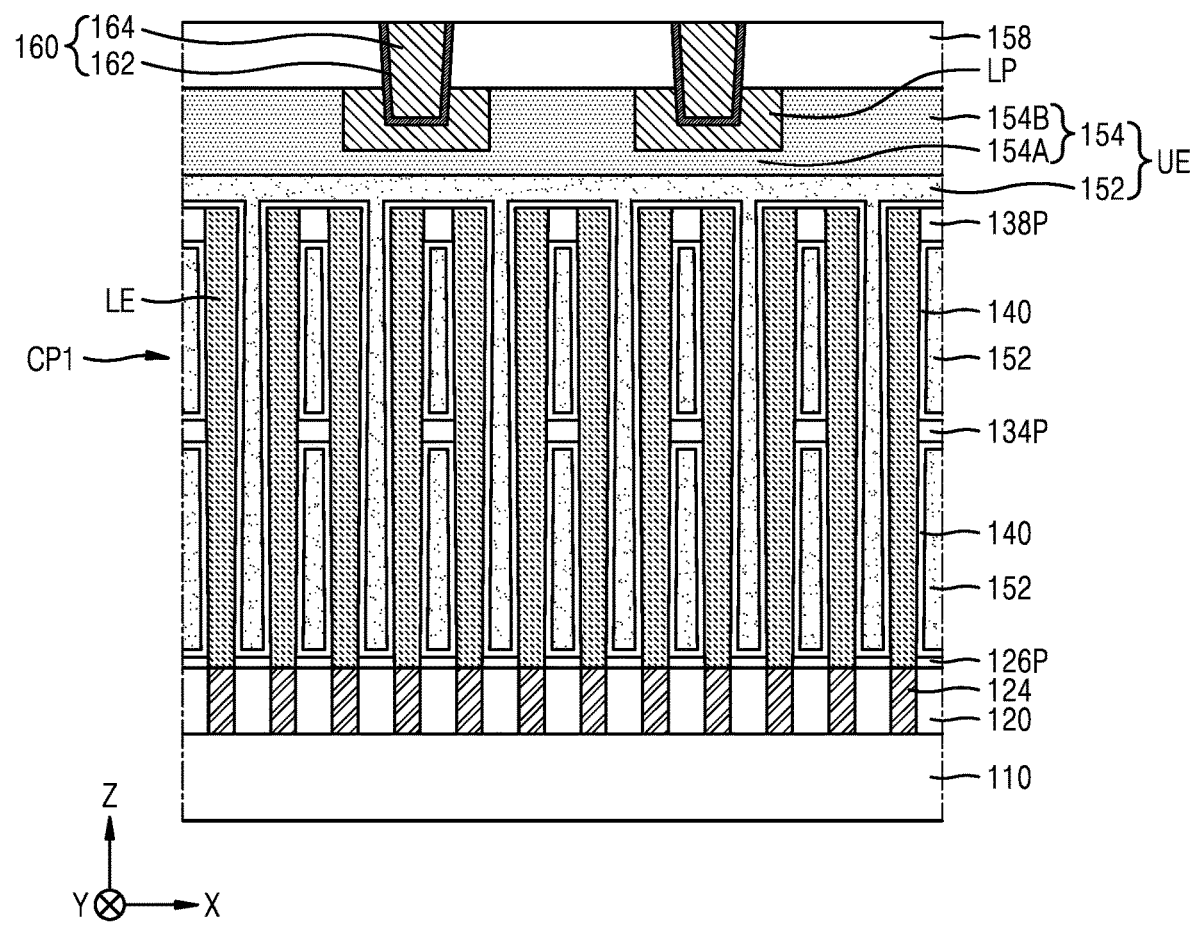

Referring to FIG. 11L, in an embodiment, a plurality of contact holes are formed that penetrate through the capping insulation layer 158 in the vertical direction (Z direction) and expose the upper non-metal conductive portion 154B in a resultant structure of FIG. 11K, and the plurality of conductive contact plugs 160 are formed that fill the plurality of contact holes. The upper wiring layer 170 and the interlayer insulating layer 178 are formed on a resultant structure of FIG. 11L to thereby manufacture the integrated circuit device 100 of FIG. 4.

The integrated circuit device 200 of FIG. 7A can be manufactured by a method described above with reference to FIGS. 11A through 11L. However, in processes described above with reference to FIGS. 11A through 11L, the plurality of conductive landing pads LP2 are formed instead of the plurality of conductive landing pads LP. To this end, after the mask pattern MP1 is removed in a process described above with reference to FIG. 11I and before the conductive landing layer LPL is formed on a resultant structure of FIG. 11H, the conductive barrier layer 256 is formed that conformally covers surfaces exposed through the plurality of landing regions LR and the top surface of the upper non-metal conductive portion 154B. Thereafter, the conductive landing layer LPL that fills the plurality of landing regions LR and covers the top surface of the upper non-metal conductive portion 154B is formed on the conductive barrier layer 256. Then, according to a method similar to that described above with reference to FIG. 11J, the conductive landing layer LPL and the conductive barrier layer 255 are planarized until the top surface of the upper non-metal conductive portion 154B is exposed, thereby forming the plurality of conductive landing pads LP2 that fill the plurality of landing regions LR.

Figure 12A:
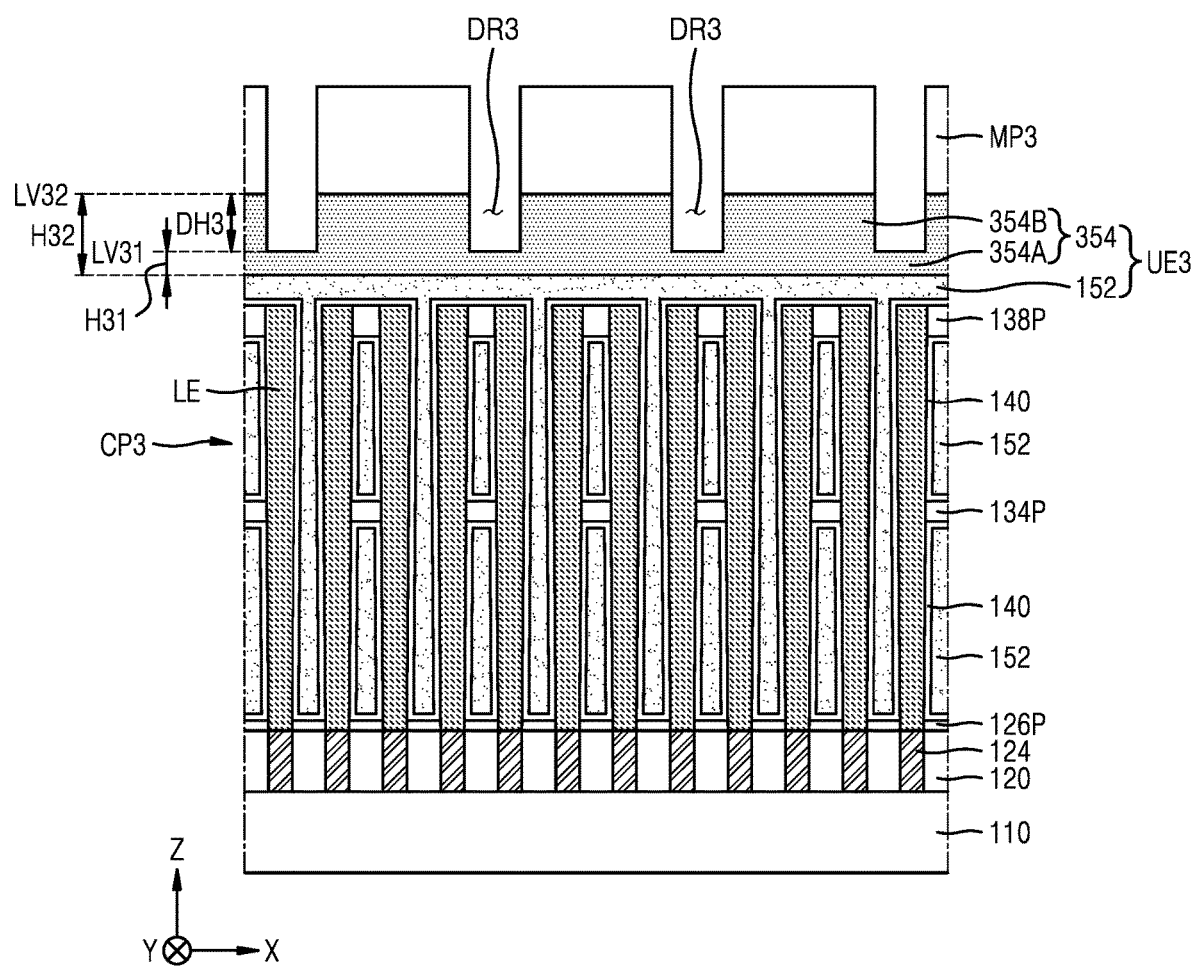
FIGS. 12A, 13A, and 14 are cross-sectional views that illustrate a method of manufacturing an integrated circuit device, according to embodiments of the inventive concept.
Figure 12B:
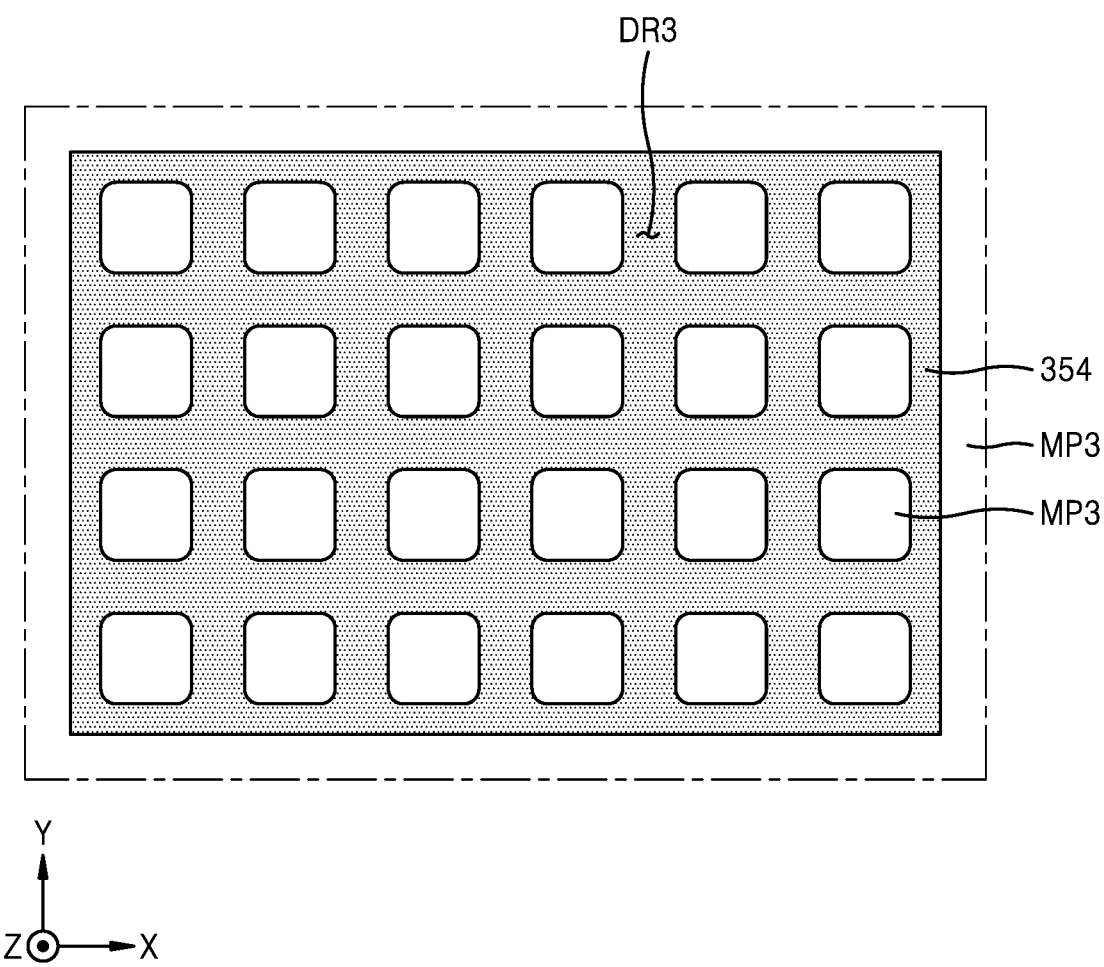
FIGS. 12B and 13B are plan views of components illustrated in FIGS. 12A and 13A, respectively.
Figure 13A:
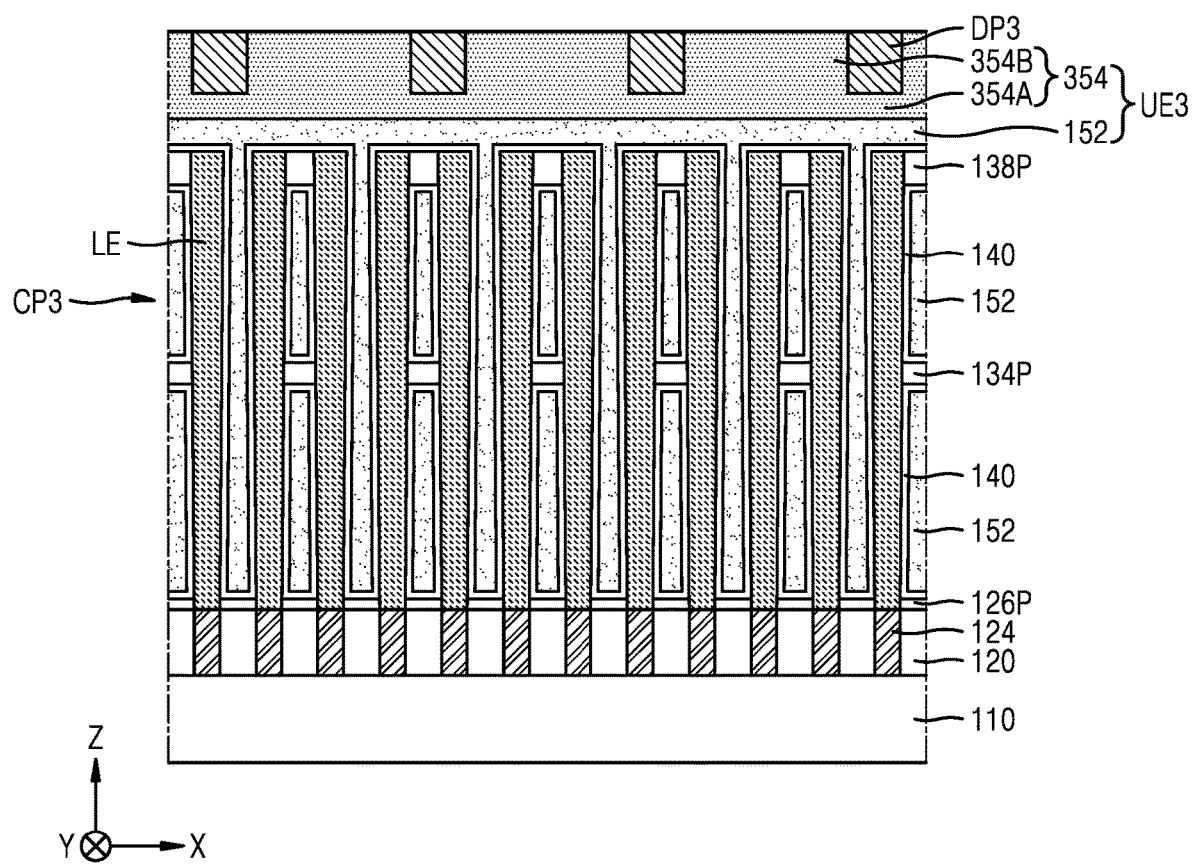
Figure 13B:
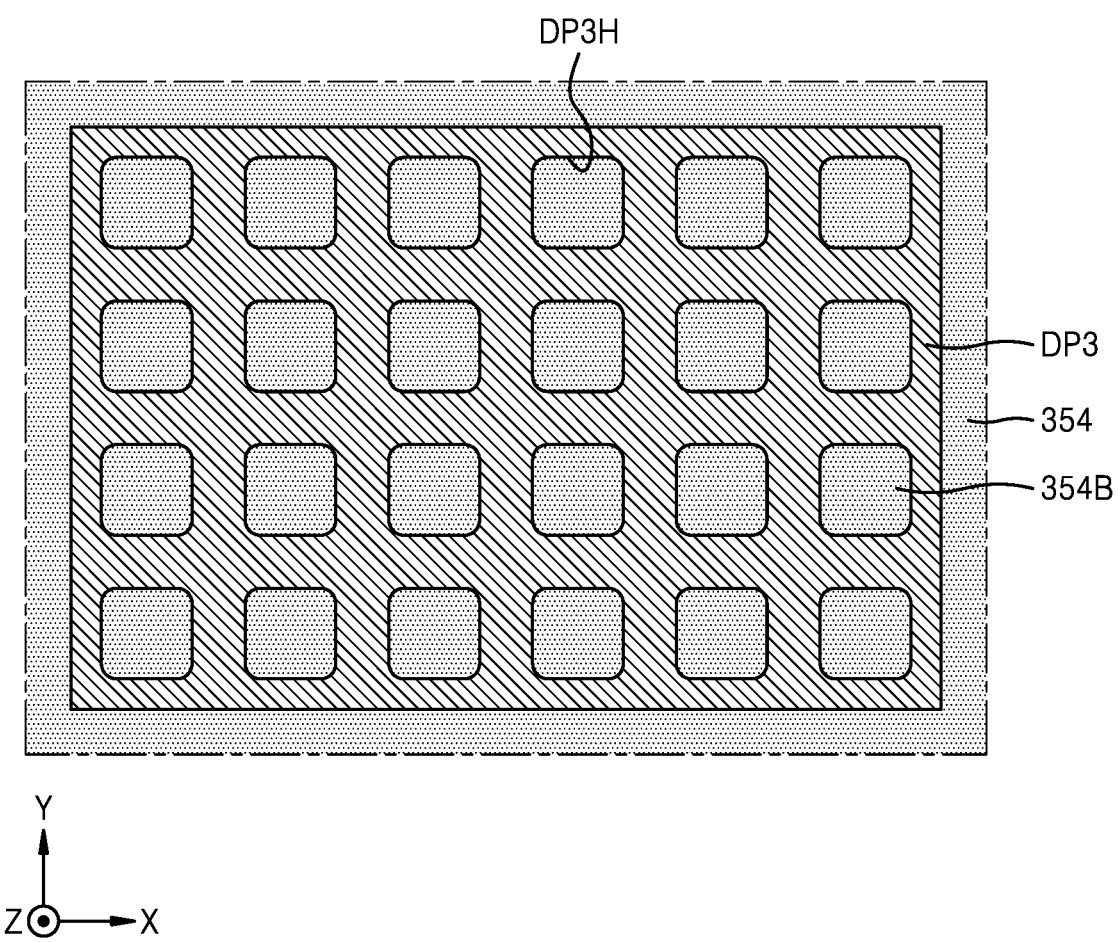
Figure 14:
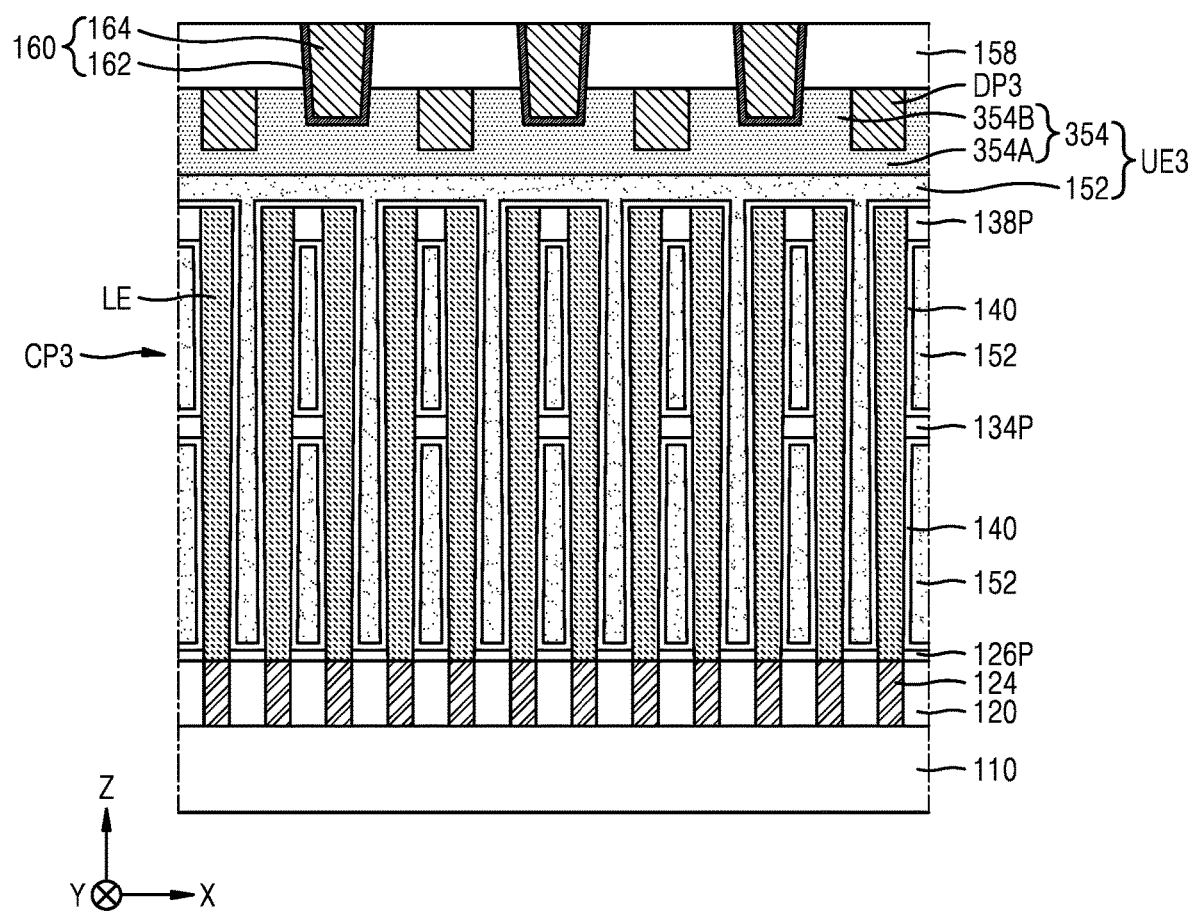

FIGS. 12A, 13A, and 14 are cross-sectional views that illustrate a method of manufacturing an integrated circuit device, according to embodiments of the inventive concept, and FIGS. 12B and 13B are plan views of components illustrated in FIGS. 12A and 13A, respectively. A method of manufacturing the integrated circuit device 300 of FIGS. 8A and 8B will now be described with reference to FIGS. 12A through 14. The same reference characters and numerals in FIGS. 4, 8A, and 8B as those in FIGS. 12A through 14 may denote the same elements, and thus their redundant descriptions may be omitted herein.

Referring to FIG. 12A, in an embodiment, after the processes described above with reference to FIGS. 11A through 11G are performed, a mask pattern MP3 is formed on the non-metal conductive layer 154L in a resultant structure of FIG. 11G. Thereafter, the non-metal conductive layer 154l, is anisotropically etched using the mask pattern MP3 as an etch mask to form the non-metal conductive pattern 354 that has a top surface that includes the plurality of recessed and protruding portions. The non-metal conductive pattern 354 includes the lower non-metal conductive portion 354A and the upper non-metal conductive portion 354B. According to embodiments, the mask pattern MP3 is, but is not necessarily limited to, a photoresist pattern.

After the non-metal conductive pattern 354 is formed, a damascene region DR3 of which a horizontal width is defined by the upper non-metal conductive portion 354B is formed on the lower non-metal conductive portion 354A. A height of the damascene region DR3 in the vertical direction (Z direction) on the lower non-metal conductive portion 354A corresponds to the difference DH3 between the second height H32 and the first height H31. The height of the damascene region DR3 in the vertical direction (Z direction) is greater than the thickness of the lower non-metal conductive portion 354A.

FIG. 12B illustrates a planar structure of components illustrated in FIG. 12A. Referring to FIG. 12B, in an embodiment, the mask pattern MP3 has a plurality of planar island shapes on a portion of the top surface of the non-metal conductive pattern 354.

Referring to FIG. 13A, in an embodiment, after the mask pattern MP3 is removed from a resultant structure of FIG. 12A, the conductive damascene pattern DP3 that fills the damascene region DR3 is formed by a method similar to that described above with reference to FIGS. 11I and 11J.

FIG. 13B illustrates a planar structure of components illustrated in FIG. 13A. Referring to FIG. 13B, in an embodiment, the conductive damascene pattern DP3 has a mesh-type planar shape that forms the plurality of openings DP3H. The non-metal conductive pattern 354 is exposed through the plurality of openings DP3H formed in the conductive damascene pattern DP3.

Referring to FIG. 14, in an embodiment, the integrated circuit device 300 of FIG. 8A is manufactured by performing the processes described above with reference to FIGS. 11K and 11L with respect to a resultant structure of FIG. 13A.

The integrated circuit device 400 of FIGS. 9A and 9B can be manufactured by a method similar to that described above with reference to FIGS. 12A through 14. However, the non-metal conductive pattern 454 instead of the non-metal conductive pattern 354 is formed in a process described above with reference to FIG. 12A, and the conductive damascene pattern DP4 instead of the conductive damascene pattern DP3 is formed in a process described above with reference to FIG. 13A.

FIGS. 15A through 15F are cross-sectional views that illustrate a method of manufacturing an integrated circuit device, according to embodiments of the inventive concept. A method of manufacturing the integrated circuit device 500 of FIG. 10 will now be described with reference to FIGS. 15A through 15F. The same reference characters and numerals in FIGS. 15A through 15F as those in FIGS. 4 and 10 may denote the same elements, and thus their redundant descriptions may be omitted herein.

Figure 15A:
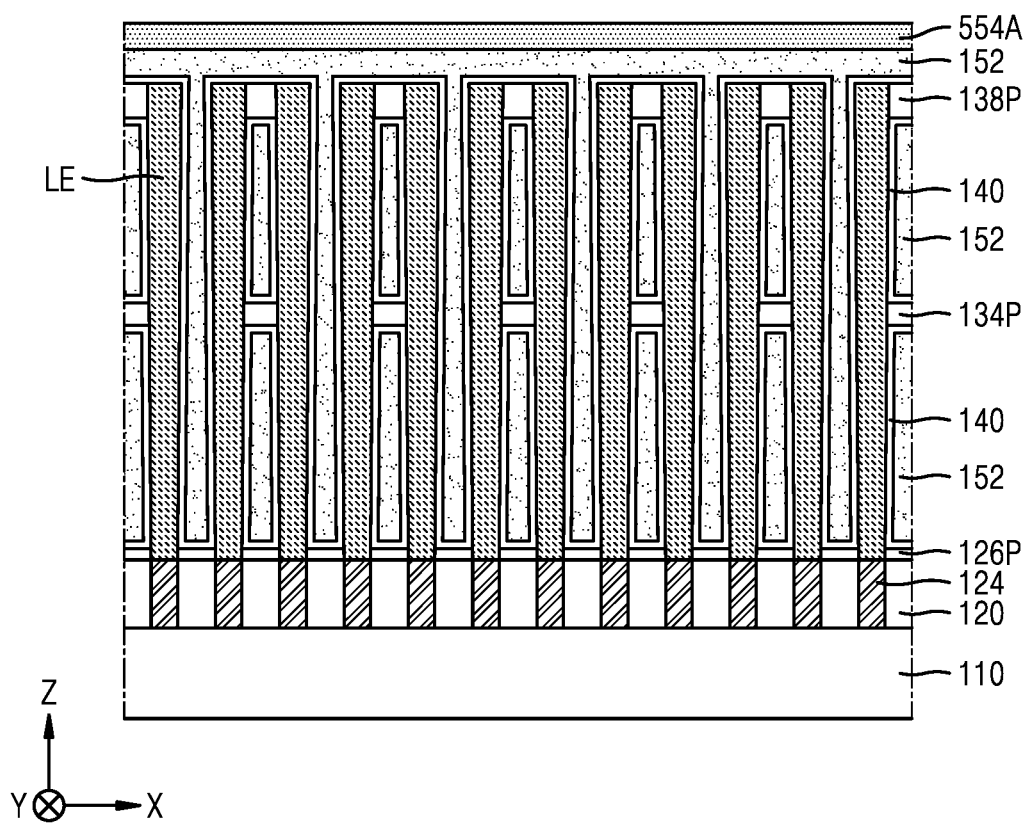
FIGS. 15A through 15F are cross-sectional views that illustrate a method of manufacturing an integrated circuit device, according to embodiments of the inventive concept.

Referring to FIG. 15A, in an embodiment, after processes described above with reference to FIGS. 11A through 11F are performed, the lower non-metal conductive portion 554A is formed on the metal-containing conductive pattern 152 in a resultant structure of FIG. 11F.

According to embodiments, to form the lower non-metal conductive portion 554A, a doped SiGe layer is formed on the metal-containing conductive pattern 152, and the top surface of the doped SiGe layer is planarized using a CMP process. While the top surface of the doped SiGe layer is being planarized using a CMP process, byproducts and/or particles remain on the doped SiGe layer after the doped SiGe layer is formed, and defects remain around the top surface of the doped SiGe layer after the doped SiGe layer is formed. Accordingly, particles and/or defects are removed from the lower non-metal conductive portion 554A, thereby increasing conductivity.

Figure 15B:
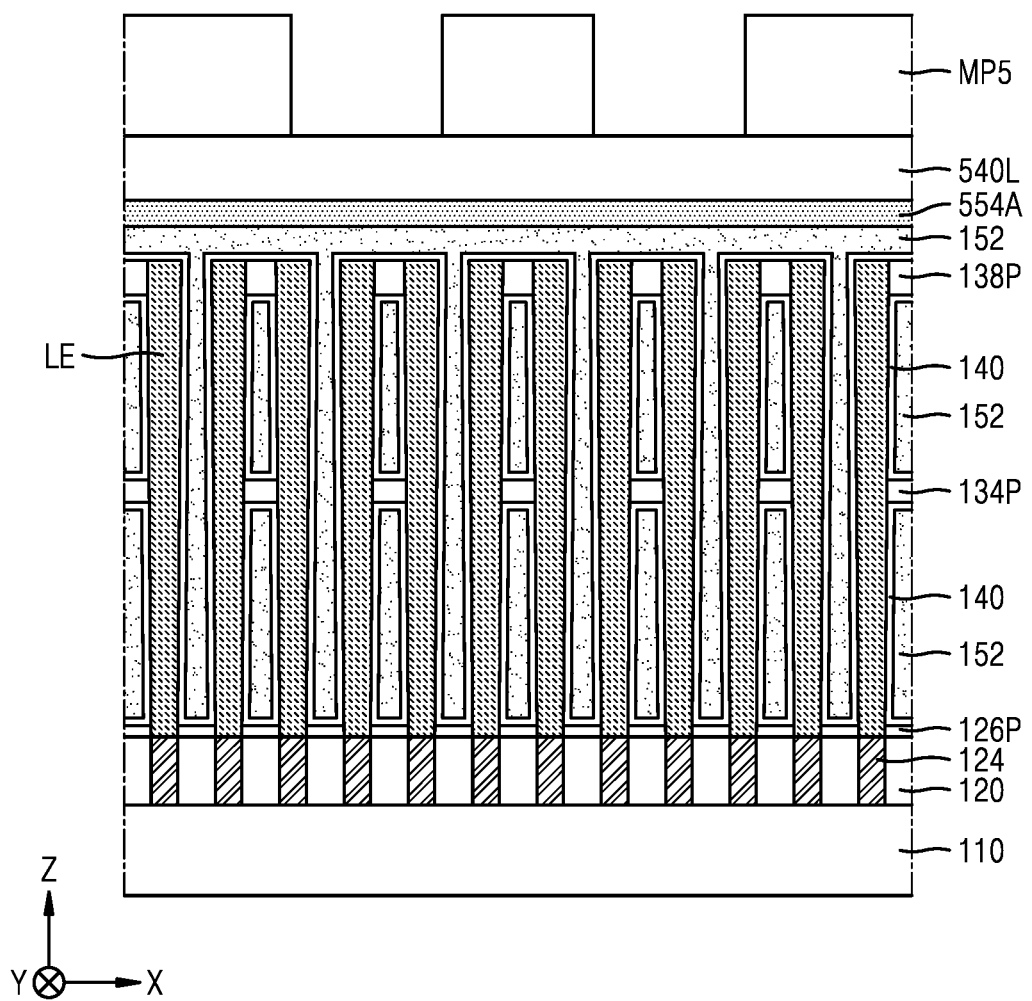

Referring to FIG. 15B, in an embodiment, an insulation layer 540L is formed on a resultant structure of FIG. 15A, and a mask pattern MP5 is formed on the insulation layer 540L. A material of the insulation layer 540L is the same as a material of the insulation pattern 540 described above with reference to FIG. 10. The mask pattern MP5 may be, but is not necessarily limited to, a photoresist pattern.

Figure 15C:
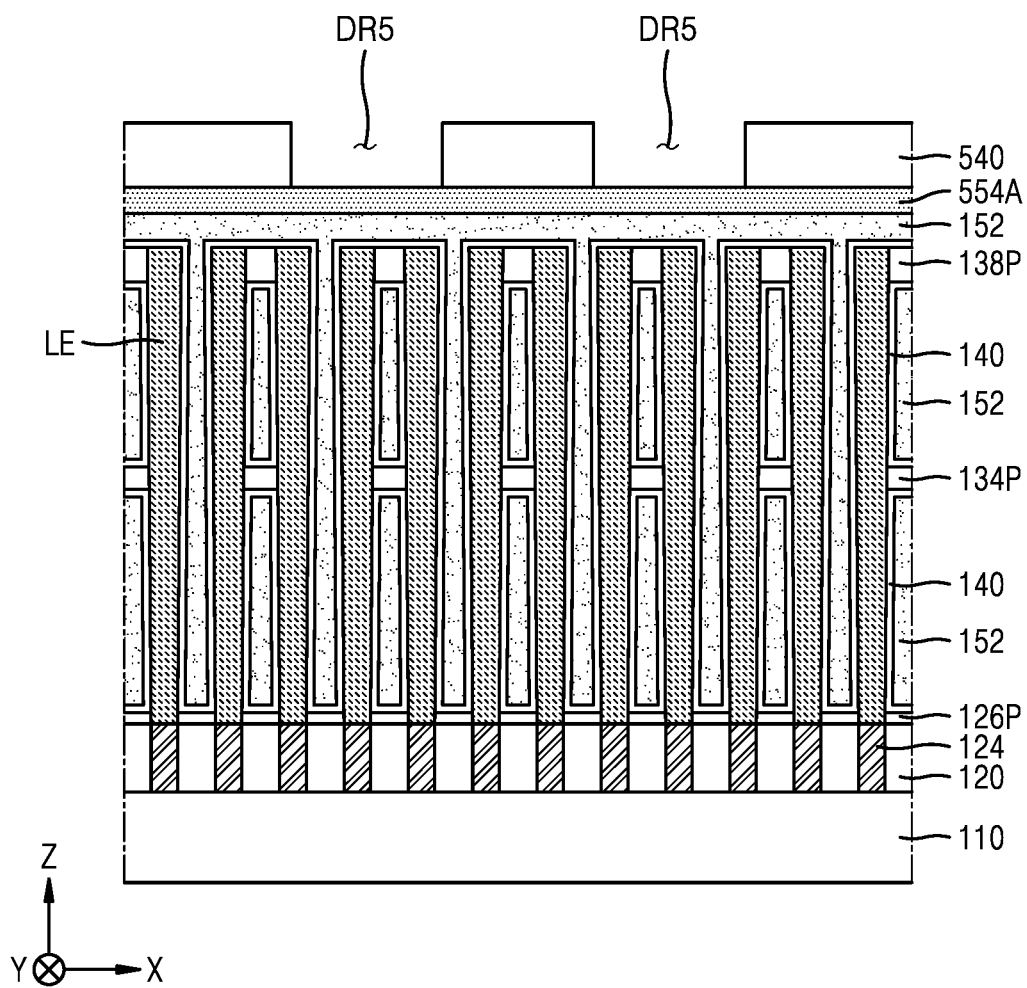

Referring to FIG. 15C, in an embodiment, the insulation layer 540L is anisotropically etched using the mask pattern MP5 in a resultant structure of FIG. 15B as an etch mask to form the insulation pattern 540. The top surface of the lower non-metal conductive portion 554A is exposed through the insulation pattern 540. After the insulation pattern 540 is formed, a damascene region IRS of which a horizontal width is defined by the insulation pattern 540 is formed on the lower non-metal conductive portion 554A. After the insulation pattern 540 is formed, the mask pattern MP5 is removed.

Figure 15D:
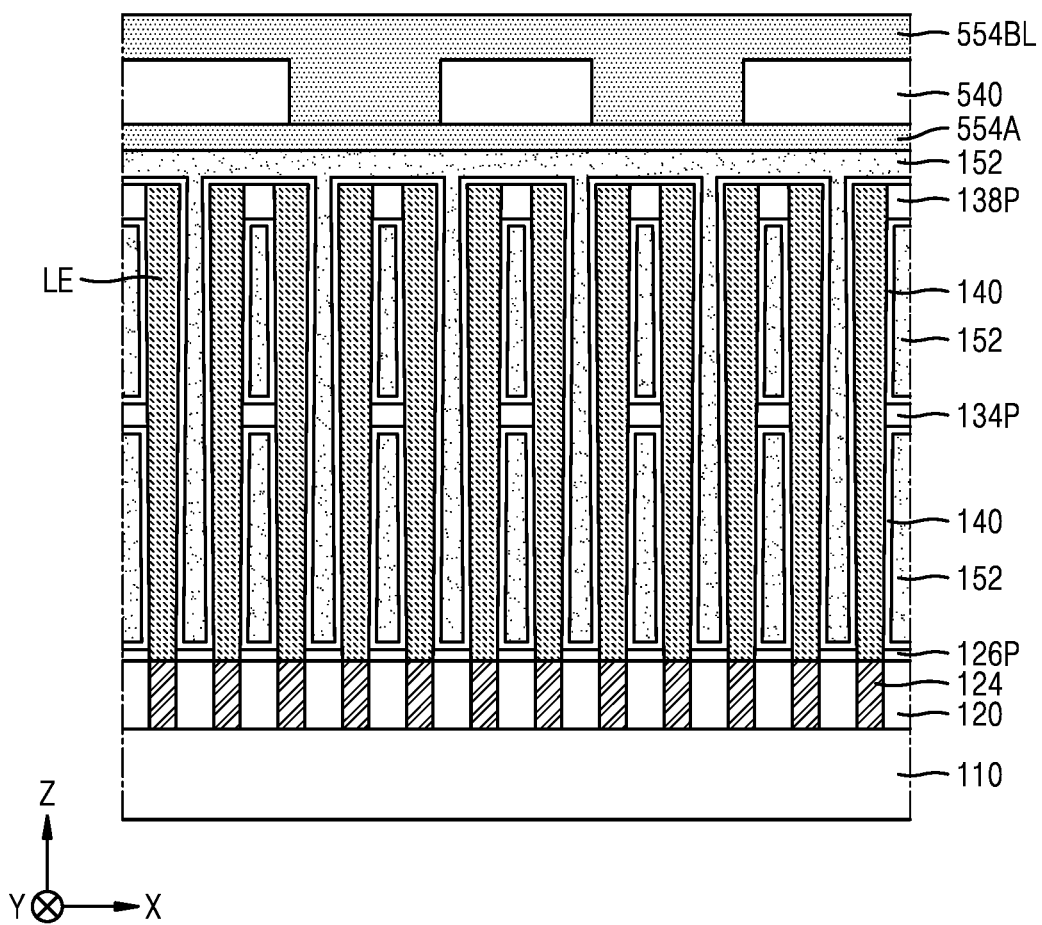

Referring to FIG. 15D, in an embodiment, an upper non-metal conductive layer 554BL is formed that fills the damascene region DR5 and covers the top surface of the insulation pattern 540 in a resultant structure of FIG. 15C. The upper non-metal conductive layer 554BL is a doped SiGe layer. For example, in an embodiment, the upper non-metal conductive layer 554BL is a boron-doped SiGe layer.

Figure 15E:
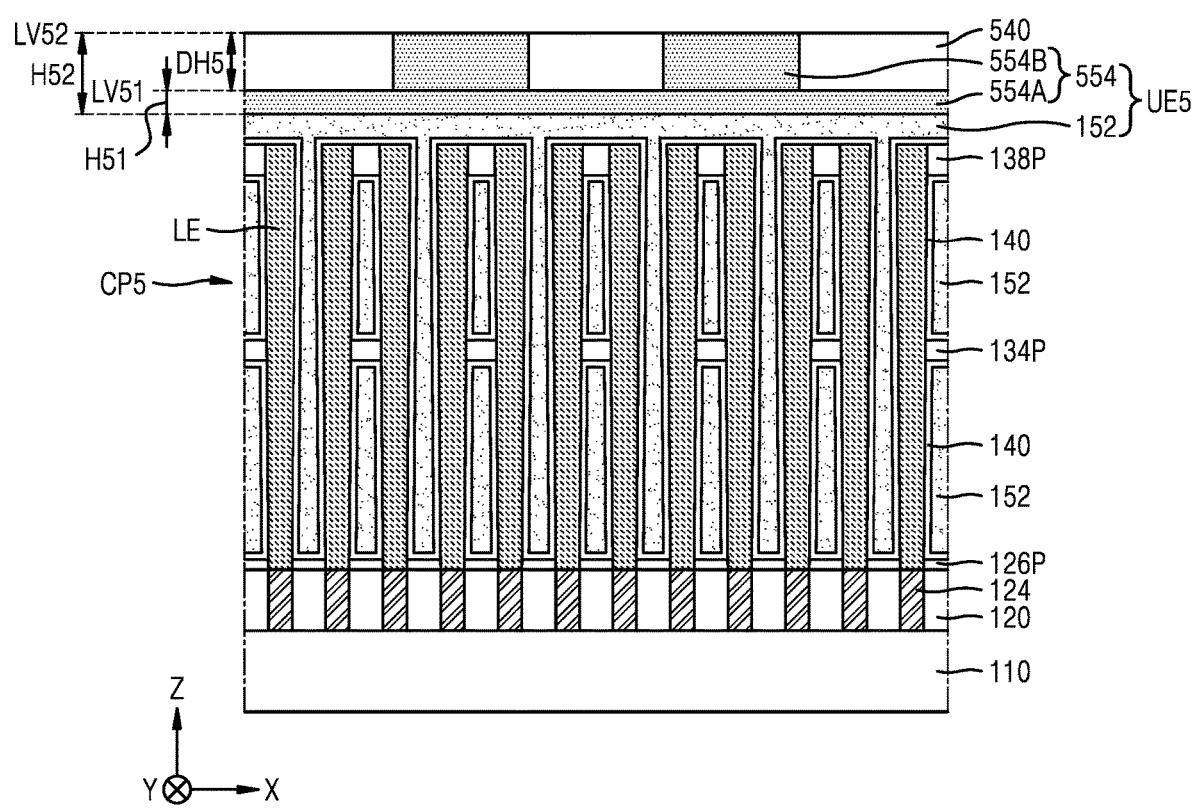

Referring to FIG. 15E, in an embodiment, the top surface of the insulation pattern 540 is exposed by planarizing the upper non-metal conductive layer 554BL in a resultant structure of FIG. 15D, and the upper non-metal conductive portion 554B that fills the damascene region DR5 is formed from the upper non-metal conductive layer 554BL. A thickness of the upper non-metal conductive portion 554B in the vertical direction (Z direction) corresponds to the difference DH5 between the second height H52 and the first height H51, in the vertical direction (Z direction), a thickness of the upper non-metal conductive portion 554B is greater than that of the lower non-metal conductive portion 554A.

Figure 15F:
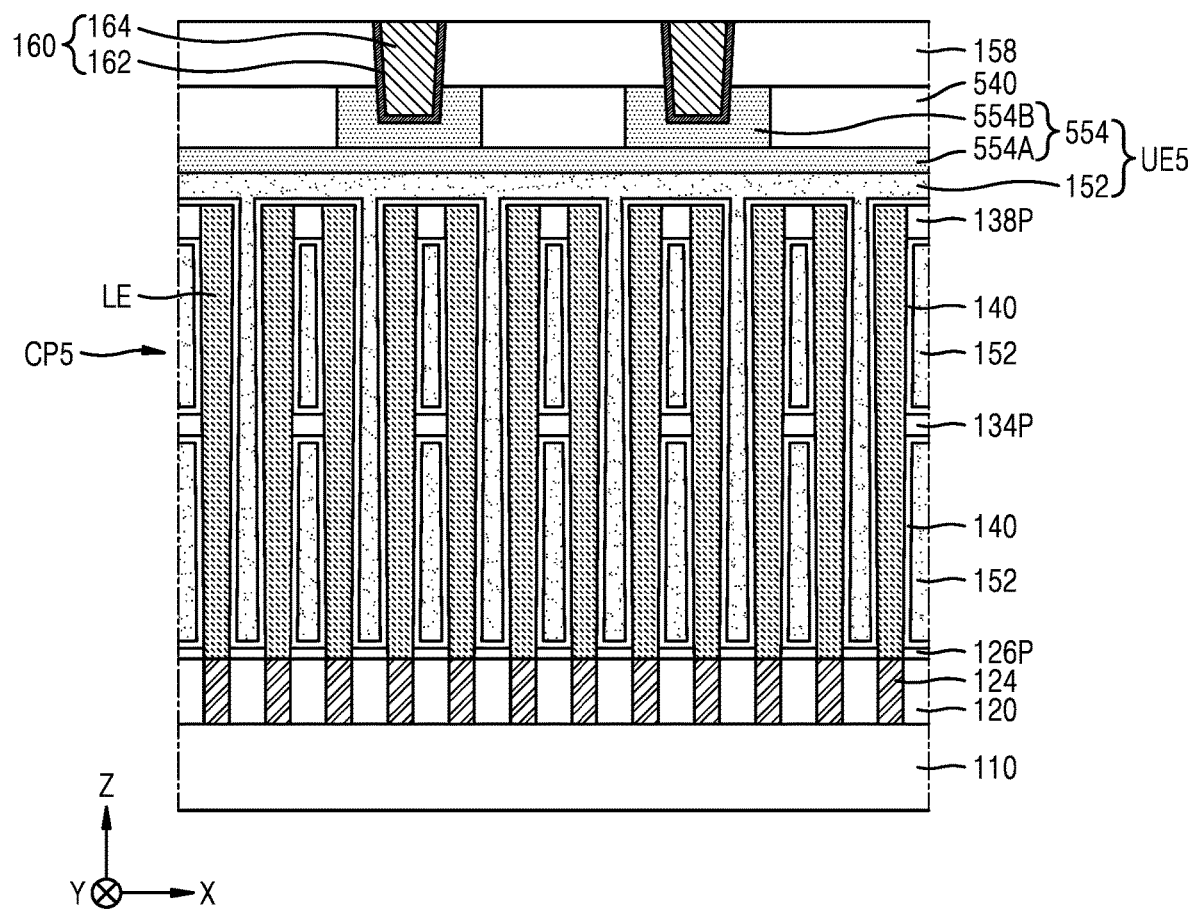

Referring to FIG. 15F, in an embodiment, the integrated circuit device 500 of FIG. 10 is manufactured by performing processes described above with reference to FIGS. 11K and 11L with respect to a resultant structure of FIG. 15E.

While embodiments of the inventive concept have been particularly shown and described with reference to the drawings, it will be understood that various changes in form and details may be made therein without departing from the spirit and scope of the following claims.

What is claimed is:

1. An integrated circuit device, comprising:
    a plurality of lower electrodes disposed on a substrate;
    a dielectric layer that covers respective surfaces of the plurality of lower electrodes; and
    an upper electrode disposed on the dielectric layer and that covers the plurality of lower electrodes,
    wherein the upper electrode comprises:
        a metal-containing conductive pattern disposed on the dielectric layer, wherein the metal-containing conductive pattern fills spaces between the plurality of lower electrodes and covers respective top surfaces of the plurality of lower electrodes; and
        a non-metal conductive pattern that includes a bottom surface in contact with a top surface of the metal-containing conductive pattern, and a top surface that includes a plurality of recessed portions and a plurality of protruding portions,
    wherein the non-metal conductive pattern comprises:
        a lower non-metal conductive portion that includes a first top surface at a first height from the bottom surface of the non-metal conductive pattern and that faces the plurality of lower electrodes with the metal-containing conductive pattern therebetween, and
        an upper non-metal conductive portion that includes a second top surface at a second height that is farther from the bottom surface of the non-metal conductive pattern than the first height and that protrudes from the first top surface of the lower non-metal conductive portion in a direction away from the substrate, and
        a difference between the second height and the first height is greater than the first height; and
    a conductive landing pad that includes a bottom surface in contact with the first top surface of the lower non-metal conductive portion and a topmost surface that is coplanar with the second top surface of the upper non-metal conductive portion; and
    at least one conductive contact plug that includes a bottom surface in contact with the conductive landing pad.

2. The integrated circuit device of claim 1, wherein a vertical level of a lowest surface of the at least one conductive contact plug is higher than a vertical level of the first top surface of the lower non-metal conductive portion, and is lower than a vertical level of the second top surface the upper non-metal conductive portion.

3. The integrated circuit device of claim 1, wherein the conductive landing pad has a length in a first horizontal direction and a width in a second horizontal direction perpendicular to the first horizontal direction, and the length of the conductive landing pad is greater than the width of the conductive landing pad.

4. An integrated circuit device, comprising:
    a plurality of lower electrodes disposed on a substrate;
    a dielectric layer that covers respective surfaces of the plurality of lower electrodes; and
    an upper electrode disposed on the dielectric layer and that covers the plurality of lower electrodes,
    wherein the upper electrode comprises:
        a metal-containing conductive pattern disposed on the dielectric layer, wherein the metal-containing conductive pattern fills spaces between the plurality of lower electrodes and covers respective top surfaces of the plurality of lower electrodes; and
        a non-metal conductive pattern that includes a bottom surface in contact with a top surface of the metal-containing conductive pattern, and a top surface that includes a plurality of recessed portions and a plurality of protruding portions,
    wherein the non-metal conductive pattern comprises:
        a lower non-metal conductive portion that includes a first top surface at a first height from the bottom surface of the non-metal conductive pattern and that faces the plurality of lower electrodes with the metal-containing conductive pattern therebetween, and
        an upper non-metal conductive portion that includes a second top surface at a second height that is farther from the bottom surface of the non-metal conductive pattern than the first height and that protrudes from the first top surface of the lower non-metal conductive portion in a direction away from the substrate, and
        a difference between the second height and the first height is greater than the first height; and
    a conductive damascene pattern that includes a bottom surface in contact with the first top surface of the lower non-metal conductive portion, and a topmost surface that is coplanar with the second top surface of the upper non-metal conductive portion; and at least one conductive contact plug spaced apart from the conductive damascene pattern and that includes a bottom surface in contact with the upper non-metal conductive portion.

5. The integrated circuit device of claim 4, wherein a vertical level of a lowest surface of the at least one conductive contact plug is higher than a vertical level of the first top surface of the lower non-metal conductive portion, and is lower than a vertical level of the second top surface of the upper non-metal conductive portion.

6. The integrated circuit device of claim 4, wherein the conductive damascene pattern has a mesh-type planar shape that forms a plurality of openings.

7. The integrated circuit device of claim 6, wherein
a first opening of the plurality of openings has a length in a first horizontal direction and a width in a second horizontal direction perpendicular to the first horizontal direction, and the length of the first opening is greater than the width of the first opening, and
the at least one conductive contact plug comprises a plurality of conductive contact plugs that include bottom surfaces in contact with the upper non-metal conductive portion through the first opening.

8. An integrated circuit device, comprising:
a plurality of lower electrodes disposed on a substrate;
a dielectric layer that covers respective surfaces of the plurality of lower electrodes;
an upper electrode disposed on the dielectric layer and that covers the plurality of lower electrodes,
wherein the upper electrode comprises:
a metal-containing conductive pattern disposed on the dielectric layer, wherein the metal-containing conductive pattern fills spaces between the plurality of lower electrodes and covers respective top surfaces of the plurality of lower electrodes; and
a non-metal conductive pattern that includes a bottom surface in contact with a top surface of the metal-containing conductive pattern, and a top surface that includes a plurality of recessed portions and a plurality of protruding portions,
wherein the non-metal conductive pattern comprises:
a lower non-metal conductive portion that includes a first top surface at a first height from the bottom surface of the non-metal conductive pattern and that faces the plurality of lower electrodes with the metal-containing conductive pattern therebetween, and
an upper non-metal conductive portion that includes a second top surface at a second height that is farther from the bottom surface of the non-metal conductive pattern than the first height and that protrudes from the first top surface of the lower non-metal conductive portion in a direction away from the substrate, and
a difference between the second height and the first height is greater than the first height; and
an insulation pattern that includes a bottom surface in contact with the first top surface of the lower non-metal conductive portion, and a topmost surface that is coplanar with the second top surface of the upper non-metal conductive portion; and
at least one conductive contact plug spaced apart from the insulation pattern and that includes a bottom surface in contact with the upper non-metal conductive portion.

9. The integrated circuit device of claim 8, wherein a vertical level of a lowest surface of the at least one conductive contact plug is higher than a vertical level of the first top surface, and is lower than a vertical level of the second top surface of the upper non-metal conductive portion.

* * * * *